(12) United States Patent
Kim et al.

(10) Patent No.: US 12,159,911 B2
(45) Date of Patent: Dec. 3, 2024

(54) SEMICONDUCTOR INCLUDING ACTIVE CONTACT BURIED PORTIONS

(71) Applicant: Samsung Electronics Co., Ltd., Suwon-si (KR)

(72) Inventors: Gyeom Kim, Hwaseong-si (KR); Jinbum Kim, Seoul (KR); Dongwoo Kim, Incheon (KR); Dongsuk Shin, Suwon-si (KR); Sangmoon Lee, Suwon-si (KR); Seung Hun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 435 days.

(21) Appl. No.: 17/552,446

(22) Filed: Dec. 16, 2021

(65) Prior Publication Data

US 2022/0359678 A1   Nov. 10, 2022

(30) Foreign Application Priority Data

May 4, 2021   (KR) .......................... 10-2021-0058085

(51) Int. Cl.
```
H01L 29/41      (2006.01)
H01L 21/02      (2006.01)
H01L 27/092     (2006.01)
H01L 29/06      (2006.01)
H01L 29/40      (2006.01)
```
(Continued)

(52) U.S. Cl.
CPC .... *H01L 29/41733* (2013.01); *H01L 21/0259* (2013.01); *H01L 27/092* (2013.01); *H01L 29/0665* (2013.01); *H01L 29/401* (2013.01); *H01L 29/42392* (2013.01); *H01L 29/66545* (2013.01); *H01L 29/66742* (2013.01); *H01L 29/7848* (2013.01); *H01L 29/78618* (2013.01); *H01L 29/78696* (2013.01)

(58) Field of Classification Search
CPC .......... H01L 29/41733; H01L 29/0665; H01L 29/42392; H01L 29/66545; H01L 29/66742; H01L 29/7848; H01L 29/78618; H01L 29/78696; H01L 29/1079; H01L 29/0673; H01L 29/0847; H01L 29/41725; H01L 29/41766; H01L 29/41791; H01L 29/66439; H01L 29/161; H01L 29/165; H01L 29/775; H01L 27/092; H01L 27/0924; H01L 27/088; B82Y 10/00

See application file for complete search history.

(56) References Cited

U.S. PATENT DOCUMENTS 9,786,783 B2   10/2017   Hafez et al.
10,128,155 B2  11/2018   Jeong et al.
(Continued)

*Primary Examiner* — Ida M Soward
(74) *Attorney, Agent, or Firm* — Muir Patent Law, PLLC

(57) ABSTRACT

A semiconductor device includes a substrate including an active pattern, a channel pattern and a source/drain pattern on the active pattern, a gate electrode provided on the channel pattern and extended in a first direction, and an active contact coupled to the source/drain pattern. The active contact includes a buried portion buried in the source/drain pattern and a contact portion on the buried portion. The buried portion includes an expansion portion provided in a lower portion of the source/drain pattern and a vertical extension portion connecting the contact portion to the expansion portion.

20 Claims, 75 Drawing Sheets

(51) Int. Cl.
    *H01L 29/417*     (2006.01)
    *H01L 29/423*     (2006.01)
    *H01L 29/66*     (2006.01)
    *H01L 29/78*     (2006.01)
    *H01L 29/786*     (2006.01)

(56) References Cited

U.S. PATENT DOCUMENTS

| | | |
|---|---|---|
| 10,276,675 B2 | 4/2019 | Choi et al. |
| 10,483,158 B2 * | 11/2019 | Su ............... H01L 21/76807 |
| 10,700,203 B2 | 6/2020 | Kim et al. |
| 10,714,387 B2 | 7/2020 | Joe et al. |
| 10,714,579 B2 * | 7/2020 | Lee ............... H01L 23/485 |
| 10,868,181 B2 * | 12/2020 | Li ............... H01L 21/823418 |
| 2016/0351570 A1 | 12/2016 | Park et al. |
| 2017/0250261 A1 * | 8/2017 | Kim ............... H01L 29/78696 |
| 2020/0168735 A1 | 5/2020 | Yu et al. |
| 2021/0013204 A1 * | 1/2021 | Choi ............... H01L 21/76841 |
| 2021/0043730 A1 * | 2/2021 | Lee ............... H01L 29/0649 |
| 2021/0082917 A1 * | 3/2021 | Park ............... H01L 21/823871 |
| 2021/0104612 A1 * | 4/2021 | Bae ............... H01L 21/823821 |
| 2021/0118880 A1 * | 4/2021 | Kim ............... H01L 29/66545 |
| 2021/0126102 A1 * | 4/2021 | Nakjin ............... H01L 29/42376 |
| 2022/0037502 A1 * | 2/2022 | Son ............... H01L 29/66553 |

\* cited by examiner

SEMICONDUCTOR INCLUDING ACTIVE CONTACT BURIED PORTIONS

CROSS-REFERENCE TO RELATED APPLICATIONS

This U.S. non-provisional patent application claims priority under 35 U.S.C. § 119 to Korean Patent Application No. 10-2021-0058085, filed on May 4, 2021, in the Korean Intellectual Property Office, the entire contents of which are hereby incorporated by reference.

BACKGROUND OF THE INVENTION

The present disclosure relates to a semiconductor device and a method of fabricating the same, and in particular, to a semiconductor device including a field effect transistor and a method of fabricating the same.

A semiconductor device includes an integrated circuit consisting of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. Thus, a variety of studies are being conducted to overcome technical limitations associated with the scale-down of the semiconductor device and to realize high performance semiconductor devices.

SUMMARY

An embodiment of the inventive concept provides a semiconductor device with improved electric characteristics.

An embodiment of the inventive concept provides a method of fabricating a semiconductor device with improved electric characteristics.

According to an embodiment of the inventive concept, a semiconductor device may include a substrate including an active pattern, a channel pattern and a source/drain pattern on the active pattern, a gate electrode provided on the channel pattern and extended lengthwise in a first direction, and an active contact coupled to the source/drain pattern. The channel pattern and the source/drain pattern may be adjacent to each other in a second direction crossing the first direction. The active contact may include a buried portion buried in the source/drain pattern and a contact portion on the buried portion. The buried portion may include an expansion portion, which is provided in a lower portion of the source/drain pattern, and a vertical extension portion, which connects the contact portion to the expansion portion. An upper portion of the expansion portion may have a first width in the second direction and a second width in the first direction, and a lower portion of the expansion portion may have a third width in the second direction and a fourth width in the first direction. A difference between the first width and the third width may be larger than a difference between the second width and the fourth width.

According to an embodiment of the inventive concept, a semiconductor device may include a substrate including an active pattern, a channel pattern and a source/drain pattern on the active pattern, a gate electrode provided on the channel pattern and extended lengthwise in a first direction, an active contact coupled to the source/drain pattern, and a metal layer on the active contact. An interconnection line in the metal layer may be electrically connected to the active contact. The active contact may include a buried portion, which is buried in the source/drain pattern, and a contact portion, which is provided on the buried portion and is extended toward the interconnection line. The source/drain pattern may include silicon (Si), an impurity allowing the source/drain pattern to have an n-type, and germanium (Ge). A concentration of the germanium (Ge) of the source/drain pattern may increase in a direction from the channel pattern toward the buried portion.

According to an embodiment of the inventive concept, a semiconductor device may include a substrate including a PMOSFET region and an NMOSFET region, which are spaced apart from each other in a first direction, a first active pattern on the PMOSFET region and a second active pattern on the NMOSFET region, a first channel pattern and a first source/drain pattern on the first active pattern, a second channel pattern and a second source/drain pattern on the second active pattern, a gate electrode provided to cross the first and second channel patterns and extended in the first direction, a gate insulating layer interposed between the gate electrode and the first and second channel patterns, a gate spacer on a side surface of the gate electrode, a gate capping pattern on a top surface of the gate electrode, a gate cutting pattern provided to penetrate the gate electrode, an interlayer insulating layer on the gate capping pattern and the gate cutting pattern, first and second active contacts provided to penetrate the interlayer insulating layer and electrically connected to the first and second source/drain patterns, respectively, metal-semiconductor compound layers respectively interposed between the first and second active contacts and the first and second source/drain patterns, a gate contact provided to penetrate the interlayer insulating layer and the gate capping pattern and electrically connected to the gate electrode, a first metal layer on the interlayer insulating layer, the first metal layer including a power line, which is vertically overlapped with the gate cutting pattern, and first interconnection lines, which are electrically and respectively connected to the first and second active contacts and the gate contact, and a second metal layer on the first metal layer. The second metal layer may include second interconnection lines electrically connected to the first metal layer. The first active contact may include a first buried portion buried in the first source/drain pattern, and the second active contact may include a second buried portion buried in the second source/drain pattern. The first buried portion may include a first expansion portion, which is provided in a lower portion of the first source/drain pattern, and at which a width of the first buried portion in the second direction increases abruptly. The second buried portion may include a second expansion portion, which is provided in a lower portion in the second source/drain pattern, and at which a width of the second buried portion in the second direction increases abruptly. The largest width of the first expansion portion in the second direction may be larger than the largest width of the second expansion portion in the second direction.

According to an embodiment of the inventive concept, a method of fabricating a semiconductor device may include forming an active pattern on a substrate, forming a sacrificial pattern on the active pattern to extend in a first direction, forming a source/drain pattern including a sacrificial layer on one side of the sacrificial pattern, forming an interlayer insulating layer to cover the sacrificial pattern and the source/drain pattern, replacing the sacrificial pattern with a gate electrode, forming a contact hole to penetrate the interlayer insulating layer and to expose the source/drain pattern, performing an etching process on the source/drain pattern exposed through the contact hole to form a vertical extension hole exposing the sacrificial layer, selectively removing the sacrificial layer to form an expansion hole, and filling the expansion hole, the vertical extension hole, and the contact hole with a conductive material to form an active contact.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
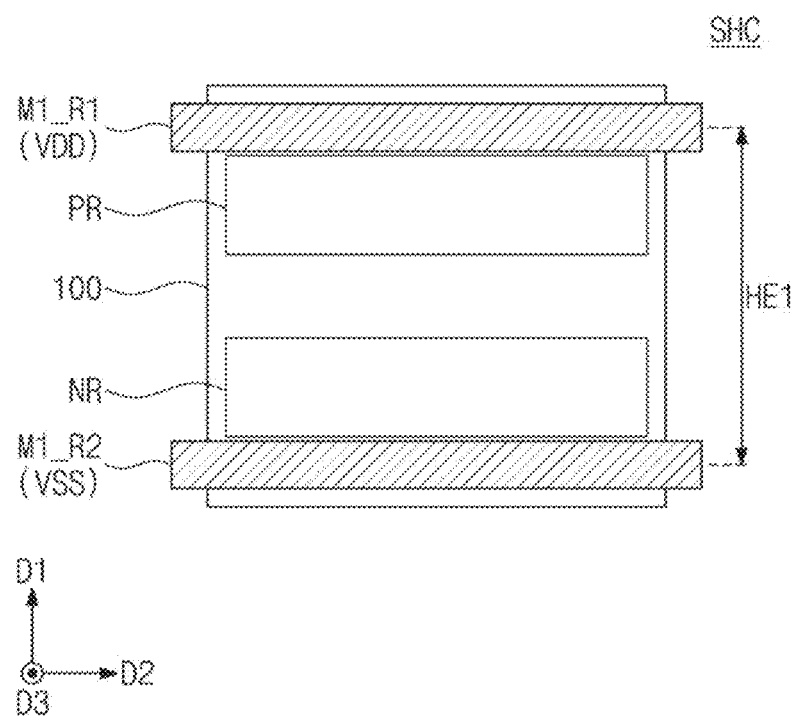
FIGS. 1 to 3 are conceptual diagrams illustrating logic cells in a semiconductor device, according to example embodiments of the inventive concept.
Figure 2:
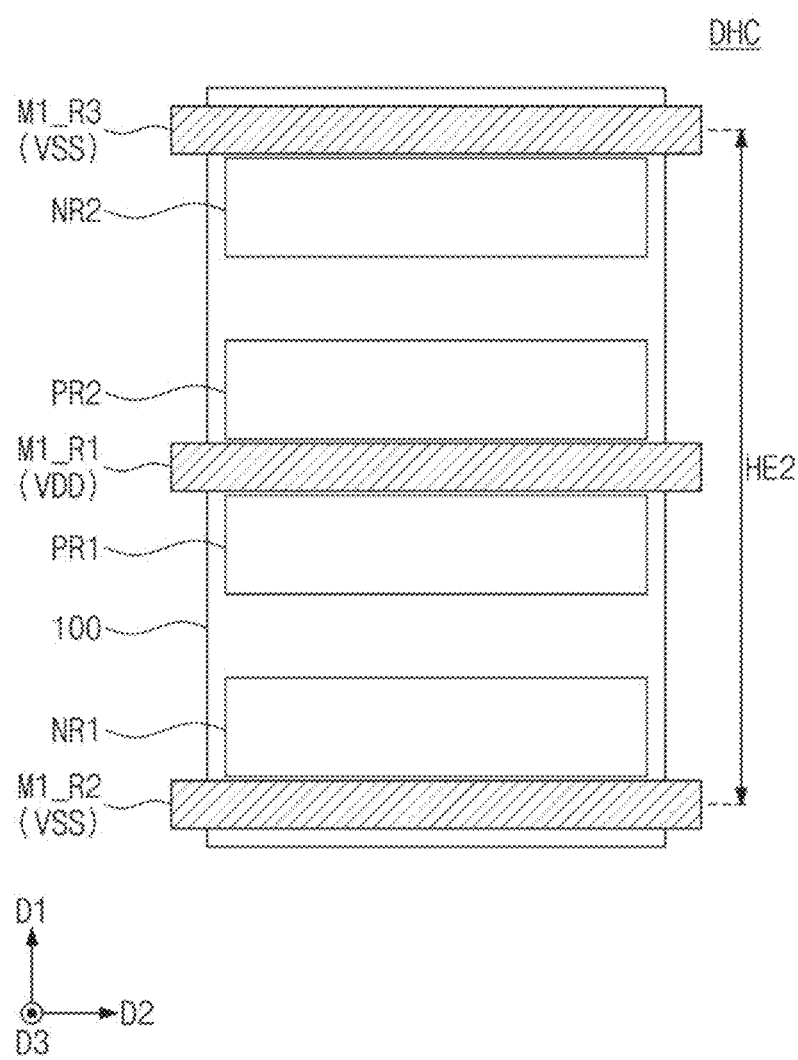
Figure 3:
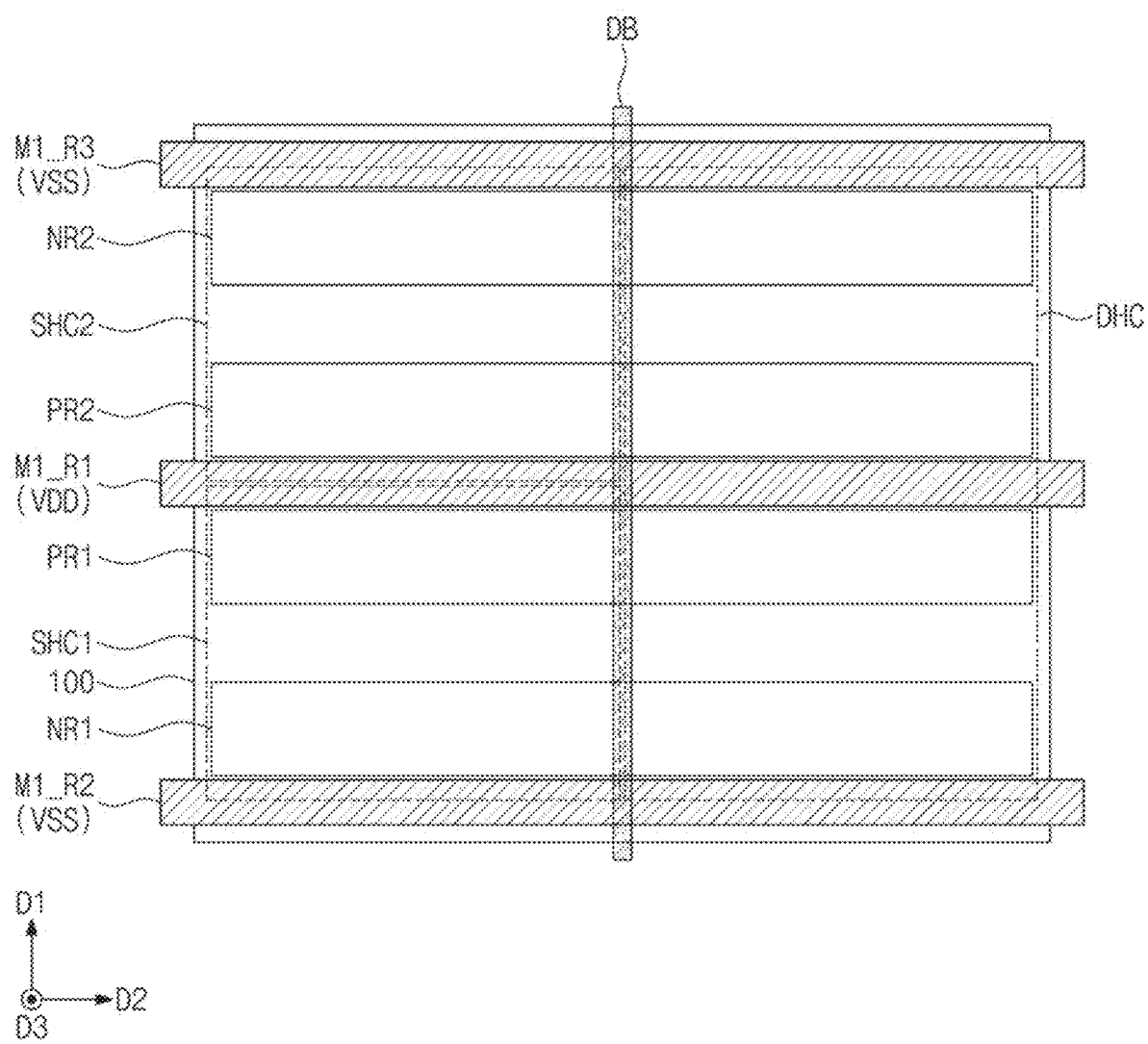

FIGS. 1 to 3 are conceptual diagrams illustrating logic cells in a semiconductor device, according to example embodiments of the inventive concept.

Referring to FIG. 1, a single height cell SHC may be provided. In detail, a first power line M1_R1 and a second power line M1_R2 may be provided on a substrate 100. The first power line M1_R1 may be a conduction path, to which a drain voltage VDD (e.g., a power voltage) is provided. The second power line M1_R2 may be a conduction path, to which a source voltage VSS (e.g., a ground voltage) is provided.

The single height cell SHC may be defined between the first power line M1_R1 and the second power line M1_R2. The single height cell SHC may include one PMOSFET region PR and one NMOSFET region NR. For example, the single height cell SHC may have a CMOS structure provided between the first and second power lines M1_R1 and M1_R2.

Each of the PMOSFET region PR and the NMOSFET region NR may have a first width in a first direction D1. A length of the single height cell SHC in the first direction D1 may be defined as a first height HE1. The first height HE1 may be substantially equal to a distance (e.g., pitch) between the first power line M1_R1 and the second power line M1_R2. For example, the first height HE1 may be the distance between corresponding points (e.g., center longitudinal lines) of the first power line M1_R1 and the second power line M1_R2.

The single height cell SHC may constitute a single logic cell. In the present specification, the logic cell may mean a logic device (e.g., AND, OR, XOR, XNOR, inverter, and so forth), which is configured to execute a specific function. For example, the logic cell may include transistors constituting the logic device and interconnection lines connecting transistors to each other.

Referring to FIG. 2, a double height cell DHC may be provided. In detail, the first power line M1_R1, the second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the source voltage VSS is provided.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. When viewed in a plan view, the first power line M1_R1 may be disposed between the first and second PMOSFET regions PR1 and PR2.

A length of the double height cell DHC in the first direction D1 may be defined as a second height HE2. The second height HE2 may be about two times the first height HE1 of FIG. 1. The first and second PMOSFET regions PR1 and PR2 of the double height cell DHC may be combined to serve as a single PMOSFET region.

Thus, a channel size of a PMOS transistor of the double height cell DHC may be greater than a channel size of a PMOS transistor of the single height cell SHC previously described with reference to FIG. 1. For example, the channel size of the PMOS transistor of the double height cell DHC may be about two times the channel size of the PMOS transistor of the single height cell SHC. In this case, the double height cell DHC may be operated at a higher speed than the single height cell SHC. In an embodiment, the double height cell DHC shown in FIG. 2 may be defined as a multi-height cell. Although not shown, the multi-height cell may include a triple height cell whose cell height is about three times that of the single height cell SHC.

Referring to FIG. 3, a first single height cell SHC1, a second single height cell SHC2, and the double height cell DHC may be two-dimensionally disposed on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2. The second direction D2 may be perpendicular to the first direction D1, crossing the first direction D1. The first and second directions D1 and D2 may be parallel to a top surface of the substrate 100.

A division structure DB may be provided between the first single height cell SHC1 and the double height cell DHC and between the second single height cell SHC2 and the double height cell DHC. The active region of the double height cell DHC may be electrically separated from the active region of each of the first and second single height cells SHC1 and SHC2 by the division structure DB.

Figure 4:
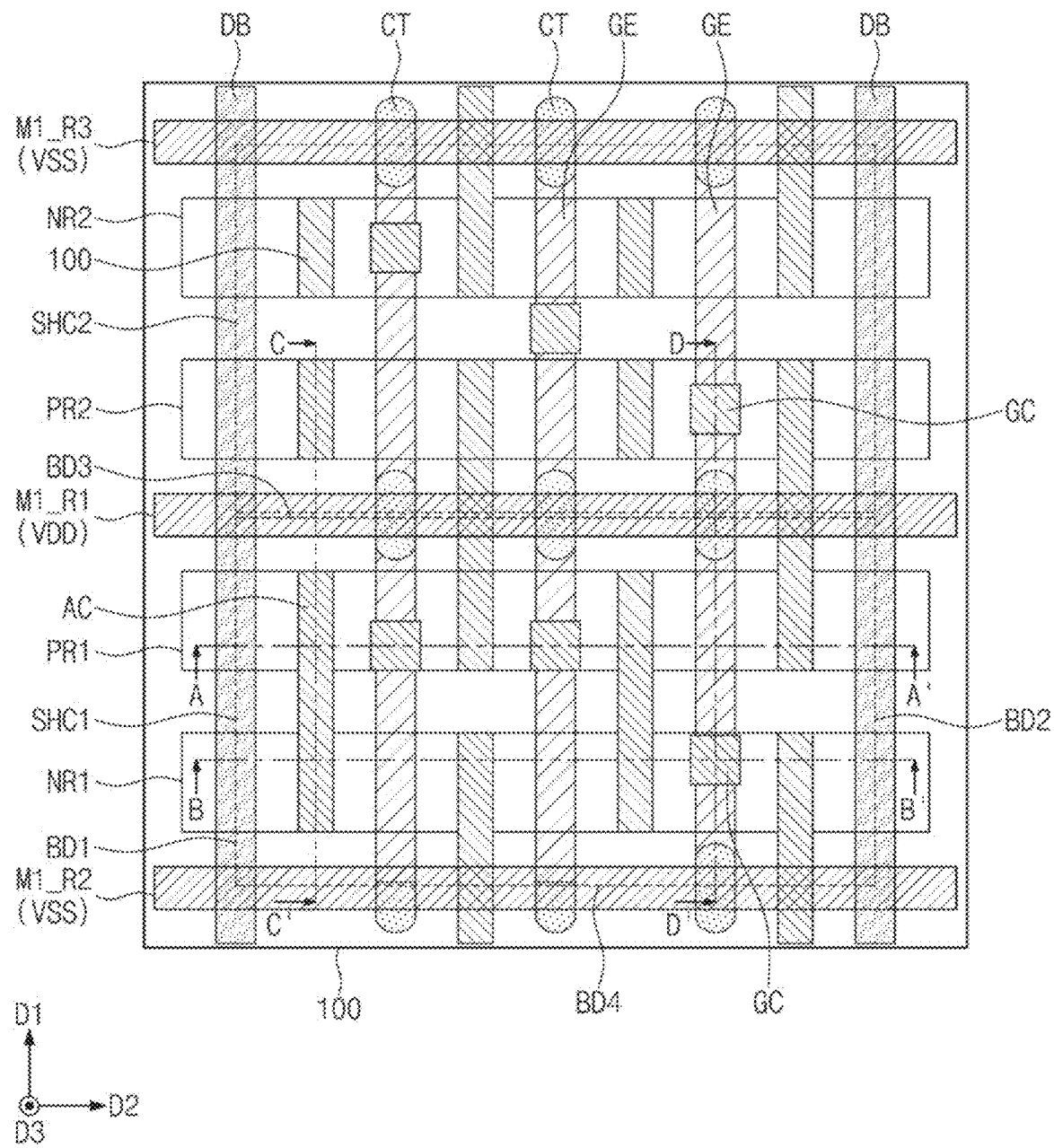
FIG. 4 is a plan view illustrating a semiconductor device, according to an example embodiment of the inventive concept.
Figure 5A:
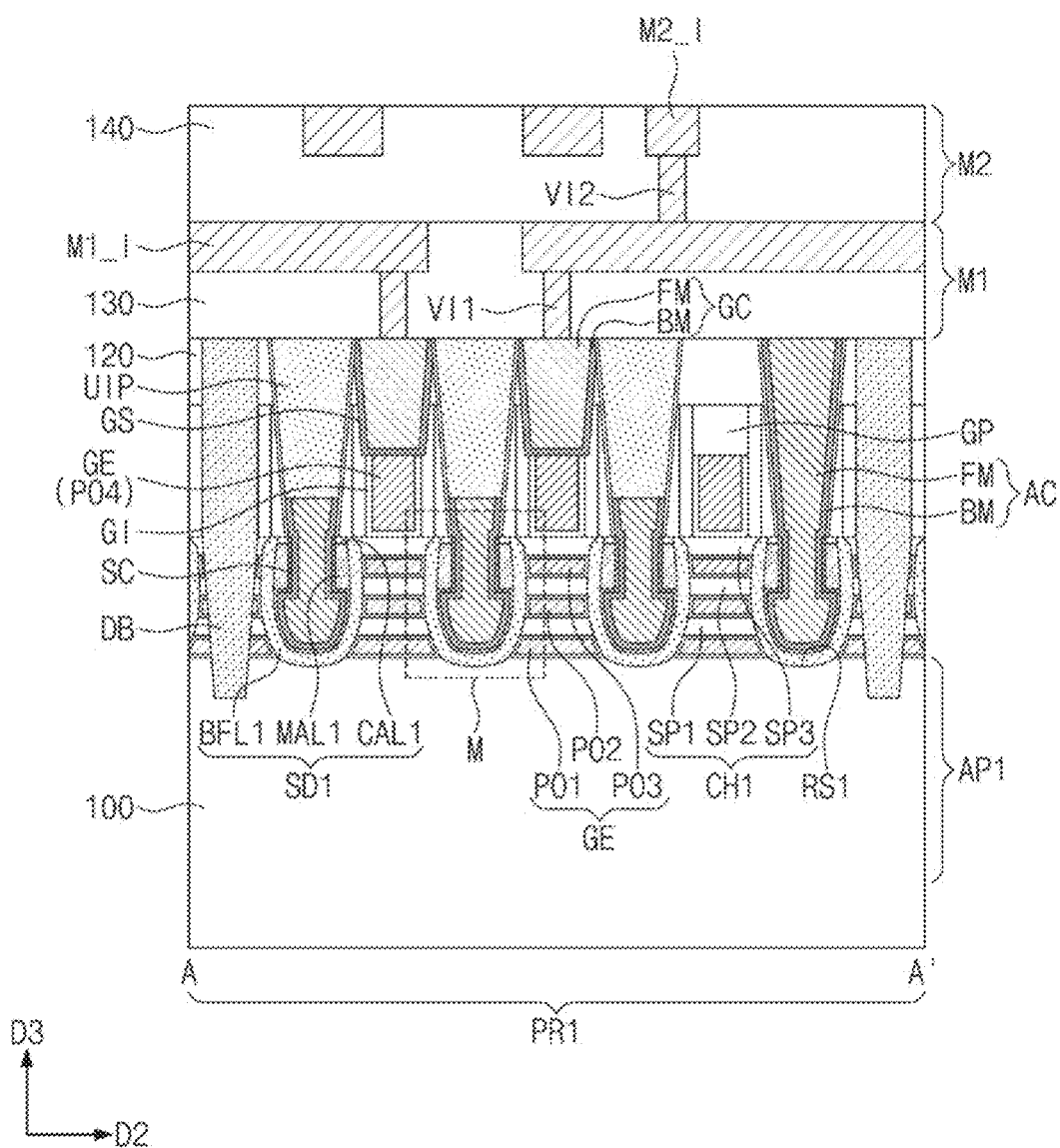
FIGS. 5A to 5D are sectional views, which are respectively taken along with lines A-A', B-B', C-C', and D-D' of FIG. 4.
Figure 5B:
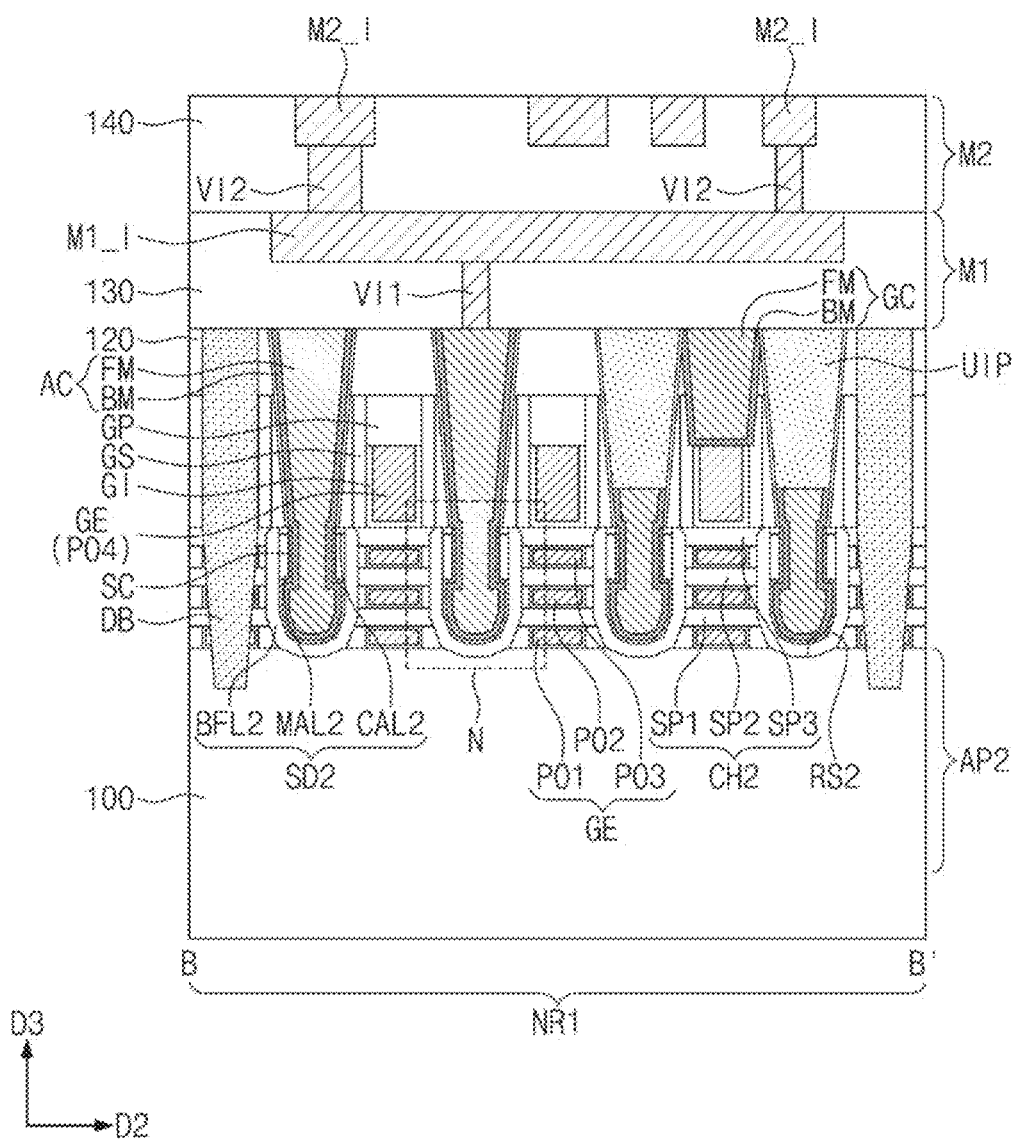
Figure 5C:
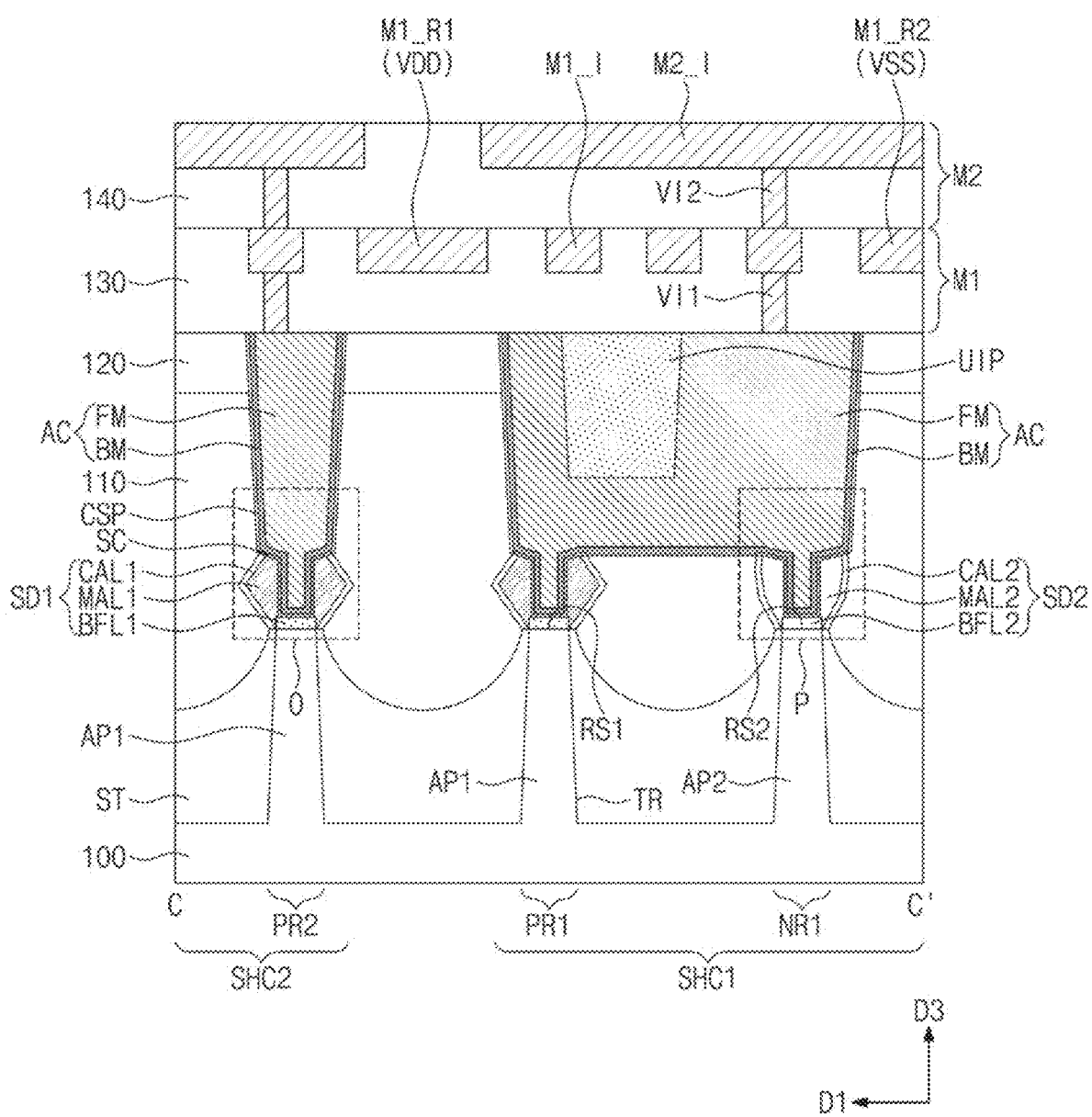
Figure 5D:
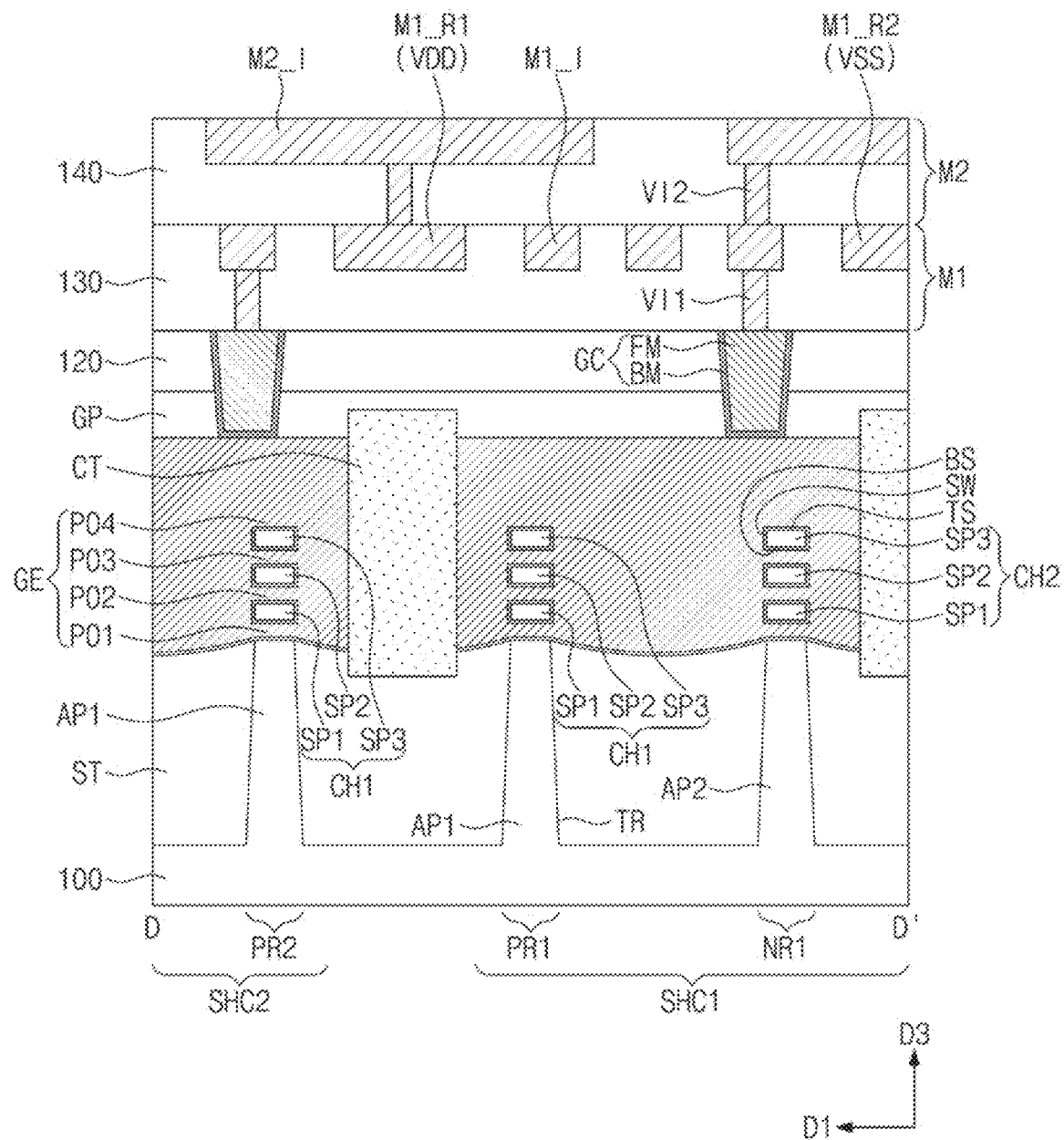
Figure 6A:
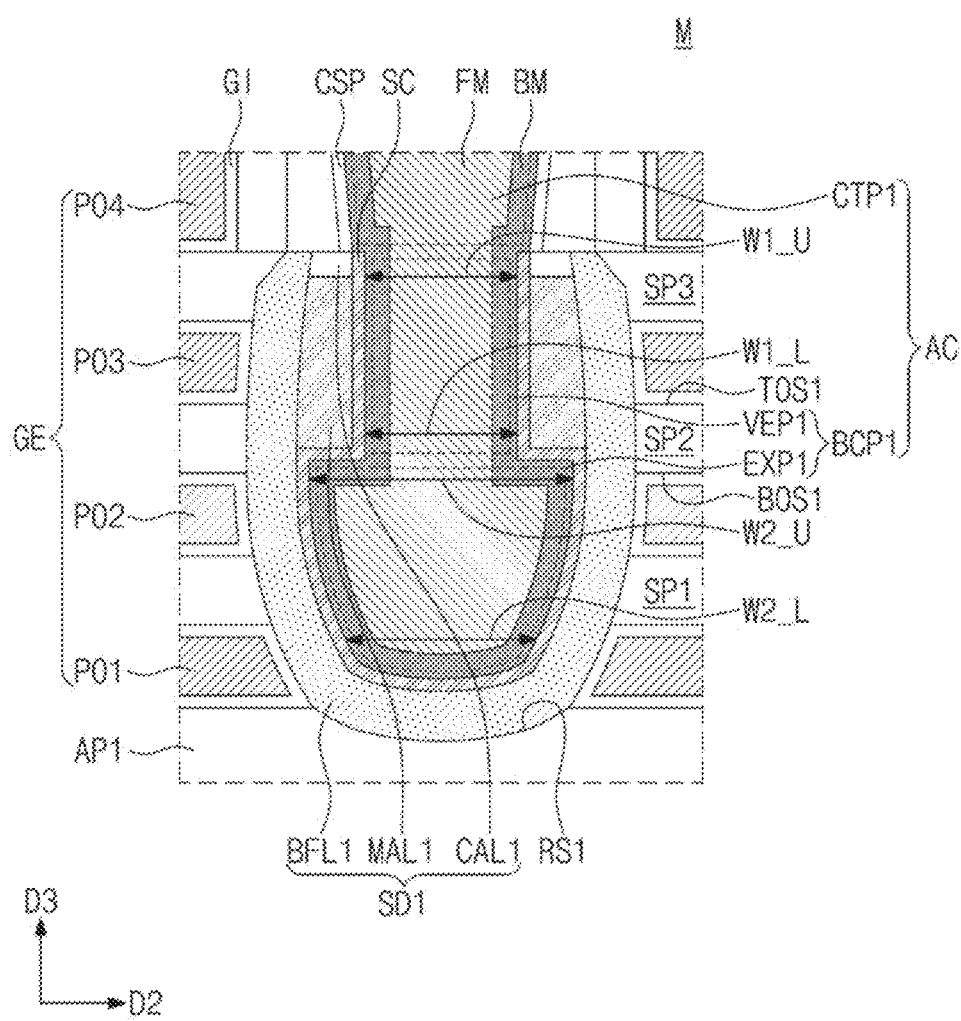
FIG. 6A is an enlarged sectional view illustrating an example of a portion 'M' of FIG. 5A.
Figure 6B:
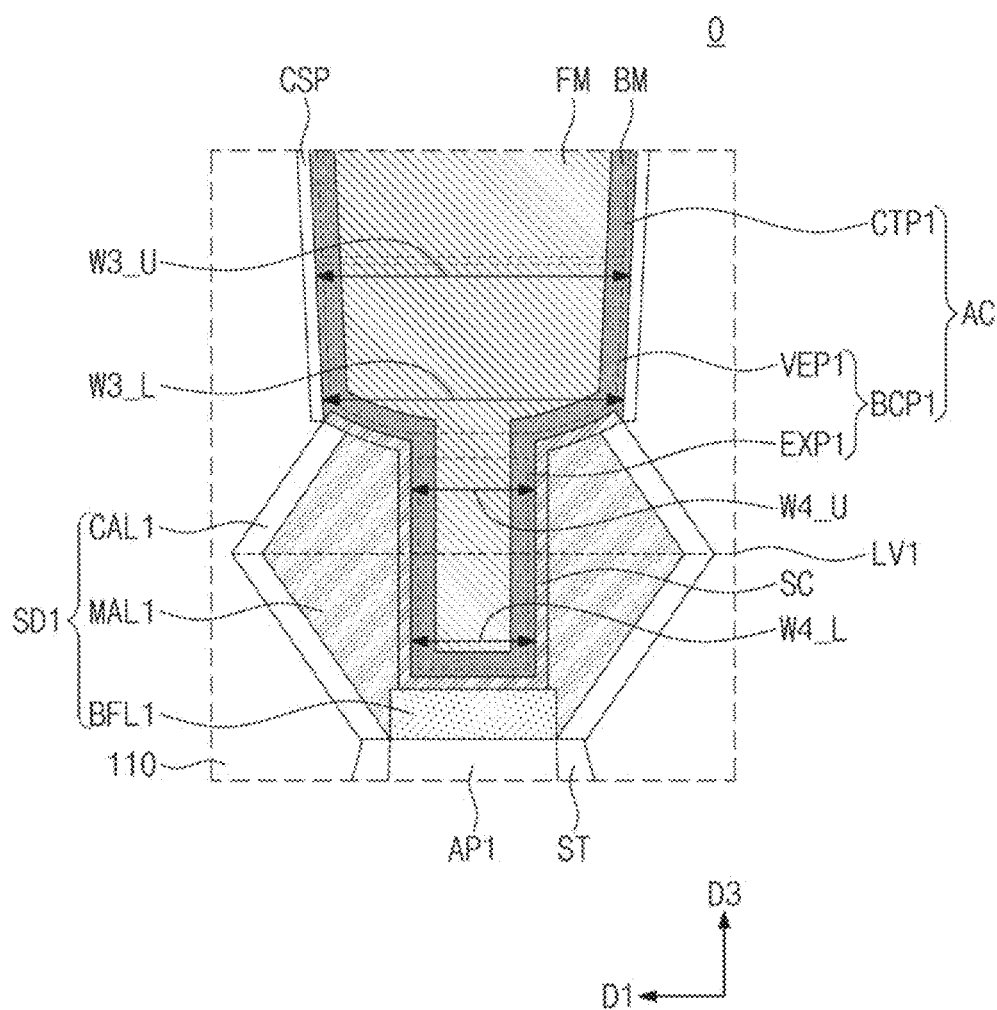
FIG. 6B is an enlarged sectional view illustrating an example of a portion 'O' of FIG. 5C.
Figure 7A:
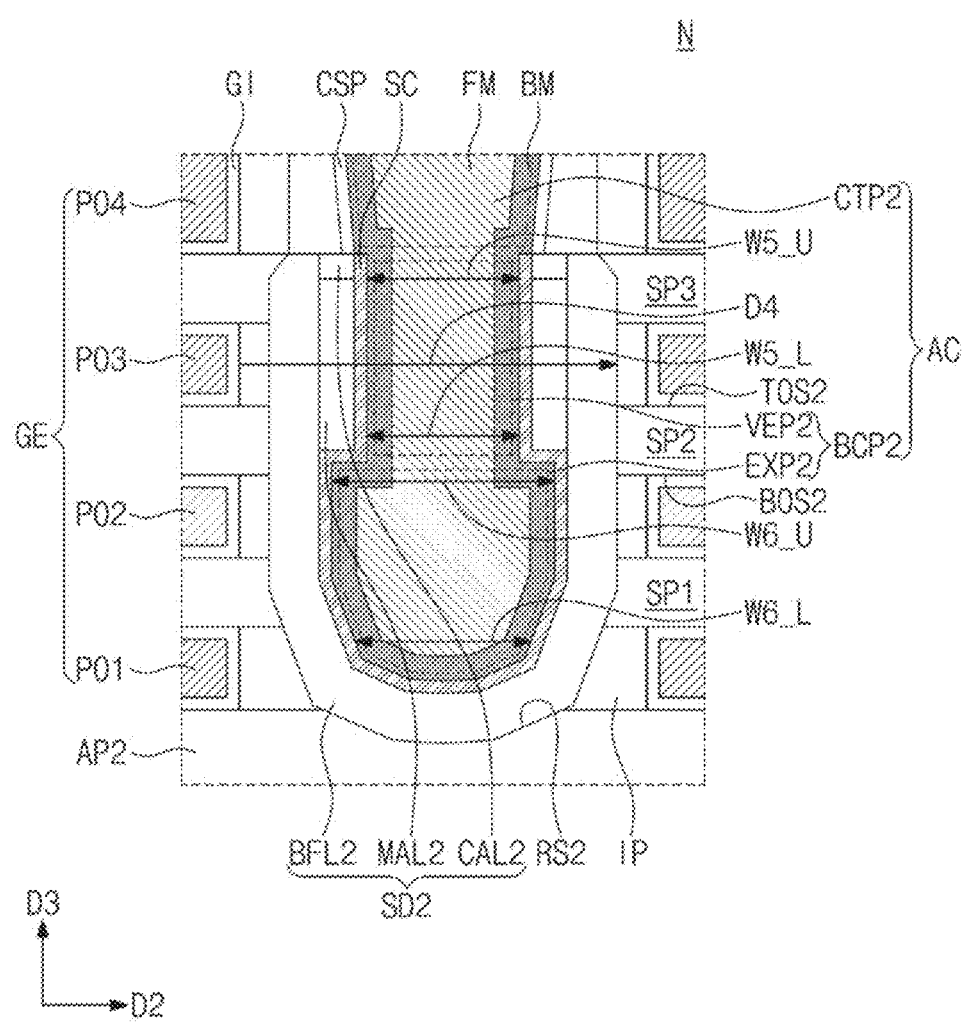
FIG. 7A is an enlarged sectional view illustrating an example of a portion 'N' of FIG. 5B.
Figure 7B:
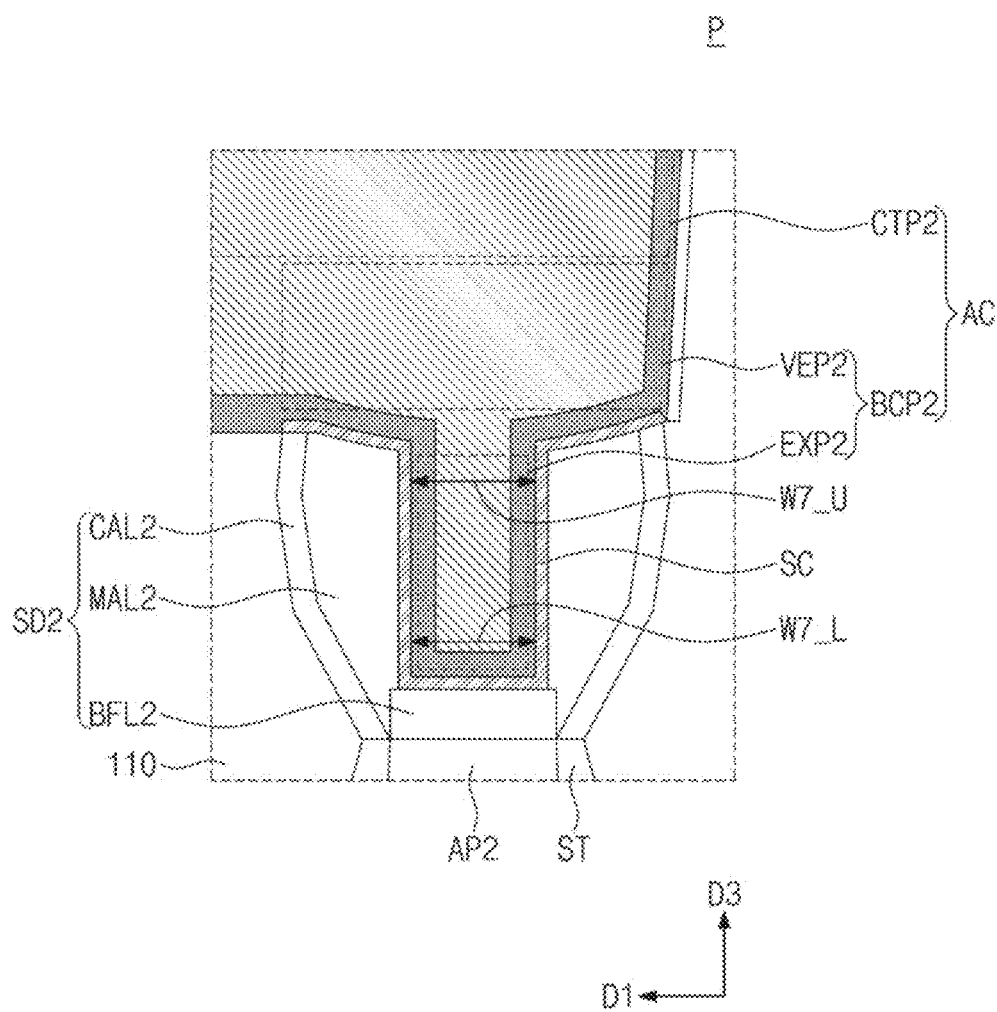
FIG. 7B is an enlarged sectional view illustrating an example of a portion 'P' of FIG. 5C.

FIG. 4 is a plan view illustrating a semiconductor device, according to an example embodiment of the inventive concept. FIGS. 5A to 5D are sectional views, which are respectively taken along with lines A-A', B-B', C-C', and D-D' of FIG. 4. FIG. 6A is an enlarged sectional view illustrating an example of a portion 'M' of FIG. 5A, FIG. 6B is an enlarged sectional view illustrating an example of a portion 'O' of FIG. 5C, FIG. 7A is an enlarged sectional view illustrating an example of a portion 'N' of FIG. 5B, and FIG. 7B is an enlarged sectional view illustrating an example of a portion 'P' of FIG. 5C. FIGS. 4 and 5A to 5D illustrate a detailed example of the first and second single height cells SHC1 and SHC2 of the semiconductor device of FIG. 3.

Referring to FIGS. 4 and 5A to 5D, the first and second single height cells SHC1 and SHC2 may be provided on the substrate 100. Logic transistors constituting the logic circuit may be disposed on each of the first and second single height cells SHC1 and SHC2. The substrate 100 may be a semiconductor substrate that is formed of or includes silicon, germanium, silicon-germanium, a compound semiconductor material, or the like. As an example, the substrate 100 may be a silicon wafer.

The substrate 100 may have the first PMOSFET region PR1, the second PMOSFET region PR2, the first NMOSFET region NR1, and the second NMOSFET region NR2. Each of the first PMOSFET region PR1, the second PMOSFET region PR2, the first NMOSFET region NR1, and the second NMOSFET region NR2 may be extended lengthwise in the second direction D2. The first single height cell SHC1 may include the first NMOSFET region NR1 and the first PMOSFET region PR1, and the second single height cell SHC2 may include the second PMOSFET region PR2 and the second NMOSFET region NR2.

First active patterns AP1 and second active patterns AP2 may be defined by trenches TR, which are formed in an upper portion of the substrate 100. The first active patterns AP1 may be provided on each of the first and second PMOSFET regions PR1 and PR2, respectively. The second active patterns AP2 may be provided on each of the first and second NMOSFET regions NR1 and NR2, respectively. The first and second active patterns AP1 and AP2 may be extended lengthwise in the second direction D2. The first and second active patterns AP1 and AP2 may be vertically protruding portions of the substrate 100. For example, the first and second active patterns AP1 and AP2 may be portions of the substrate 100 that protrude in the third direction D3. The third direction D3 may be perpendicular to the first and second directions D1 and D2.

A device isolation layer ST may be provided to fill the trench TR. The device isolation layer ST may be formed of or may include silicon oxide. The device isolation layer ST may not cover first and second channel patterns CH1 and CH2, which will be described below.

The first channel patterns CH1 may be provided on the first active patterns AP1. The second channel patterns CH2 may be provided on the second active patterns AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or may include silicon (Si), germanium (Ge), or silicon-germanium (SiGe). For example, each of the first to third semiconductor patterns SP1, SP2, and SP3 may be formed of or may include crystalline silicon.

A plurality of first source/drain patterns SD1 may be provided on the first active patterns AP1. A plurality of first recesses RS1 may be formed in an upper portion of the first active patterns AP1. The first source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. For example, each pair of the first source/drain patterns SD1 may be connected to each other by the stacked first to third semiconductor patterns SP1, SP2, and SP3.

A plurality of second source/drain patterns SD2 may be provided on the second active patterns AP2. A plurality of second recesses RS2 may be formed in an upper portion of the second active patterns AP2. The second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. For example, each pair of the second source/drain patterns SD2 may be connected to each other by the first to third semiconductor patterns SP1, SP2, and SP3 stacked.

The first and second source/drain patterns SD1 and SD2 may be epitaxial patterns, which are formed by a selective epitaxial growth (SEG) process. As an example, a top surface of each of the first and second source/drain patterns SD1 and SD2 may be located at substantially the same level as a top surface of the third semiconductor pattern SP3. Alternatively, the top surface of each of the first and second source/drain patterns SD1 and SD2 may be higher than the top surface of the third semiconductor pattern SP3.

The first source/drain patterns SD1 may include a semiconductor material (e.g., SiGe) having a lattice constant greater than that of the substrate 100. In this case, the pair of the first source/drain patterns SD1 may exert a compressive stress on the first channel patterns CH1 therebetween. The second source/drain patterns SD2 may be formed of or may include the same semiconductor element (e.g., Si) as the substrate 100.

Each of the first source/drain patterns SD1 may include a first buffer layer BFL1, a first main layer MAL1 on the first buffer layer BFL1, and a first capping layer CAL1 on the first main layer MAL1. Cross-sections of the first source/drain pattern SD1 in the first and second directions D1 and D2 will be described in more detail with reference to FIGS. 6A and 6B, respectively.

The first buffer layer BFL1 may cover an inner side surface of the first recess RS1. In example embodiments, the first buffer layer BFL1 may contact an upper surface of the first active pattern AP1. In an embodiment, the first buffer layer BFL1 may have a substantially conformal thickness. For example, a thickness, in the third direction D3, of the first buffer layer BFL1 at a bottom level of the first recess RS1 may be substantially equal to a thickness, in the second direction D2, of the first buffer layer BFL1 at an upper level of the first recess RS1.

Alternatively, the first buffer layer BFL1 may have a decreasing thickness in an upward direction. For example, the thickness, in the third direction D3, of the first buffer layer BFL1 at a bottom level of the first recess RS1 may be larger than a thickness, in the second direction D2, of the first buffer layer BFL1 at an upper level of the first recess RS1. The first buffer layer BFL1 may have a 'U'-shaped section corresponding to the profile of the first recess RS1.

The first main layer MAL1 may fill most of the remaining space of the first recess RS1, except for the first buffer layer BFL1. A volume of the first main layer MAL1 may be larger than a volume of the first buffer layer BFL1 (e.g., see FIG. 6B). For example, a ratio of the volume of the first main layer MAL1 to a total volume of the first source/drain pattern SD1 may be greater than a ratio of the volume of the first buffer layer BFL1 to the total volume of the first source/drain pattern SD1. The first main layer MAL1 may be in contact with the first buffer layer BFL1.

Each of the first buffer layer BFL1 and the first main layer MAL1 may include silicon-germanium (SiGe). In detail, the first buffer layer BFL1 may contain a relatively low concentration of germanium (Ge). In an embodiment, the first buffer layer BFL1 may contain only silicon (Si) without germanium (Ge). A concentration of the germanium (Ge) in the first buffer layer BFL1 may range from 0 at % to 10 at %.

The first main layer MAL1 may contain a relatively high concentration of germanium (Ge). As an example, a concentration of the germanium (Ge) in the first main layer MAL1 may range from 30 at % to 70 at %. The concentration of the germanium (Ge) of the first main layer MAL1 may increase in the third direction D3. For example, referring to FIGS. 5C and 6B, a portion of the first main layer MAL1 adjacent to the first buffer layer BFL1 may have a germanium (Ge) concentration of about 40 at %, but an upper portion of the first main layer MAL1 may have a germanium (Ge) concentration of about 60 at %.

Each of the first buffer layer BFL1 and the first main layer MAL1 may contain impurities (e.g., boron, gallium, or indium) that allow the first source/drain pattern SD1 to have a p-type. The impurity concentration of each of the first buffer layer BFL1 and the first main layer MAL1 may range from 1E18 atom/cm$^3$ to 5E22 atom/cm$^3$. The impurity concentration of the first main layer MAL1 may be higher than the impurity concentration of the first buffer layer BFL1.

The first buffer layer BFL1 may prevent a stacking fault from occurring between the substrate 100 (i.e., the first active pattern AP1) and the first main layer MAL1 and between the first to third semiconductor patterns SP1, SP2, and SP3 and the first main layer MAL1. The stacking fault may lead to an increase of a channel resistance. The stacking fault may occur more easily on the bottom of the first recess RS1. Thus, if the first buffer layer BFL1 has a relatively large thickness at a region adjacent to the bottom of the first recess RS1, the stacking fault may be prevented.

The first buffer layer BFL1 may protect the first main layer MAL1 in a process of replacing second semiconductor layers SAL, which will be described below, with first to third portions PO1, PO2, and PO3 of a gate electrode GE. For example, the first buffer layer BFL1 may prevent an etchant material, which is used to remove the second semiconductor layers SAL, from entering and etching the first main layer MAL1.

The first main layer MAL1 may further contain a tiny amount of a first etch enhancement element. The first etch enhancement element may be an element contained in a first sacrificial layer SFL1, which will be described below. The first etch enhancement element may be one of elements allowing the first sacrificial layer SFL1 to have a high etch selectivity with respect to the first buffer layer BFL1 and the first main layer MAL1. For example, the first etch enhancement element may be at least one selected from the group consisting of germanium (Ge), boron (B), phosphorus (P), gallium (Ga), antimony (Sb), arsenic (As), carbon (C), indium (In), tin (Sn), fluorine (F), nitrogen (N), yttrium (Y), and oxygen (O).

In the case where the first etch enhancement element in the first sacrificial layer SFL1 is diffused into the first main layer MAL1, the first sacrificial layer SFL1 may contains a tiny amount of the first etch enhancement element. A concentration of the first etch enhancement element in the first main layer MAL1 may range from 1E18 atom/cm$^3$ to 1E22 atom/cm$^3$.

In the case where the first etch enhancement element is germanium (Ge), a concentration of the germanium in the first main layer MAL1 may be substantially unchanged, because a concentration of germanium in the first main layer MAL1 is already high.

The first capping layer CAL1 may be provided to conformally cover a surface of the first main layer MAL1. Thus, the surface of the first main layer MAL1 may be protected by the first capping layer CALL In some embodiments, the first capping layer CAL1 may contact the surface of the first main layer MAL1. The first capping layer CAL1 may include silicon (Si). In an embodiment, the first capping layer CAL1 may also contain a tiny amount of germanium (Ge) that is diffused from the first main layer MAL1. A concentration of the silicon (Si) in the first capping layer CAL1 may range from 98 at % to 100 at %.

Each of the second source/drain patterns SD2 may include a second buffer layer BFL2, a second main layer MAL2 on the second buffer layer BFL2, and a second capping layer CAL2 on the second main layer MAL2. Cross-sections of the second source/drain pattern SD2 in the first and second directions D1 and D2 will be described in more detail with reference to FIGS. 7A and 7B.

The second buffer layer BFL2 may be provided to cover an inner side surface of the second recess RS2. In an embodiment, the second buffer layer BFL2 may have a substantially conformal thickness. For example, a thickness, in the third direction D3, of the second buffer layer BFL2 at a bottom level of the second recess RS2 may be substantially equal to a thickness, in the second direction D2, of the second buffer layer BFL2 at an upper level of the second recess RS2. Alternatively, the second buffer layer BFL2 may have a decreasing thickness in an upward direction. The second buffer layer BFL2 may have a 'U'-shaped section corresponding to the profile of the second recess RS2.

The second main layer MAL2 may fill most of the remaining space of the second recess RS2, except for the second buffer layer BFL2. A volume of the second main layer MAL2 may be larger than a volume of the second buffer layer BFL2 (e.g., see FIG. 7B). For example, a ratio of a volume of the second main layer MAL2 to a total volume of the second source/drain pattern SD2 may be greater than a ratio of a volume of the second buffer layer BFL2 to the total volume of the second source/drain pattern SD2.

Each of the second buffer layer BFL2 and the second main layer MAL2 may include silicon (Si). Each of the second buffer layer BFL2 and the second main layer MAL2 may further contain impurities (e.g., phosphorus, arsenic, or antimony) that allow the second source/drain pattern SD2 to has an n-type. The impurity concentration of each of the second buffer layer BFL2 and the second main layer MAL2 may range from 1E18 atom/cm$^3$ to 5E22 atom/cm$^3$. The impurity concentration of the second main layer MAL2 may be higher than the impurity concentration of the second buffer layer BFL2.

The second main layer MAL2 may contain a tiny amount of a second etch enhancement element. The second etch enhancement element may be an element contained in a second sacrificial layer SFL2, which will be described below. The second etch enhancement element may be an element allowing the second sacrificial layer SFL2 to have a high etch selectivity with respect to the second buffer layer BFL2 and the second main layer MAL2. The second etch enhancement element may be at least one selected from the group consisting of germanium (Ge), boron (B), phosphorus (P), gallium (Ga), antimony (Sb), arsenic (As), carbon (C), indium (In), tin (Sn), fluorine (F), nitrogen (N), yttrium (Y), and oxygen (O).

In the case where the second etch enhancement element in the second sacrificial layer SFL2 is diffused into the second main layer MAL2, the second sacrificial layer SFL2 may contain a tiny amount of the second etch enhancement element. For example, the second etch enhancement element may be germanium (Ge), and in this case, the second main layer MAL2 may further contain a tiny amount of germanium (Ge).

Figure 8:
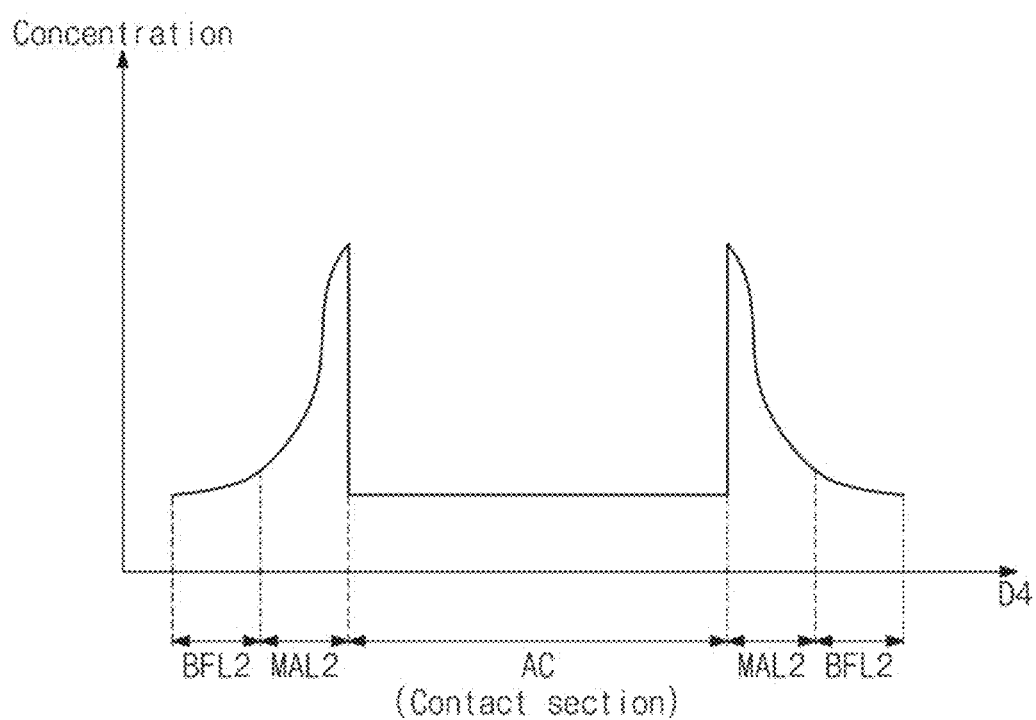
FIG. 8 is a graph illustrating a concentration profile of a second etch enhancement element measured in a fourth direction of FIG. 7A.

A concentration of the second etch enhancement element in the second main layer MAL2 may range from 1E18 atom/cm$^3$ to 1E22 atom/cm$^3$. For example, FIG. 8 shows a concentration profile of the second etch enhancement element measured in a fourth direction D4 of FIG. 7A. The fourth direction D4 may be a direction from the second channel pattern CH2 toward a second buried portion BCP2 of an active contact AC.

A concentration of the second etch enhancement element of the second source/drain pattern SD2 may increase in a direction from the second channel pattern CH2 toward the second buried portion BCP2 of the active contact AC. More specifically, the concentration of the second etch enhancement element of the second source/drain pattern SD2 may increase in a direction from the second buffer layer BFL2 toward the second buried portion BCP2. The second etch enhancement element may be substantially absent in the active contact AC.

The concentration of the second etch enhancement element may be abruptly changed in the second main layer MAL2. A concentration of the second etch enhancement element at a portion of the second main layer MAL2 adjacent to the second buffer layer BFL2 may be lower than a concentration of the second etch enhancement element at a portion of the second main layer MAL2 adjacent to the active contact AC.

Even in the afore-described case of the first source/drain pattern SD1, the concentration profile of the first etch enhancement element, except germanium (Ge), may have the same or similar as that in FIG. 8.

The second capping layer CAL2 may conformally cover a surface of the second main layer MAL2. Thus, the surface of the second main layer MAL2 may be protected by the second capping layer CAL2. In some embodiments, the second capping layer CAL2 may contact the surface of the second main layer MAL2. The second capping layer CAL2 may include silicon (Si). The second capping layer CAL2 may contain substantially no impurity.

All of the second buffer layer BFL2, the second main layer MAL2, and the second capping layer CAL2 constituting the second source/drain pattern SD2 may contain silicon (Si) of 98 at % or higher, although they have impurity concentrations different from each other. Thus, there may be no distinguishable interface between the second buffer layer BFL2, the second main layer MAL2, and the second capping layer CAL2. The second buffer layer BFL2, the second main layer MAL2, and the second capping layer CAL2 may be connected to each other to constitute a single second source/drain pattern SD2.

The gate electrodes GE may be provided to cross the first and second channel patterns CH1 and CH2 and to extend lengthwise in the first direction D1. The gate electrodes GE may be arranged at a first pitch in the second direction D2. Each of the gate electrodes GE may be overlapped with the first and second channel patterns CH1 and CH2 when viewed in a plan view.

The gate electrode GE may include a first portion PO1 interposed between the active pattern AP1 or AP2 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Referring back to FIG. 5A, the first to third portions PO1, PO2, and PO3 of the gate electrode GE on the PMOSFET region PR may have different widths from each other. For example, the largest width of the third portion PO3 in the second direction D2 may be larger than the largest width of the second portion PO2 in the second direction D2. The largest width of the first portion PO1 in the second direction D2 may be larger than the largest width of the third portion PO3 in the second direction D2.

Referring back to FIG. 5D, the gate electrode GE may be provided on a top surface TS, a bottom surface BS, and opposite side surfaces SW of each of the first to third semiconductor patterns SP1, SP2, and SP3. For example, the transistor according to the present embodiment may be a three-dimensional field effect transistor (e.g., MBCFET or GAAFET) in which the gate electrode GE is provided to three-dimensionally surround the channel pattern.

As an example, the first single height cell SHC1 may have a first border BD1 and a second border BD2, which are opposite to each other in the second direction D2. The first and second borders BD1 and BD2 may be extended lengthwise in the first direction D1. The first single height cell SHC1 may have a third border BD3 and a fourth border BD4, which are opposite to each other in the first direction D1. The third and fourth borders BD3 and BD4 may be extended lengthwise in the second direction D2.

Gate cutting patterns CT may be disposed on a border of each of the first and second single height cells SHC1 and SHC2 parallel to the second direction D2. For example, the gate cutting patterns CT may be disposed on the third and fourth borders BD3 and BD4 of the first single height cell SHC1. The gate cutting patterns CT may be arranged at the first pitch along the third border BD3. The gate cutting patterns CT may be arranged at the first pitch along the fourth border BD4. When viewed in a plan view, the gate cutting patterns CT on the third and fourth borders BD3 and BD4 may be disposed to be overlapped with the gate electrodes GE, respectively. The gate cutting patterns CT may be formed of or may include at least one of insulating materials (e.g., silicon oxide, silicon nitride, or combinations thereof).

The gate electrode GE on the first single height cell SHC1 may be separated from the gate electrode GE on the second single height cell SHC2 by the gate cutting pattern CT. The gate cutting pattern CT may be interposed between the gate electrodes GE on the first and second single height cells SHC1 and SHC2 which are aligned to each other in the first direction D1. For example, the gate electrode GE extending lengthwise in the first direction D1 may be divided into a plurality of the gate electrodes GE by the gate cutting patterns CT.

Referring back to FIGS. 4 and 5A to 5D, a pair of gate spacers GS may be respectively disposed on opposite side surfaces of the fourth portion PO4 of the gate electrode GE. The gate spacers GS may be extended lengthwise along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. The gate spacers GS may be formed of or may include at least one of SiCN, SiCON, or SiN. Alternatively, the gate spacers GS may be a multi-layered structure, which includes at least two different materials selected from SiCN, SiCON, and SiN.

A gate capping pattern GP may be provided on the gate electrode GE. The gate capping pattern GP may be extended lengthwise along the gate electrode GE or in the first direction D1. The top surfaces of the gate spacers GS may be coplanar with a top surface of the gate capping pattern GP. The gate capping pattern GP may be formed of or may include a material having an etch selectivity with respect to first and second interlayer insulating layers 110 and 120, which will be described below. In detail, the gate capping pattern GP may be formed of or may include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and opposite side surfaces SW1 and SW2 of each of the first to third semiconductor patterns SP1, SP2, and SP3. The gate insulating layer GI may cover a top surface of the device isolation layer ST below the gate electrode GE.

In an embodiment, the gate insulating layer GI may include a silicon oxide layer, a silicon oxynitride layer, and/or a high-k dielectric layer. The high-k dielectric layer may be formed of or may include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at room temperature.

The ferroelectric layer may have the ferroelectric property. The ferroelectric layer may be formed of or may include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 at % to 8 at % (atomic percentage). Here, the content of the aluminum as the dopants may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or may include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concept is not limited to these examples.

The ferroelectric layer and the paraelectric layer may be formed of or may include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property only when its thickness is in a specific range. In an embodiment, the ferroelectric layer may have a thickness ranging from 0.5 nm to 10 nm, but the inventive concept is not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work function metal.

The first metal pattern may include a metal nitride layer. For example, the first metal pattern may include at least one metallic material, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of work function metal layers, which are stacked.

The second metal pattern may include a metallic material whose resistance is lower than the first metal pattern. For example, the second metal pattern may include at least one metallic material, which is selected from the group consisting of tungsten (W), aluminum (Al), titanium (Ti), and tantalum (Ta). For example, the fourth portion PO4 of the gate electrode GE may include the first metal pattern and the second metal pattern on the first metal pattern.

Referring back to FIG. 7A, inner spacers IP may be provided on the first and second NMOSFET regions NR1 and NR2. For example, the inner spacers IP may be provided on the second active pattern AP2. Each of the inner spacers IP may be interposed between the second source/drain pattern SD2 and a corresponding one of the first to third portions PO1, PO2, and PO3 of the gate electrode GE. The inner spacers IP may be in direct contact with the second source/drain pattern SD2. Each of the first to third portions PO1, PO2, and PO3 of the gate electrode GE may be spaced apart from the second source/drain pattern SD2 by the inner spacer IP.

The first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. The second interlayer insulating layer 120 may contact a top surface of the gate capping pattern GP. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may be formed of or may include silicon oxide.

A pair of division structures DB may be provided at both sides of each of the first and second single height cells SHC1 and SHC2 to be opposite to each other in the second direction D2. For example, the pair of the division structures DB may be respectively provided on the first and second borders BD1 and BD2 of the first single height cell SHC1. The division structure DB may be extended lengthwise in the first direction D1 and parallel to the gate electrodes GE. A pitch between the division structure DB and the gate electrode GE adjacent thereto may be equal to the first pitch.

The division structure DB may penetrate the first and second interlayer insulating layers 110 and 120 and may be extended into the first and second active patterns AP1 and AP2. The division structure DB may penetrate an upper portion of each of the first and second active patterns AP1 and AP2. For example, a lower surface of the division structure DB may be at a lower level than upper surfaces of the first and second active patterns AP1 and AP2. The division structure DB may electrically separate an active region of each of the first and second single height cells SHC1 and SHC2 from an active region of a neighboring cell.

The active contacts AC may be provided to penetrate the first and second interlayer insulating layers 110 and 120 and may be electrically connected to the first and second source/drain patterns SD1 and SD2, respectively. A pair of the active contacts AC may be respectively provided at both sides of the gate electrode GE. When viewed in a plan view, the active contact AC may have a bar shape elongated in the first direction D1.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Although not shown, the active contact AC may be provided to cover a portion of the top surface of the gate capping pattern GP.

A contact spacer CSP may be provided on a side surface of the active contact AC. The contact spacer CSP may be interposed between the active contact AC and the first interlayer insulating layer 110. The contact spacer CSP may be formed of or may include at least one of SiCN, SiCON, or SiN.

A metal-semiconductor compound layer SC (e.g., a silicide layer) may be respectively interposed between the active contact AC and the first source/drain pattern SD1 and between the active contact AC and the second source/drain pattern SD2. The active contact AC may be electrically connected to the source/drain pattern SD1 and SD2 through the metal-semiconductor compound layer SC. For example, the metal-semiconductor compound layer SC may be formed of or may include at least one of titanium silicide, tantalum silicide, tungsten silicide, nickel silicide, or cobalt silicide.

Referring back to FIG. 5C, at least one of the active contacts AC on the first single height cell SHC1 may be used to electrically connect the first source/drain pattern SD1 of the first PMOSFET region PR1 to the second source/drain pattern SD2 of the first NMOSFET region NR1. The active contact AC may be extended from the second source/drain pattern SD2 of the first NMOSFET region NR1 to the first source/drain pattern SD1 of the first PMOSFET region PR1 in the first direction D1.

Gate contacts GC may be provided to penetrate the second interlayer insulating layer 120 and the gate capping pattern GP, and may be electrically connected to the gate electrodes GE, respectively. When viewed in a plan view, a pair of the gate contacts GC on the first single height cell SHC1 may be disposed to be overlapped with the first PMOSFET region PR1. For example, the pair of the gate contacts GC on the first single height cell SHC1 may be provided on the first active pattern AP1 (e.g., see FIG. 5A). When viewed in a plan view, a single gate contact GC on the first single height cell SHC1 may be disposed to be overlapped with the first NMOSFET region NR1. For example, the single gate contact GC on the first single height cell SHC1 may be provided on the second active pattern AP2 (e.g., see FIG. 5B).

The gate contact GC may be freely disposed on the gate electrode GE, without any limitation in its position. For example, the gate contacts GC on the second single height cell SHC2 may be respectively disposed on the second PMOSFET region PR2, the second NMOSFET region NR2, and the device isolation layer ST filling the trench TR (e.g., see FIG. 4).

In an embodiment, referring to FIGS. 5A, 5B, and 5C, an upper portion of the active contact AC adjacent to the gate contact GC may be filled with an upper insulating pattern UIP. A bottom surface of the upper insulating pattern UIP may be lower than a bottom surface of the gate contact GC. For example, a top surface of the active contact AC adjacent to the gate contact GC may be formed at a level, which is lower than the bottom surface of the gate contact GC, by the upper insulating pattern UIP. Accordingly, it may be possible to prevent the gate contact GC and the active contact AC, which are adjacent to each other, from being in contact with each other and thereby to prevent a short circuit issue from occurring.

Each of the active and gate contacts AC and GC may include a conductive pattern FM and a barrier pattern BM enclosing the conductive pattern FM. For example, the conductive pattern FM may be formed of or may include at least one metal of aluminum, copper, tungsten, molybdenum, or cobalt. The barrier pattern BM may cover side and bottom surfaces of the conductive pattern FM. In an embodiment, the barrier pattern BM may include a metal layer and a metal nitride layer. The metal layer may be formed of or may include at least one of titanium, tantalum, tungsten, nickel, cobalt, or platinum. The metal nitride layer may be formed of or may include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. For example, the first metal layer M1 may include the first power line M1_R1, the second power line M1_R2, the third power line M1_R3, and first interconnection lines M1_I. The interconnection lines M1_R1, M1_R2, M1_R3, and M1_I of the first metal layer M1 may be extended lengthwise in the second direction D2 to be parallel to each other.

In detail, the first and second power lines M1_R1 and M1_R2 may be provided on the third and fourth borders BD3 and BD4 of the first single height cell SHC1, respectively. The first power line M1_R1 may be extended lengthwise along the third border BD3 and in the second direction D2. The second power line M1_R2 may be extended lengthwise along the fourth border BD4 and in the second direction D2.

The first interconnection lines M1_I of the first metal layer M1 may be arranged at a second pitch in the first direction D1. The second pitch may be smaller than the first pitch. A line width in the first direction D1 of each of the first interconnection lines M1_I may be smaller than a line width in the first direction D1 of each of the first to third power lines M1_R1, M1_R2, and M1_R3.

The first metal layer M1 may further include first vias VI1. The first vias VI1 may be respectively provided below the interconnection lines M1_R1, M1_R2, M1_R3, and M1_I of the first metal layer M1. The active contact AC and the interconnection line of the first metal layer M1 may be electrically connected to each other through the first via VI1. The gate contact GC and the interconnection line of the first metal layer M1 may be electrically connected to each other through the first via VI1.

The interconnection lines M1_R1, M1_R2, M1_R3, and M1_I of the first metal layer M1 and the first vias VI1 thereunder may be formed by separate processes. For example, the interconnection lines M1_R1, M1_R2, M1_R3, and M1_I and the first vias VI1 of the first metal layer M1 may be formed by respective single damascene processes. The semiconductor device according to the present embodiment may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern extending lengthwise in the first direction D1. For example, the second interconnection lines M2_I may be extended lengthwise in the first direction D1 and may be parallel to each other.

The second metal layer M2 may further include second vias VI2, which are respectively provided below the second interconnection lines M2_I. The interconnection lines of the first and second metal layers M1 and M2 may be electrically connected to each other through the second vias VI2. As an example, the interconnection lines M2_I of the second metal layer M2 and the second vias VI2 thereunder may be formed together by a dual damascene process.

The interconnection lines M1_R1, M1_R2, M1_R3, and M1_I of the first metal layer M1 may be formed of or may include a conductive material that is the same as or different from that of the interconnection lines M2_I of the second metal layer M2. For example, the interconnection lines of the first and second metal layers M1 and M2 may be formed of or may include at least one metallic material selected from the group consisting of aluminum, copper, tungsten, molybdenum, ruthenium, and cobalt. Although not shown, a plurality of metal layers (e.g., M3, M4, M5, and so forth) may be additionally stacked on the fourth interlayer insulating layer 140. Each of the stacked metal layers may include interconnection lines, which are used as routing paths between cells.

The active contact AC coupled to the first source/drain pattern SD1 will be described in more detail with reference to FIGS. 6A and 6B. The active contact AC, which is coupled to the first source/drain pattern SD1, may include a first buried portion BCP1 and a first contact portion CTP1 on the first buried portion BCP1. The first buried portion BCP1 may be a lower portion of the active contact AC provided in the first recess RS1. The first contact portion CTP1 may be a portion, which is vertically extended from the first buried portion BCP1 in the third direction D3.

The first buried portion BCP1 may be buried in the first source/drain pattern SD1. As used herein, the term "buried" may refer to structures, patterns, and/or layers that are formed at least partially below a top surface of another structure, pattern, and/or layer. In some embodiments, when a first structure, pattern, and/or layer is "buried" in a second structure, pattern, and/or layer, the second structure, pattern, and/or layer may surround at least a portion of the first structure, pattern, and/or layer. For example, a first structure, pattern, and/or layer first may be considered to be buried when it is at least partially embedded in a second structure, pattern, and/or layer.

The metal-semiconductor compound layer SC may be interposed between the first buried portion BCP1 and the first source/drain pattern SD1. The metal-semiconductor compound layer SC may be conformally formed along an interface between the first buried portion BCP1 and the first source/drain pattern SD1.

The first buried portion BCP1 may include a first expansion portion EXP1 and a first vertical extension portion VEP1, which is provided between the first expansion portion EXP1 and the first contact portion CTP1. The first vertical extension portion VEP1 may be connected to the first main layer MAL1 through the metal-semiconductor compound layer SC. The first expansion portion EXP1 may be connected to the first buffer layer BFL1 and the first main layer MAL1 through the metal-semiconductor compound layer SC.

Referring to FIG. 6A, a width of the first vertical extension portion VEP1 in the second direction D2 may not be substantially changed in the third direction D3. For example, a width W1_U of an upper portion of the first vertical extension portion VEP1 may be substantially equal to a width W1_L of a lower portion of the first vertical extension portion VEP1. The widths W1_U and W1_L may be maximum widths in the second direction D2.

The first expansion portion EXP1 may be provided in a lower portion of the first source/drain pattern SD1. A width of the first buried portion BCP1 in the second direction D2 may be abruptly increased at the first expansion portion EXP1. A width of the first expansion portion EXP1 in the second direction D2 may increase in the third direction D3. For example, a width W2_U of an upper portion of the first expansion portion EXP1 may be larger than a width W2_L of a lower portion of the first expansion portion EXP1. The widths W2_U and W2_L may be maximum widths in the second direction D2.

A change amount of the width of the first vertical extension portion VEP1 in the second direction D2 may be smaller than a change amount of the width of the first expansion portion EXP1 in the second direction D2. Here, a change amount of a width may mean a difference between a width of an upper portion and a width of a lower portion. For example, the change amount of the width of the first vertical extension portion VEP1 in the second direction D2 may be W1_U−W1_L. The change amount of the width of the first expansion portion EXP1 in the second direction D2 may be W2_U−W2_L. The difference W1_U−W1_L may be smaller than the difference W2_U−W2_L.

The width of the first buried portion BCP1 in the second direction D2 may be abruptly changed at a boundary between the first vertical extension portion VEP1 and the first expansion portion EXP1. For example, the width W2_U of the upper portion of the first expansion portion EXP1 may be 1.3 to 3 times the width W1_L of the lower portion of the first vertical extension portion VEP1. The boundary between the first vertical extension portion VEP1 and the first expansion portion EXP1 may be located at a level between a bottom surface BOS1 and a top surface TOS1 of the second semiconductor pattern SP2.

Referring to FIG. 6B, a width of the first vertical extension portion VEP1 in the first direction D1 may increase in the third direction D3. For example, a width W3_U of an upper portion of the first vertical extension portion VEP1 may be larger than a width W3_L of a lower portion of the first vertical extension portion VEP1. The widths W3_U and W3_L may be maximum widths in the first direction D1.

A change amount of the width of the first vertical extension portion VEP1 in the first direction D1 may be greater than a change amount of the width of the first vertical extension portion VEP1 in the second direction D2. For example, the change amount of the width of the first vertical extension portion VEP1 in the first direction D1 may be W3_U−W3_L. The change amount of the width W1 of the first vertical extension portion VEP1 in the second direction D2 may be W1_U−W1_L. The difference W3_U−W3_L may be larger than the difference W1_U−W1_L.

A width of the first expansion portion EXP1 in the first direction D1 may not be substantially changed in the third direction D3. For example, a width W4_U of an upper portion of the first expansion portion EXP1 may be substantially equal to a width W4_L of a lower portion of the first expansion portion EXP1. The widths W4_U and W4_L may be maximum widths in the first direction D1.

A change amount of the width of the first expansion portion EXP1 in the first direction D1 may be smaller than the change amount of the width of the first expansion portion EXP1 in the second direction D2. For example, the change amount of the width of the first expansion portion EXP1 in the first direction D1 may be W4_U−W4_L. The change amount of the width of the first expansion portion EXP1 in the second direction D2 may be W2_U−W2_L. The difference W4_U−W4_L may be smaller than the difference W2_U−W2_L.

The change amount of the width of the first vertical extension portion VEP1 in the first direction D1 may be smaller than the change amount of the width of the first expansion portion EXP1 in the second direction D2. For example, the difference W3_U−W3_L may be smaller than the difference W2_U−W2_L.

The first source/drain pattern SD1 may have the largest width in the first direction D1 at a first level LV1. The first expansion portion EXP1 may be extended to a region lower than the first level LV1 and may be in contact with the metal-semiconductor compound layer SC on the first buffer layer BFL1. The metal-semiconductor compound layer SC may be provided between the first expansion portion EXP1 and the first buffer layer BFL1, and the first expansion portion EXP1 may be connected to the first buffer layer BFL1 through the metal-semiconductor compound layer SC. For example, the active contact AC may be deeply inserted into and coupled to the first source/drain pattern SD1 through the first expansion portion EXP1.

Due to the first buried portion BCP1 of the active contact AC, a contact area between the first source/drain pattern SD1 and the active contact AC may be increased. In particular, the widths, in the first and second directions D1 and D2, of the first expansion portion EXP1 and the first vertical extension portion VEP1 may vary in an opposite manner, and in this case, the first buried portion BCP1 may have a structure capable of securing a larger contact area with the first source/drain pattern SD1.

According to an example embodiment of the inventive concept, a contact area between the active contact AC and the first source/drain pattern SD1 may be increased, due to the afore-described structure of the first buried portion BCP1 of the active contact AC. Accordingly, an electric resistance between the active contact AC and the first source/drain pattern SD1 may be reduced. In addition, since the first buried portion BCP1 is selectively formed in only the first source/drain pattern SD1, a size of the first contact portion CTP1 of the active contact AC may not be changed. Thus, it may be possible to prevent an increase in parasitic capacitance between the active contact AC and a conductor (e.g., the gate electrode GE) adjacent thereto. As a result, according to an example embodiment of the inventive concept, an operation speed and electric characteristics of a semiconductor device may be improved.

The active contact AC coupled to the second source/drain pattern SD2 will be described in more detail with reference to FIGS. 7A and 7B. The active contact AC, which is coupled to the second source/drain pattern SD2, may include the second buried portion BCP2 and a second contact portion CTP2 on the second buried portion BCP2. The second buried portion BCP2 may be a lower portion of the active contact AC provided in the second recess RS2. The second contact portion CTP2 may be a portion, which is vertically extended from the second buried portion BCP2 vertically (e.g., in the third direction D3).

The second buried portion BCP2 may be buried in the second source/drain pattern SD2. The metal-semiconductor compound layer SC may be interposed between the second buried portion BCP2 and the second source/drain pattern SD2. The metal-semiconductor compound layer SC may be conformally formed along an interface between the second buried portion BCP2 and the second source/drain pattern SD2.

The second buried portion BCP2 may include a second expansion portion EXP2 and a second vertical extension portion VEP2, which is provided between the second expansion portion EXP2 and the second contact portion CTP2. The second vertical extension portion VEP2 may be connected to the second main layer MAL2 through the metal-semiconductor compound layer SC. The second expansion portion EXP2 may be connected to the second buffer layer BFL2 and the second main layer MAL2 through the metal-semiconductor compound layer SC.

Referring to FIG. 7A, a width of the second vertical extension portion VEP2 in the second direction D2 may not be substantially changed in the third direction D3. For example, a width W5_U of an upper portion of the second vertical extension portion VEP2 may be substantially equal to a width W5_L of a lower portion of the second vertical extension portion VEP2. The widths W5_U and W5_L may be maximum widths in the second direction D2.

The second expansion portion EXP2 may be provided in a lower portion of the second source/drain pattern SD2. A width of the second buried portion BCP2 in the second direction D2 may be abruptly increased at the second expansion portion EXP2. A width of the second expansion portion EXP2 in the second direction D2 may increase in the third direction D3. For example, a width W6_U of an upper portion of the second expansion portion EXP2 may be larger than a width W6_L of a lower portion of the second expansion portion EXP2. The widths W6_U and W6_L may be maximum widths in the second direction D2.

The largest width (e.g., W6_U) of the second expansion portion EXP2 in the second direction D2 may be smaller than the largest width (e.g., W2_U) of the first expansion portion EXP1 in the second direction D2 of FIG. 6A. For example, a size of the second buried portion BCP2 of FIG. 7A may be smaller than a size of the first buried portion BCP1 of FIG. 6A.

A change amount of the width of the second vertical extension portion VEP2 in the second direction D2 may be smaller than a change amount of the width of the second expansion portion EXP2 in the second direction D2. For example, the change amount of the width of the second vertical extension portion VEP2 in the second direction D2 may be W5_U−W5_L. The change amount of the width of the second expansion portion EXP2 in the second direction D2 may be W6_U−W6_L. The difference W5_U−W5_L may be smaller than the difference W6_U−W6_L.

The width of the second buried portion BCP2 in the second direction D2 may be abruptly changed near a boundary between the second vertical extension portion VEP2 and the second expansion portion EXP2. For example, the width W6_U of the upper portion of the second expansion portion EXP2 may be 1.3 to 3 times the width W5_L of the lower portion of the second vertical extension portion VEP2. The boundary between the second vertical extension portion VEP2 and the second expansion portion EXP2 may be located at a level between a bottom surface BOS2 and a top surface TOS2 of the second semiconductor pattern SP2.

Referring to FIG. 7B, a width of the second expansion portion EXP2 in the first direction D1 may not be substantially changed in the third direction D3. For example, a width W7_U of an upper portion of the second expansion portion EXP2 may be substantially equal to a width W7_L of a lower portion of the second expansion portion EXP2. The widths W7_U and W7_L may be maximum widths in the first direction D1.

A change amount of the width of the second expansion portion EXP2 in the first direction D1 may be smaller than the change amount of the width of the second expansion portion EXP2 in the second direction D2. For example, the change amount of the width of the second expansion portion EXP2 in the first direction D1 may be W7_U−W7_L. The change amount of the width of the second expansion portion EXP2 in the second direction D2 may be W6_U−W6_L. The difference W7_U−W7_L may be smaller than the difference W6_U−W6_L.

In the case where, although not shown, the active contact AC of FIG. 7B has a structure that is connected to only the second source/drain pattern SD2 (e.g., see FIG. 6B), a change amount of a width of the second vertical extension portion VEP2 in the first direction D1 may be greater than a change amount of the width of the second vertical extension portion VEP2 in the second direction D2.

The second expansion portion EXP2 may be extended downwardly from the second vertical extension portion VEP2 and may reach the first buffer layer BFL1. For example, the active contact AC may be deeply extended into and coupled to the second source/drain pattern SD2 through the second expansion portion EXP2.

Due to the second buried portion BCP2 of the active contact AC, a contact area between the second source/drain pattern SD2 and the active contact AC may be increased. Thus, according to an example embodiment of the inventive concept, an electric resistance between the second source/drain pattern SD2 and the active contact AC may be reduced, as previously described with reference to FIGS. 6A and 6B, and thus, the electric characteristics of the semiconductor device may be improved.

FIGS. 9A to 16D are sectional views illustrating a method of fabricating a semiconductor device according to an example embodiment of the inventive concept. In detail, FIGS. 9A, 10A, 11A, 12A, 13A, 14A, 15A, and 16A are sectional views taken along the line A-A' of FIG. 4. FIGS. 11B, 12B, 13B, 14B, 15B, and 16B are sectional views taken along the line B-B' of FIG. 4. FIGS. 11C, 12C, 13C, 14C, 15C, and 16C are sectional views taken along the line C-C' of FIG. 4. FIGS. 9B, 10B, 11D, 12D, 13D, 14D, 15D, and 16D are sectional views taken along the line D-D' of FIG. 4.

Figure 9A:
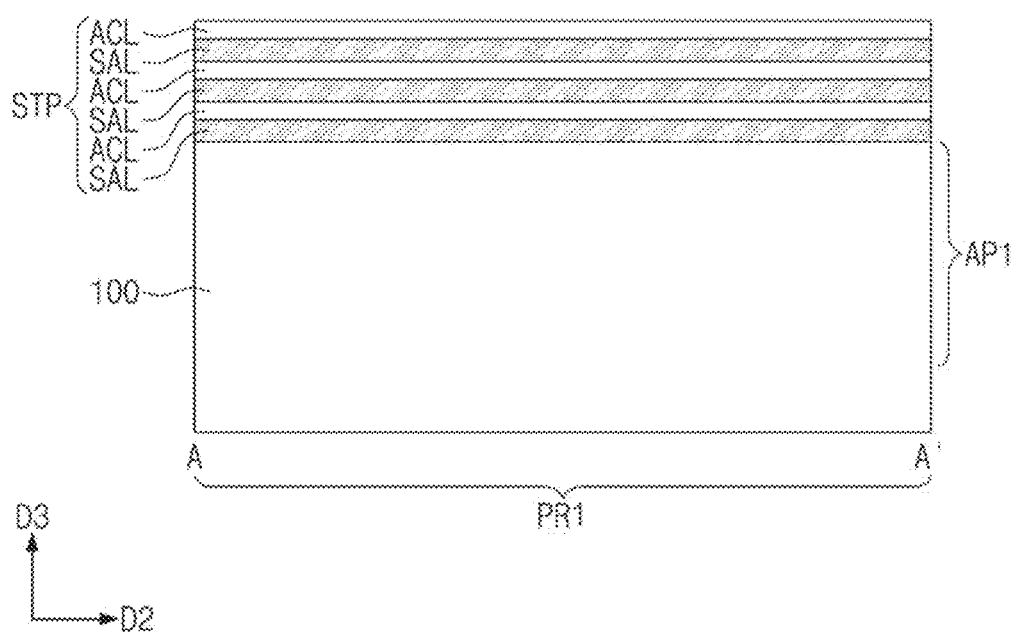
FIGS. 9A to 16D are sectional views illustrating a method of fabricating a semiconductor device, according to an example embodiment of the inventive concept.
Figure 9B:
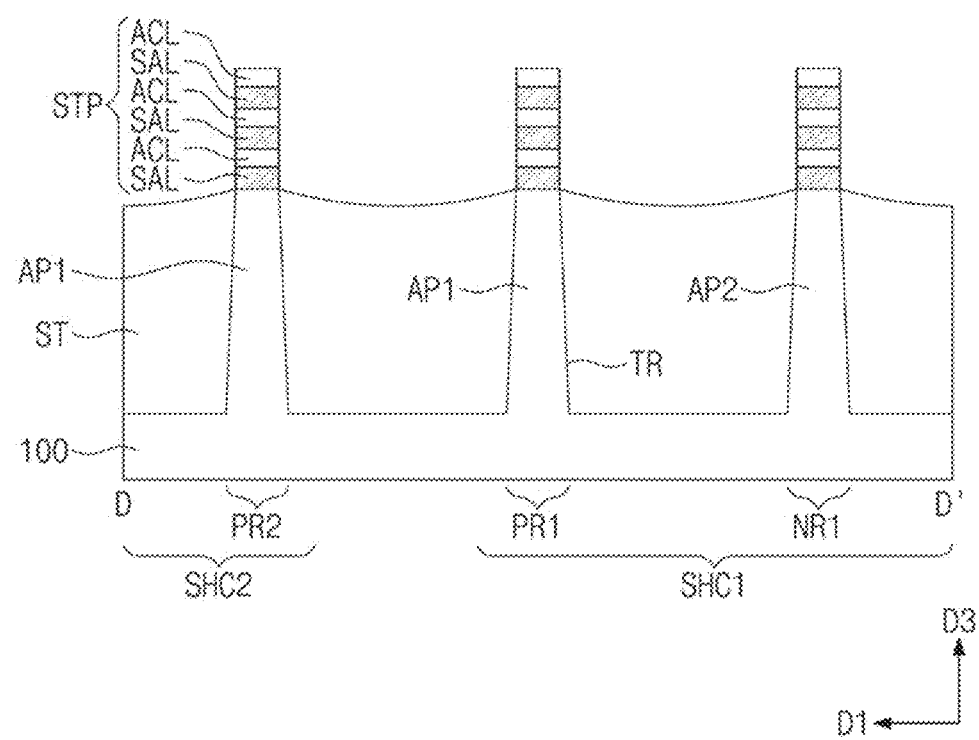

Referring to FIGS. 9A and 9B, the substrate 100 including the first and second PMOSFET regions PR1 and PR2 and the first and second NMOSFET regions NR1 and NR2 may be provided. First semiconductor layers ACL and the second semiconductor layers SAL, which are alternately stacked on the substrate 100, may be formed. Each of the first and second semiconductor layers ACL and SAL may be formed of or may include at least one of silicon (Si), germanium (Ge), and silicon-germanium (SiGe), and in an embodiment, the materials of the first and second semiconductor layers may be different from each other.

The second semiconductor layer SAL may be formed of or may include a material that is chosen to have an etch selectivity with respect to the first semiconductor layer ACL. For example, the first semiconductor layers ACL may be formed of or may include silicon (Si), and the second semiconductor layers SAL may be formed of or may include silicon-germanium (SiGe). A concentration of germanium (Ge) of each of the second semiconductor layers SAL may range from 10 at % to 30 at %.

Mask patterns may be respectively formed on the first and second PMOSFET regions PR1 and PR2 and the first and second NMOSFET regions NR1 and NR2 of the substrate 100. The mask pattern may be a line- or bar-shaped pattern extending lengthwise in a second direction D2.

A patterning process, in which the mask patterns are used as an etch mask, may be performed to form the trench TR defining the first active pattern AP1 and the second active pattern AP2. The first active pattern AP1 may be formed on each of the first and second PMOSFET regions PR1 and PR2. The second active pattern AP2 may be formed on each of the first and second NMOSFET regions NR1 and NR2.

A stacking pattern STP may be formed on each of the first and second active patterns AP1 and AP2. The stacking pattern STP may include the first semiconductor layers ACL and the second semiconductor layers SAL, which are alternately stacked. The stacking pattern STP may be formed along with, during the patterning process.

The device isolation layer ST may be formed to fill the trench TR. In detail, an insulating layer may be formed on the substrate 100 to cover the first and second active patterns AP1 and AP2 and the stacking patterns STP. The device isolation layer ST may be formed by recessing the insulating layer until the stacking patterns STP are exposed.

The device isolation layer ST may be formed of or may include an insulating material (e.g., silicon oxide). The stacking patterns STP may be exposed to the outside of the device isolation layer ST and may protrude above the device isolation layer ST. For example, the stacking patterns STP may protrude vertically above the device isolation layer ST.

Figure 10A:
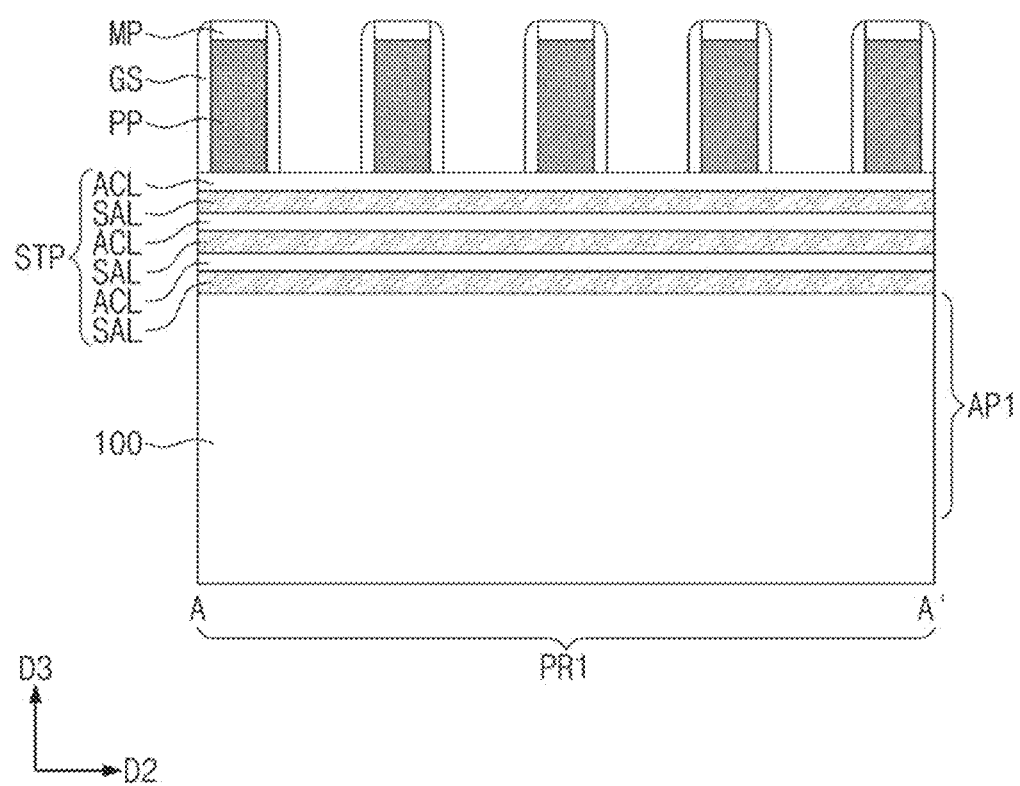
Figure 10B:
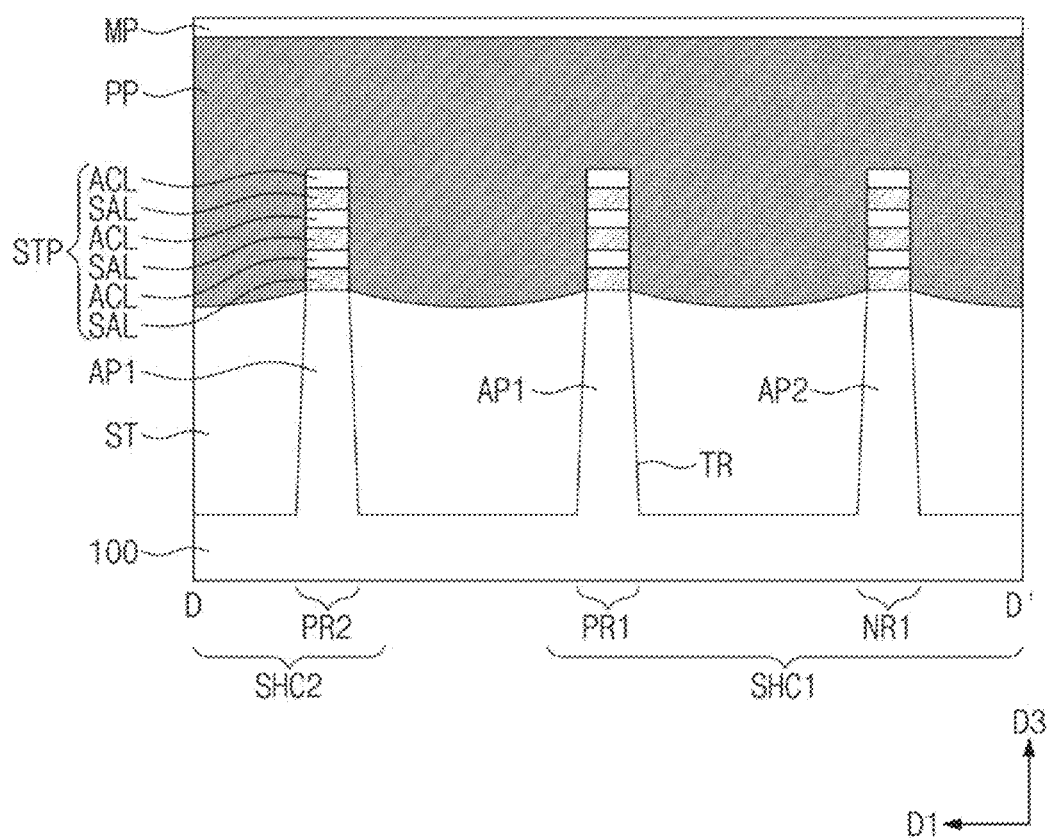
Figure 11A:
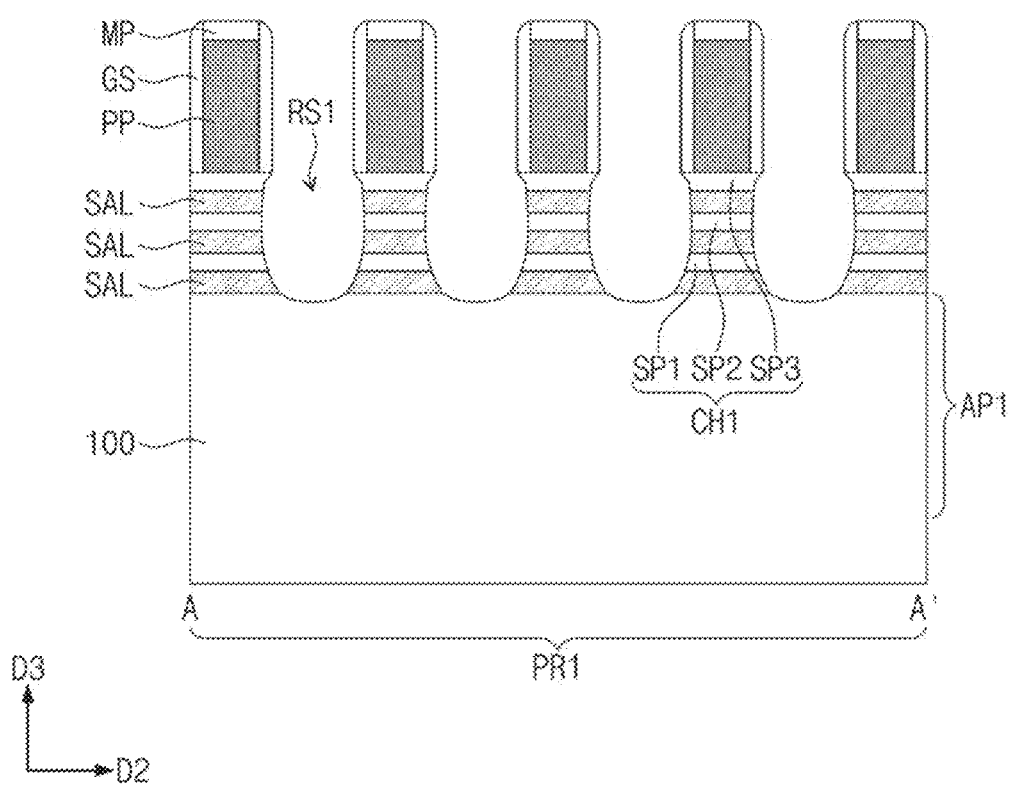
Figure 11B:
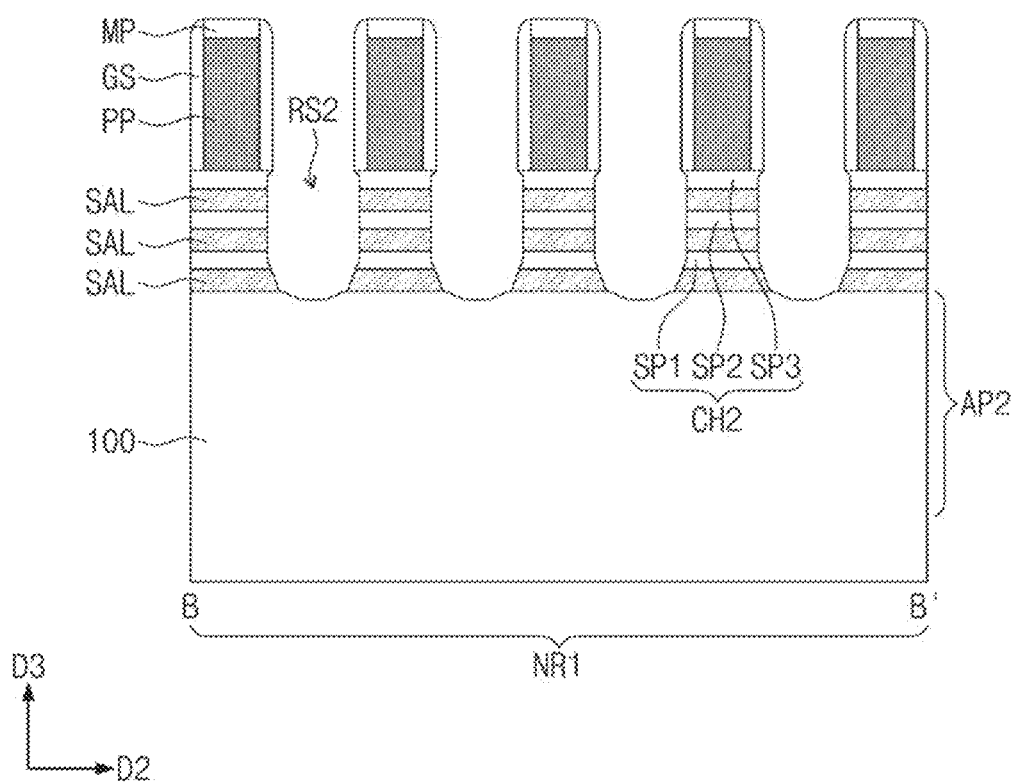
Figure 11C:
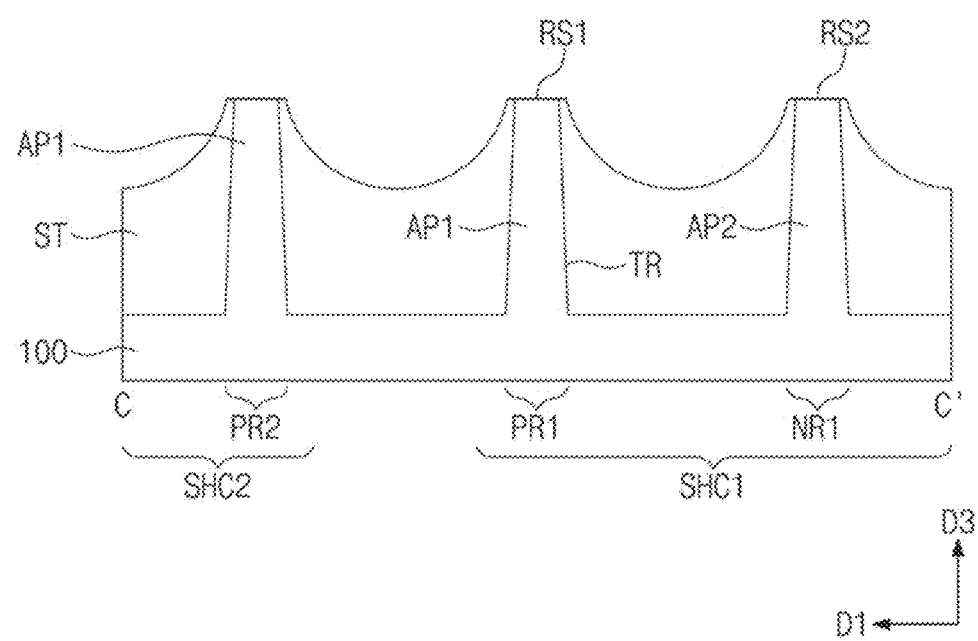
Figure 11D:
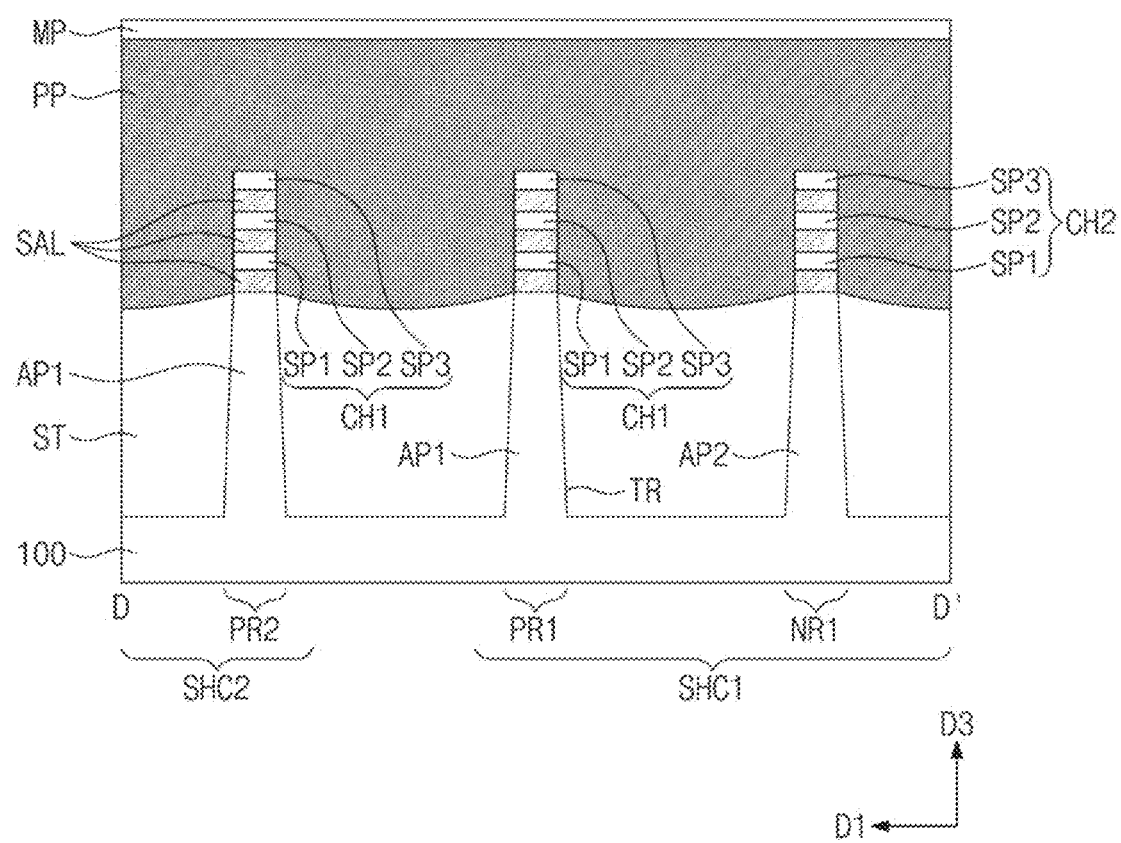

Referring to FIGS. 10A and 10B, sacrificial patterns PP may be formed on the substrate 100 to cross the stacking patterns STP. Each of the sacrificial patterns PP may be a line- or bar-shaped pattern extending lengthwise in the first direction D1. The sacrificial patterns PP may be arranged at the first pitch in the second direction D2.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of or may include polysilicon.

A pair of the gate spacers GS may be formed on opposite side surfaces of each of the sacrificial patterns PP. The formation of the gate spacers GS may include conformally forming a gate spacer layer on the substrate 100 and anisotropically etching the gate spacer layer. The gate spacer layer may be formed of or may include at least one of SiCN, SiCON, or SiN. Alternatively, the gate spacer layer may be a multi-layered structure including at least two of SiCN, SiCON, or SiN.

Referring to FIGS. 11A to 11D, the first recesses RS1 may be formed in the stacking pattern STP on the first active pattern AP1. The second recesses RS2 may be formed in the stacking pattern STP on the second active pattern AP2. During the formation of the first and second recesses RS1 and RS2, the device isolation layer ST may be further recessed at both sides of each of the first and second active patterns AP1 and AP2 (e.g., see FIG. 11C).

In detail, the first recesses RS1 may be formed by etching the stacking pattern STP on the first active pattern AP1 using hard mask patterns MA and the gate spacers GS as an etch mask. The first recess RS1 may be formed between a pair of the sacrificial patterns PP. The second recesses RS2 in the stacking pattern STP on the second active pattern AP2 may be formed by the same method as that for the first recesses RS1.

The first to third semiconductor patterns SP1, SP2, and SP3, which are sequentially stacked between adjacent ones of the first recesses RS1, may be formed from the first semiconductor layers ACL, respectively. The first to third semiconductor patterns SP1, SP2, and SP3, which are sequentially stacked between adjacent ones of the second recesses RS2, may be formed from the first semiconductor layers ACL, respectively. The first to third semiconductor patterns SP1, SP2, and SP3 between adjacent ones of the first recesses RS1 may constitute the first channel pattern CH1. The first to third semiconductor patterns SP1, SP2, and SP3 between adjacent ones of the second recesses RS2 may constitute the second channel pattern CH2.

Referring to FIGS. 12A to 12D, the first source/drain patterns SD1 may be formed in the first recesses RS1, respectively. In detail, the first buffer layer BFL1 may be formed by performing a first SEG process, in which the inner side surface of the first recess RS1 is used as a seed layer. The first buffer layer BFL1 may be grown using the first to third semiconductor patterns SP1, SP2, and SP3 and the substrate 100, which are exposed by the first recess RS1, as the seed layer. In an embodiment, the first SEG process may include a chemical vapor deposition (CVD) process or a molecular beam epitaxy (MBE) process.

The first buffer layer BFL1 may be formed of or may include a semiconductor material (e.g., SiGe) whose lattice constant is larger than that of the substrate 100. The first buffer layer BFL1 may contain a relatively low concentration of germanium (Ge). Alternatively, the first buffer layer BFL1 may contain only silicon (Si) without germanium (Ge). A concentration of the germanium (Ge) in the first buffer layer BFL1 may range from 0 at % to 10 at %.

The first sacrificial layer SFL1 may be formed by performing a second SEG process on the first buffer layer BFL1. By adjusting a process condition of the second SEG process, it may be possible to increase a growth rate of the first sacrificial layer SFL1 in a <001> direction (i.e., the third direction D3). Accordingly, the first sacrificial layer SFL1 may be formed to partially fill the first recess RS1 in an upward direction. The first sacrificial layer SFL1 may be vertically grown from a bottom portion of the first buffer layer BFL1 (e.g., see FIG. 12C).

The first sacrificial layer SFL1 may include the first etch enhancement element. The first etch enhancement element may be at least one selected from the group consisting of germanium (Ge), boron (B), phosphorus (P), gallium (Ga), antimony (Sb), arsenic (As), carbon (C), indium (In), tin (Sn), fluorine (F), nitrogen (N), yttrium (Y), and oxygen (O). The first etch enhancement element may be one of elements allowing the first sacrificial layer SFL1 to have a high etch selectivity with respect to the first buffer layer BFL1 and the first main layer MAL1.

In an embodiment, the first etch enhancement element may be germanium (Ge), and in this case, to increase an etch selectivity with respect to the first buffer layer BFL1 and the first main layer MAL1, the first sacrificial layer SFL1 may contain a high concentration of germanium (Ge). As an example, the first sacrificial layer SFL1 may contain silicon-germanium (SiGe) or germanium (Ge) but not silicon, and a concentration of germanium (Ge) of the first sacrificial layer SFL1 may range from 70 at % to 100 at %.

In an embodiment, the first etch enhancement element may be silicon (Si), and to increase an etch selectivity with respect to the first buffer layer BFL1 and the first main layer MAL1, the first sacrificial layer SFL1 may contain a high concentration of silicon (Si). As an example, the first sacrificial layer SFL1 may contain silicon-germanium (SiGe) or silicon (Si) but not germanium, and a concentration of germanium (Ge) of the first main layer MAL1 may range from 80 at % to 100 at %.

The first main layer MAL1 may be formed by performing a third SEG process on the first sacrificial layer SFL1. The first main layer MAL1 may be formed to fully or almost fully fill the first recess RS1. The first main layer MAL1 may contain a relatively high concentration of germanium (Ge). As an example, a concentration of germanium (Ge) of the first main layer MAL1 may range from 30 at % to 70 at %.

The first capping layer CAL1 may be formed by performing a fourth SEG process on the first main layer MAL1. The first capping layer CAL1 may be formed to conformally cover an exposed surface of the first main layer MAL1. The first capping layer CAL1 may contain silicon (Si), and in an embodiment, a concentration of the silicon (Si) of the first capping layer CAL1 may range from 98 at % to 100 at %.

The first source/drain pattern SD1 may be doped in-situ with impurities (e.g., boron, gallium, or indium) during the formation of the first buffer layer BFL1 and the first main layer MAL1, and in this case, the first source/drain pattern SD1 may have a p-type. Alternatively, after the formation of the first source/drain pattern SD1, impurities may be injected into the first source/drain pattern SD1.

The second source/drain patterns SD2 may be formed in the second recesses RS2, respectively. In detail, the second source/drain pattern SD2 may be formed by performing a selective epitaxial growth (SEG) process using an inner side surface of the second recess RS2 as a seed layer. As an example, the second source/drain pattern SD2 may include the same semiconductor element (e.g., Si) as the substrate 100.

The formation of the second source/drain pattern SD2 may include forming the second buffer layer BFL2, the second sacrificial layer SFL2, the second main layer MAL2, and the second capping layer CAL2 in the second recess RS2. The second buffer layer BFL2, the second sacrificial layer SFL2, the second main layer MAL2, and the second capping layer CAL2 may be formed in a manner similar to the first buffer layer BFL1, the first sacrificial layer SFL1, the first main layer MAL1, and the first capping layer CAL1 described above.

The second sacrificial layer SFL2 may be formed of or may include the second etch enhancement element. The second etch enhancement element may be at least one selected from the group consisting of germanium (Ge), boron (B), phosphorus (P), gallium (Ga), antimony (Sb), arsenic (As), carbon (C), indium (In), tin (Sn), fluorine (F), nitrogen (N), yttrium (Y), and oxygen (O). The second etch enhancement element may be an element allowing the second sacrificial layer SFL2 to have a high etch selectivity with respect to the second buffer layer BFL2 and the second main layer MAL2.

In an embodiment, the second etch enhancement element may be germanium (Ge), and here, to increase an etch selectivity with respect to the second buffer layer BFL2 and the second main layer MAL2, the second sacrificial layer SFL2 may further contain germanium (Ge). As an example, the second sacrificial layer SFL2 may contain silicon-germanium (SiGe) or germanium (Ge) but not silicon (Si), and a concentration of germanium (Ge) of the second sacrificial layer SFL2 may range from 5 at % to 100 at %.

Since the second buffer layer BFL2 and the second main layer MAL2 contain only silicon (Si), except germanium (Ge), as its semiconductor material, the second sacrificial layer SFL2, unlike the first sacrificial layer SFL1, may have a high etch selectivity with respect to the second buffer layer BFL2 and the second main layer MAL2, even when it contains only a low concentration of germanium (Ge).

The second source/drain pattern SD2 may be doped in-situ with impurities (e.g., phosphorus, arsenic, or antimony) during the formation of the second buffer layer BFL2 and the second main layer MAL2, and in this case, the second source/drain pattern SD2 may have an n-type. Alternatively, impurities may be injected into the second source/drain pattern SD2, after the formation of the second source/drain pattern SD2.

In an embodiment, before the formation of the second source/drain pattern SD2, the inner spacer IP may be formed by replacing a portion of the second semiconductor layer SAL, which is exposed by the second recess RS2, with an insulating material. As a result, the inner spacers IP may be respectively formed between the second source/drain pattern SD2 and the second semiconductor layers SAL.

Referring to FIGS. 13A to 13D, the first interlayer insulating layer 110 may be formed to cover the first and second source/drain patterns SD1 and SD2, the hard mask patterns MP, and the gate spacers GS. As an example, the first interlayer insulating layer 110 may be formed of or may include silicon oxide.

The first interlayer insulating layer 110 may be planarized until top surfaces of the sacrificial patterns PP are exposed. The planarization of the first interlayer insulating layer 110 may be performed using an etch-back or chemical mechanical polishing (CMP) process. During the planarization process, all of the hard mask patterns may be removed. As a result, a top surface of the first interlayer insulating layer 110 may be coplanar with the top surfaces of the sacrificial patterns PP and the top surfaces of the gate spacers GS.

A photolithography process may be performed to selectively open a region of the sacrificial pattern PP. For example, a region of the sacrificial pattern PP on the third and fourth borders BD3 and BD4 of the first single height cell SHC1 may be selectively opened. The opened region of the sacrificial pattern PP may be selectively etched and removed. The gate cutting patterns CT may be formed by filling a space, which is formed by removing the sacrificial pattern PP, with an insulating material.

Referring to FIGS. 14A to 14D, the exposed sacrificial patterns PP may be selectively removed. As a result of the removal of the sacrificial patterns PP, an outer region ORG exposing the first and second channel patterns CH1 and CH2 may be formed (e.g., see FIG. 14D). The removal of the sacrificial patterns PP may include a wet etching process, in which an etching solution capable of selectively etching polysilicon is used.

Figure 14A:
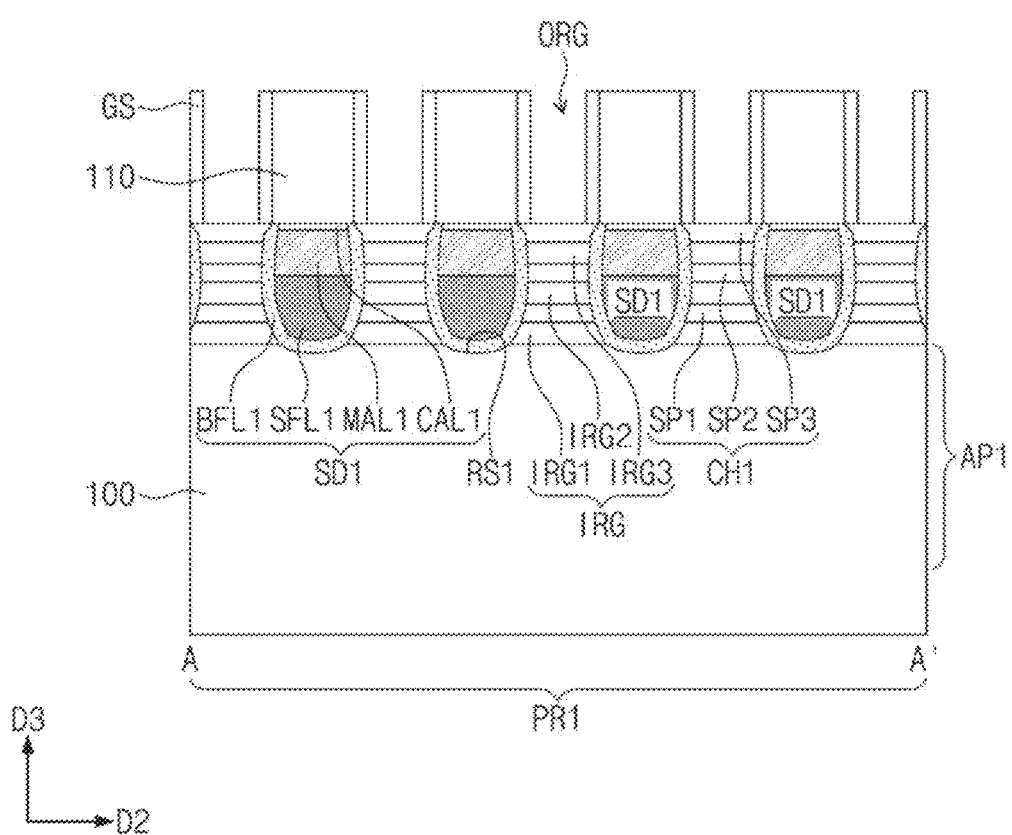
Figure 14B:
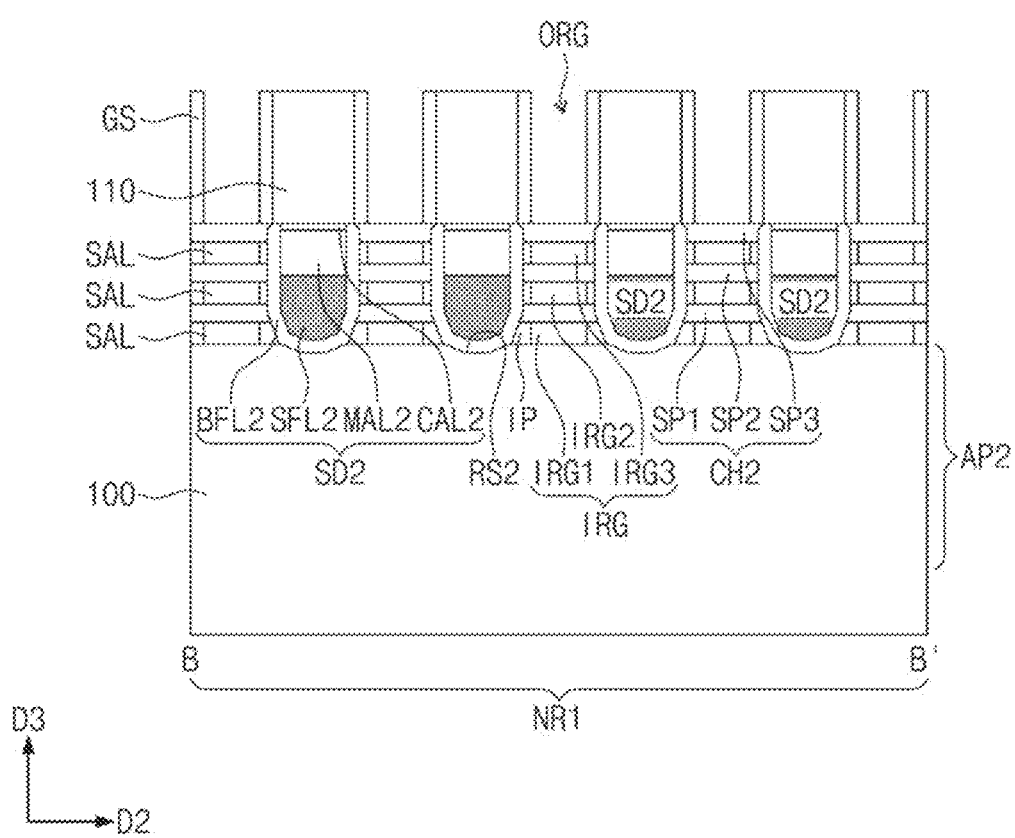
Figure 14C:
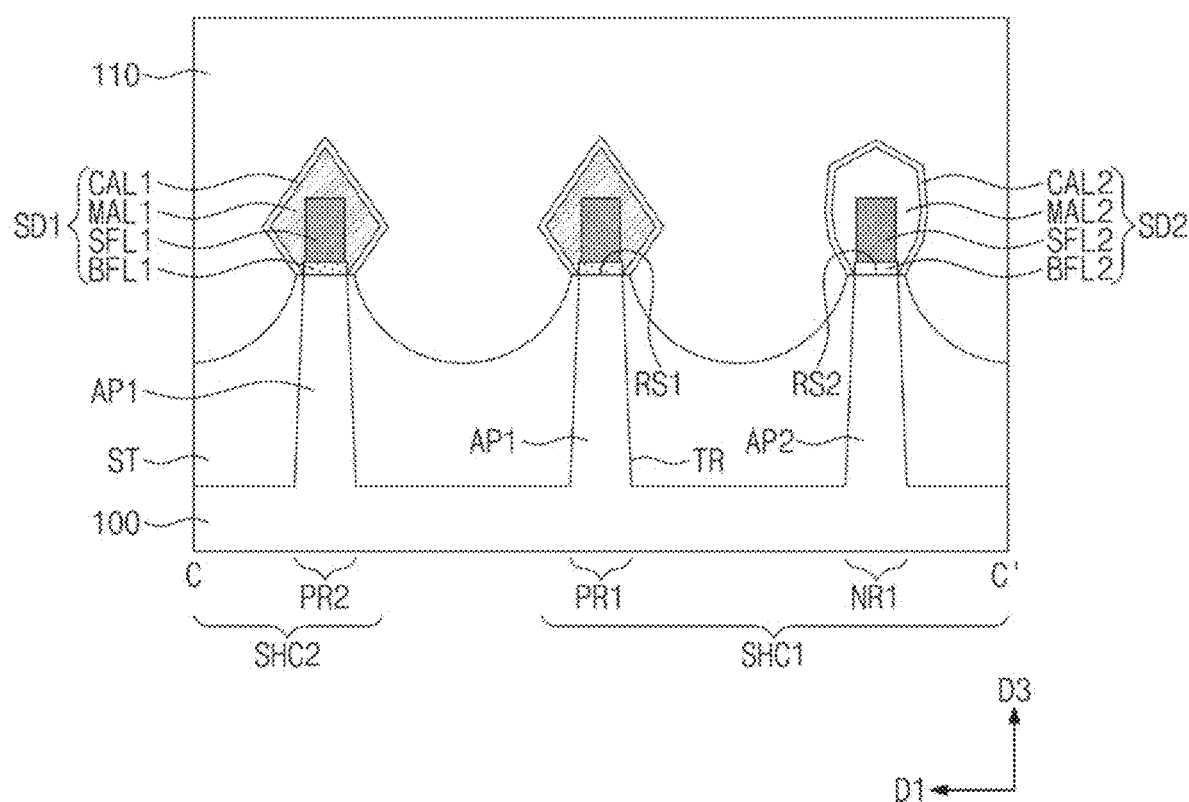
Figure 14D:
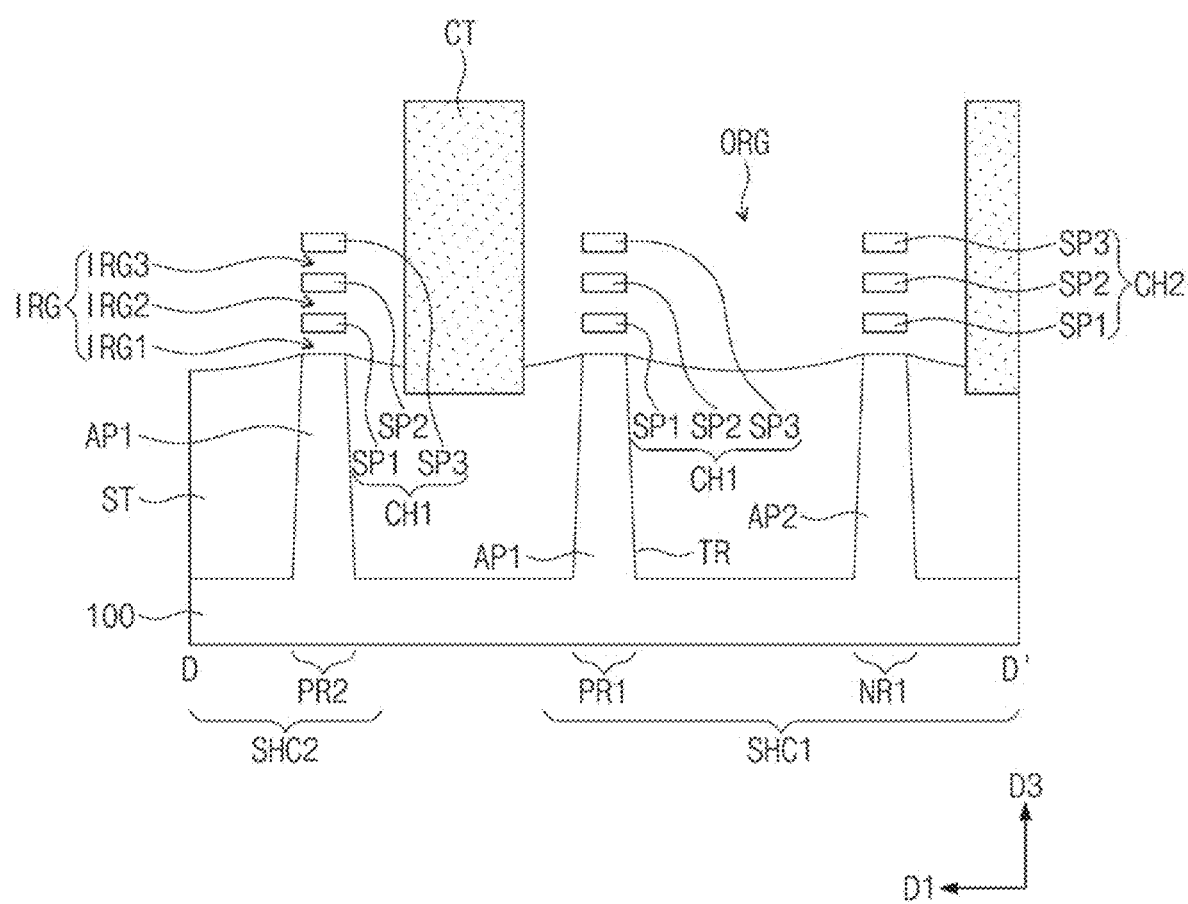
Figure 15A:
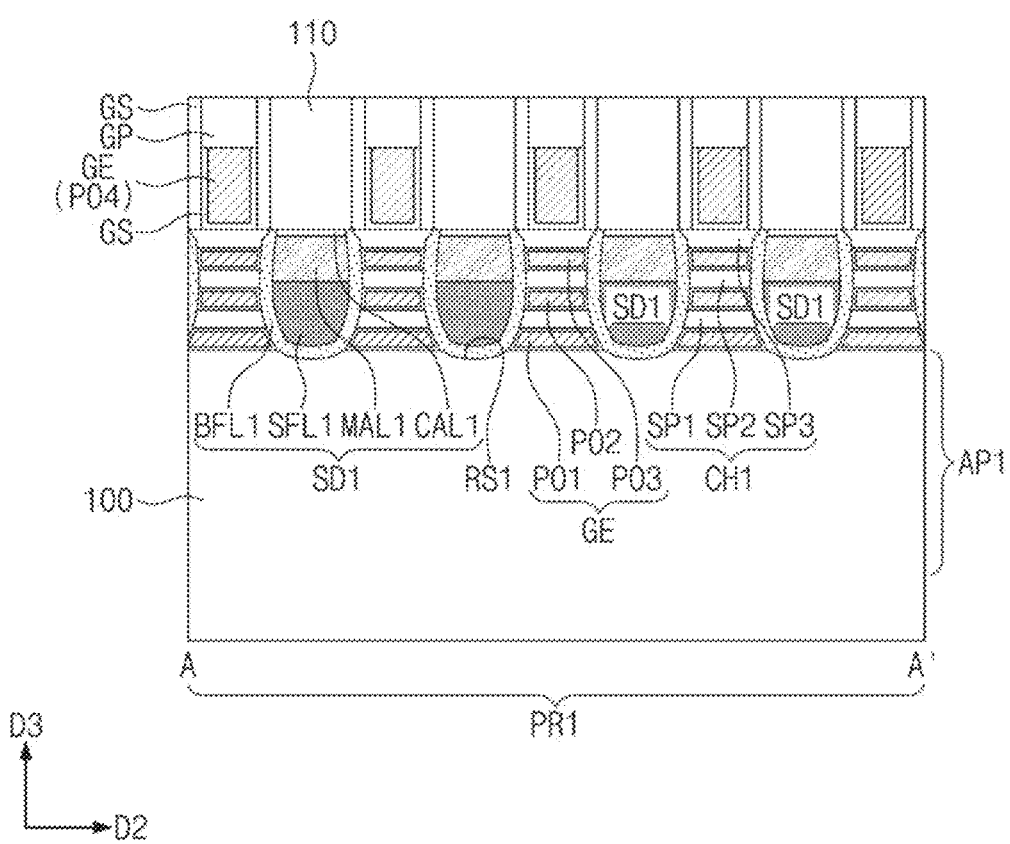
Figure 15B:
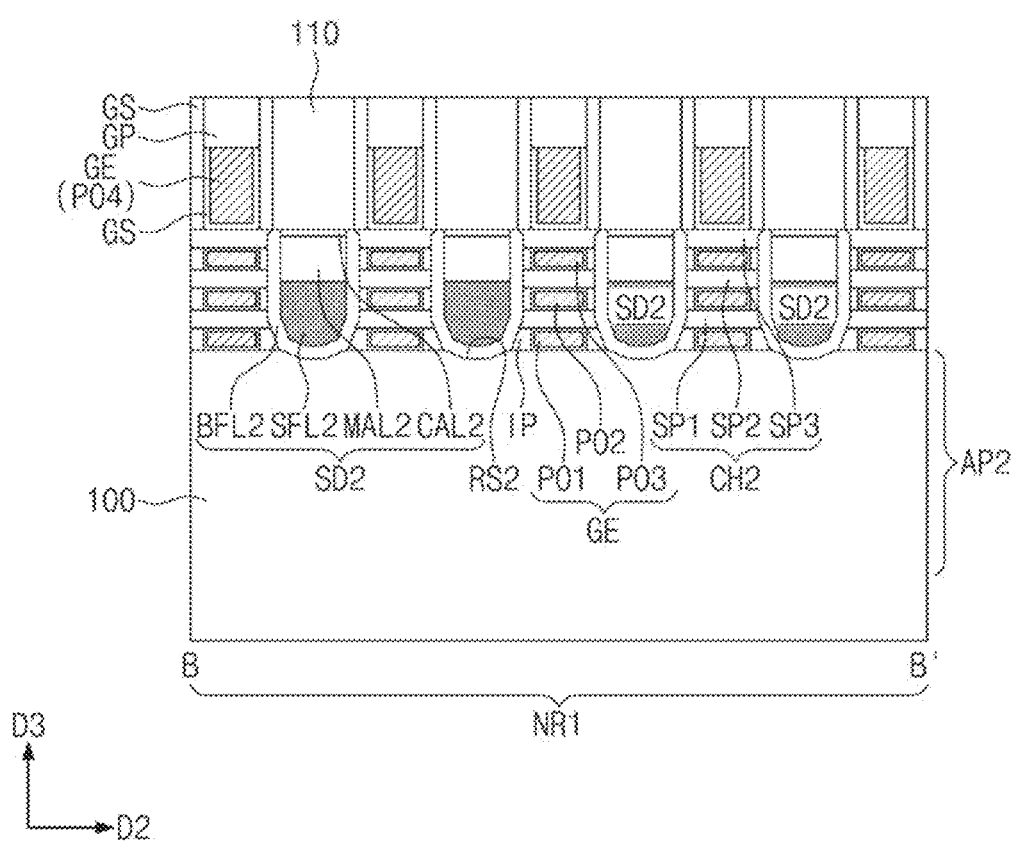
Figure 15C:
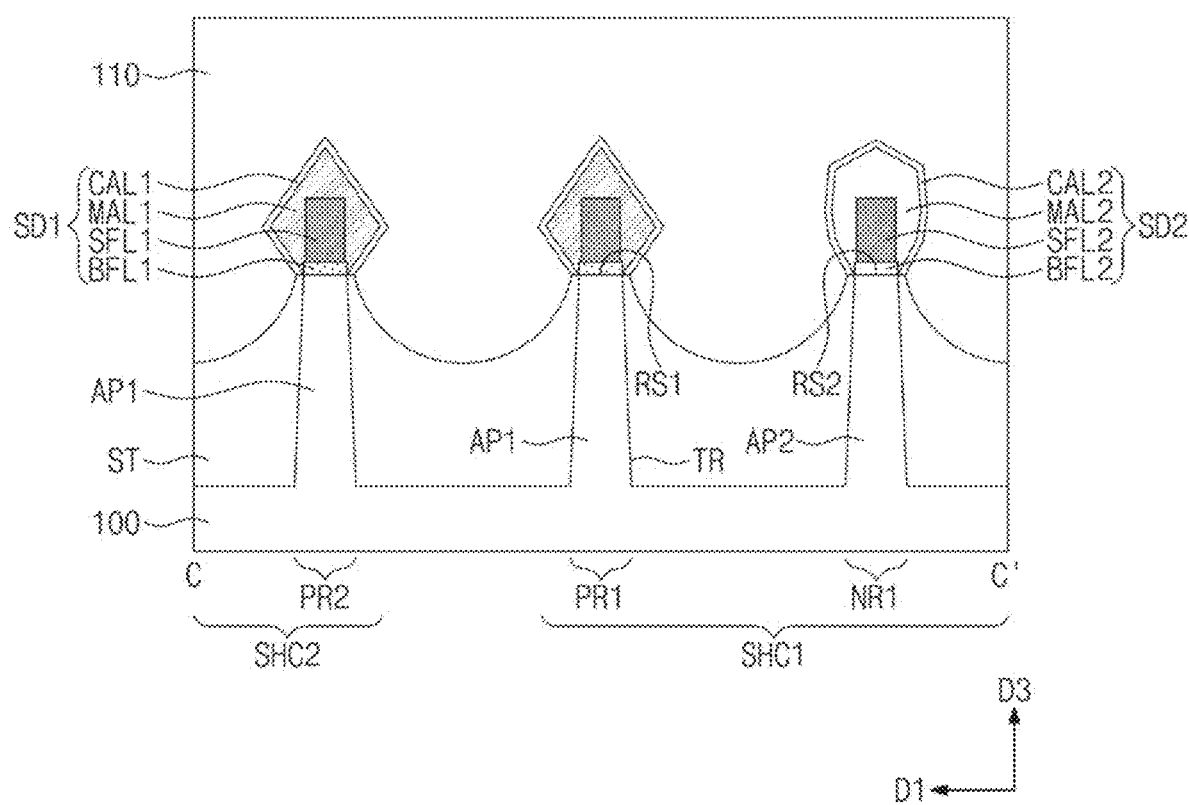
Figure 15D:
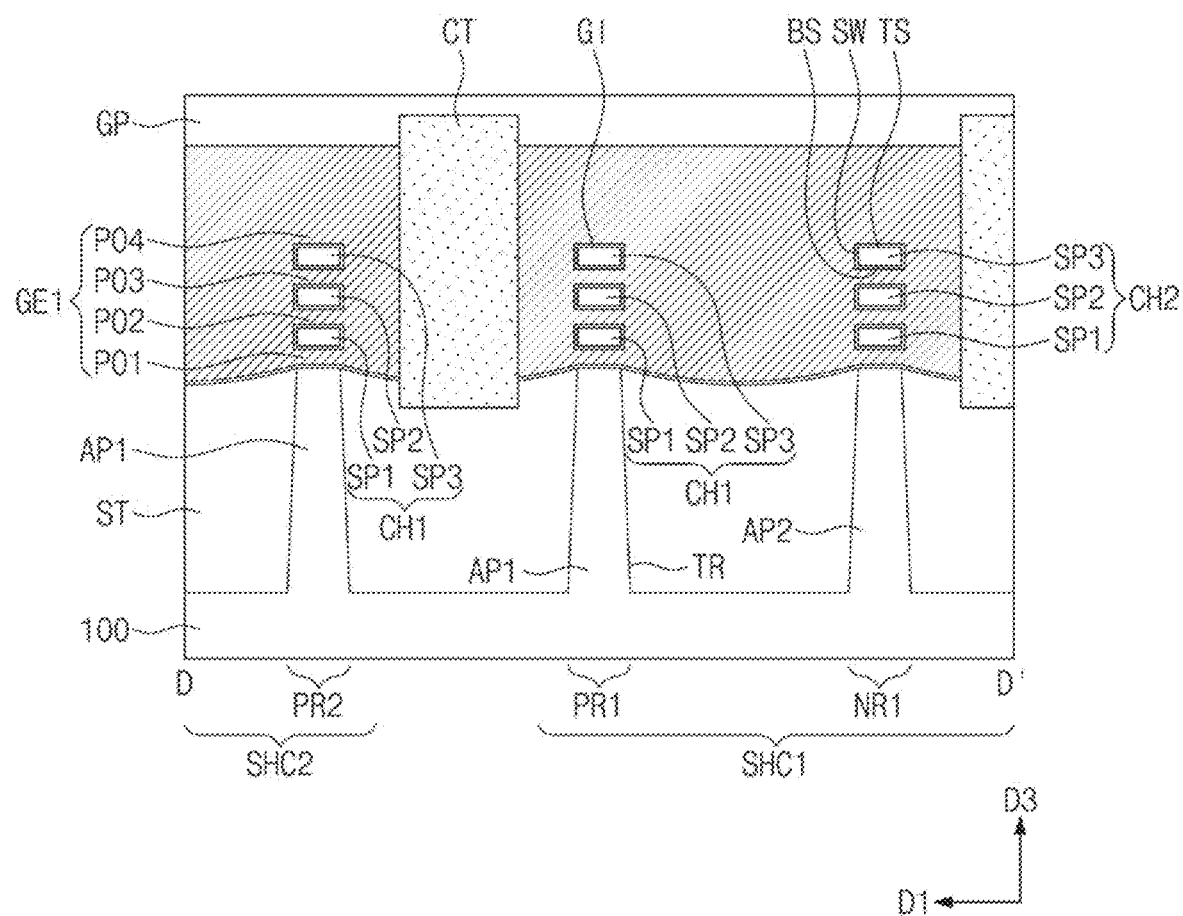

The second semiconductor layers SAL exposed through the outer region ORG may be removed to form inner regions IRG (e.g., see FIG. 14D). In detail, an etching process of selectively etching the second semiconductor layers SAL may be performed to leave the first to third semiconductor patterns SP1, SP2, and SP3 and to remove only the second semiconductor layers SAL. The etching process may be performed to have a high etch rate for a silicon-germanium layer having a relatively high germanium concentration. For example, a silicon-germanium layer whose germanium concentration is higher than 10 at % may be etched at a high etch rate by the etching process.

During the etching process, the second semiconductor layers SAL on the first and second PMOSFET regions PR1 and PR2 and the first and second NMOSFET regions NR1 and NR2 may be removed. The etching process may be a wet etching process. An etchant material, which is used in the etching process, may be chosen to quickly remove the second semiconductor layer SAL having a relatively high germanium concentration. Meanwhile, during the etching process, the first source/drain pattern SD1 on the first and second PMOSFET regions PR1 and PR2 may be protected by the first buffer layer BFL1 having a relatively low germanium concentration.

Referring back to FIG. 14D, the first to third semiconductor patterns SP1, SP2, and SP3, which are stacked on each of the first and second active patterns AP1 and AP2, may be left, as the selective removal of the second semiconductor layers SAL. Empty regions, which are formed by removing the second semiconductor layers SAL, may form first to third inner regions IRG1, IRG2, and IRG3, respectively.

In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 15A to 15D, the gate insulating layer GI may be conformally formed on the exposed first to third semiconductor patterns SP1, SP2, and SP3. The gate electrode GE may be formed on the gate insulating layer GI. The gate electrode GE may include the first to third portions PO1, PO2, and PO3, which are respectively formed in the first to third inner regions IRG1, IRG2, and IRG3, and the fourth portion PO4, which is formed in the outer region ORG.

The gate electrode GE may be recessed and may have a reduced height. Upper portions of gate cutting patterns CT may be slightly recessed, during the recessing of the gate electrode GE. The gate capping pattern GP may be formed on the recessed gate electrode GE.

Referring to FIGS. 16A to 16D, the second interlayer insulating layer 120 may be formed on the first interlayer insulating layer 110. The second interlayer insulating layer 120 may be formed of or may include silicon oxide. The active contacts AC may be formed to penetrate the second interlayer insulating layer 120 and the first interlayer insulating layer 110, and to be electrically connected to the first and second source/drain patterns SD1 and SD2. The gate contact GC may be formed to penetrate the second interlayer insulating layer 120 and the gate capping pattern GP, and to be electrically connected to the gate electrode GE. The upper insulating pattern UIP may be formed to fill an upper portion of the active contact AC adjacent to the gate contact GC.

Figure 16A:
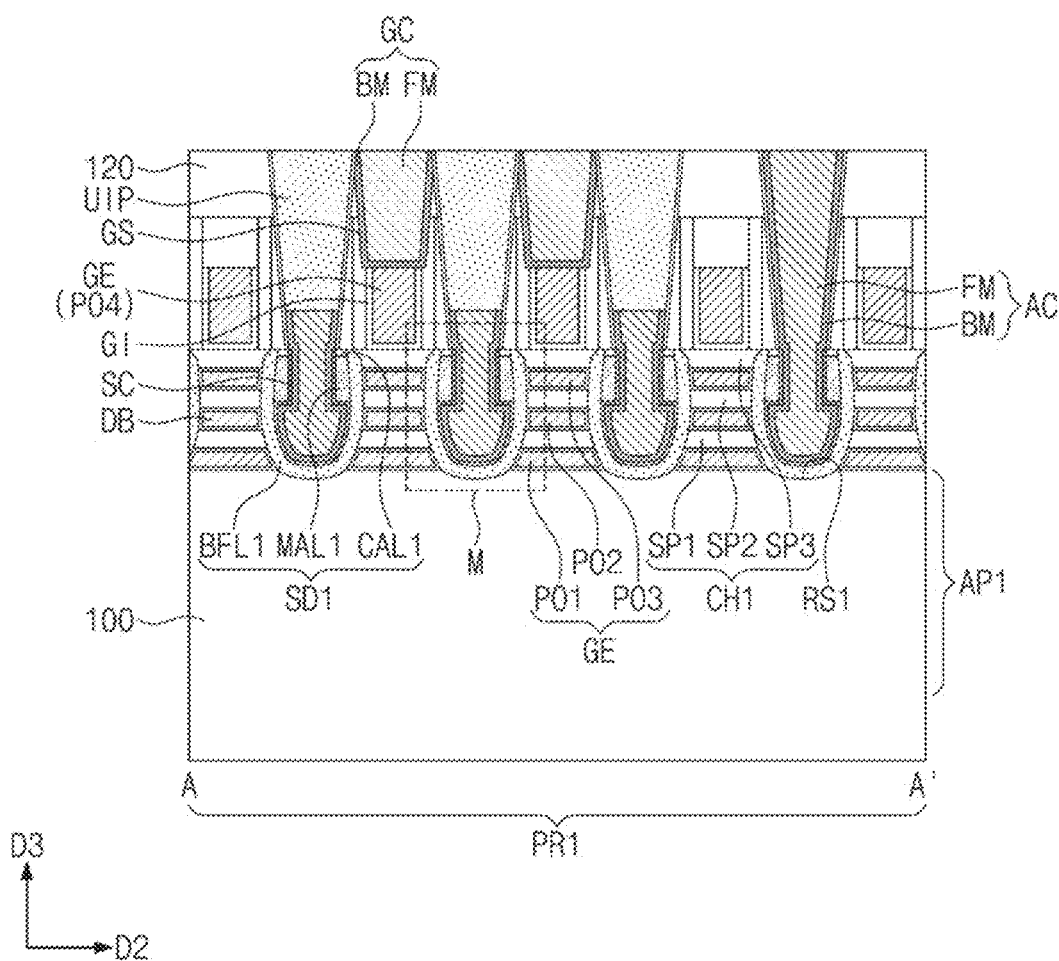
Figure 16B:
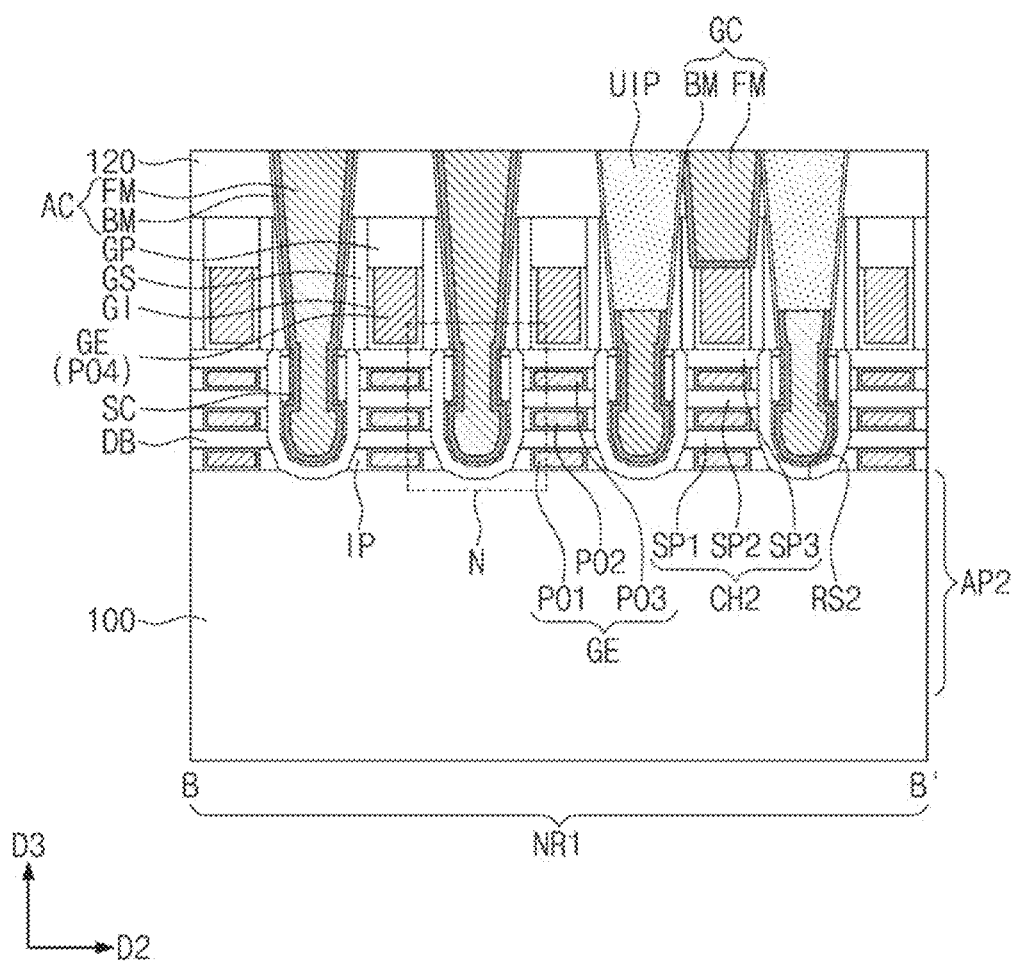
Figure 16C:
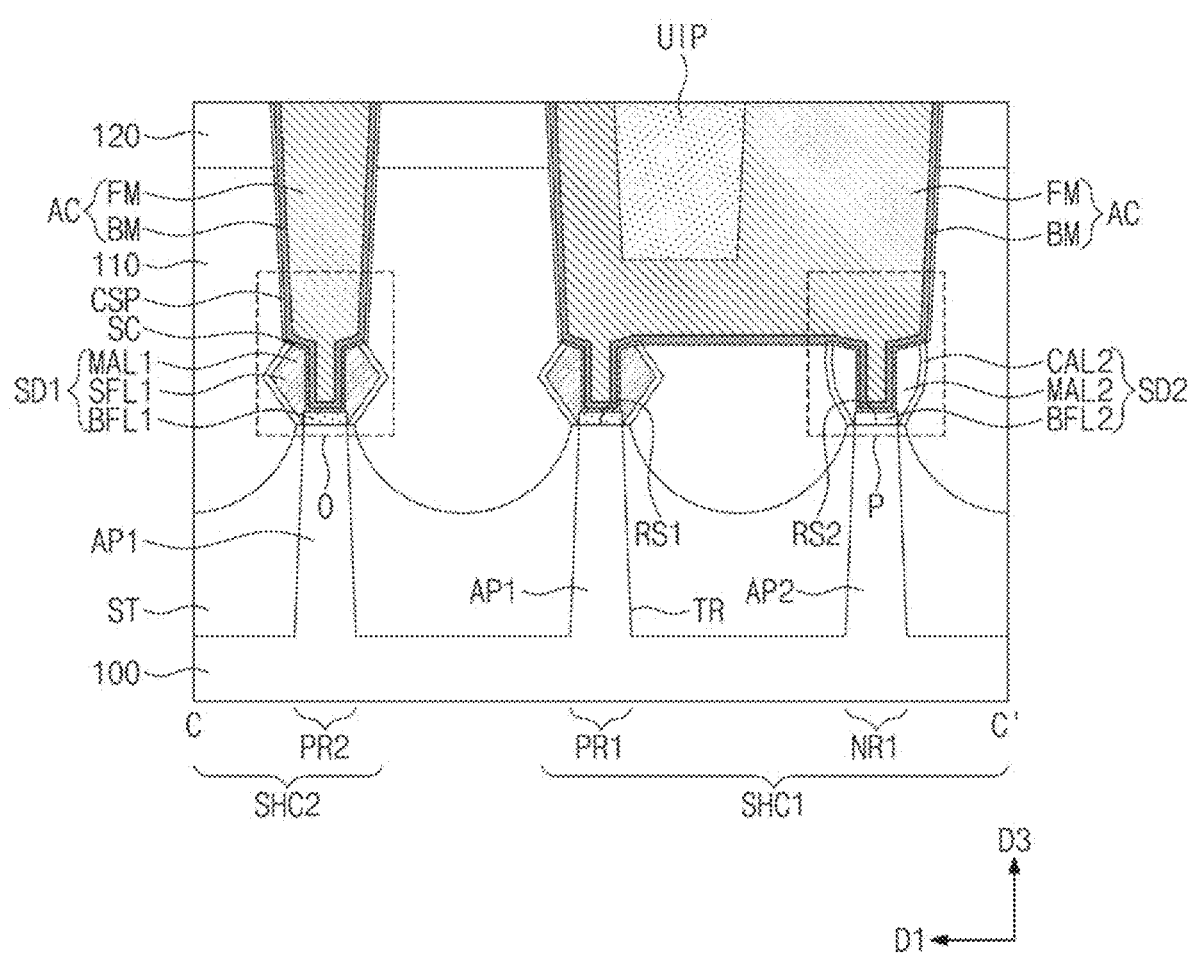
Figure 16D:
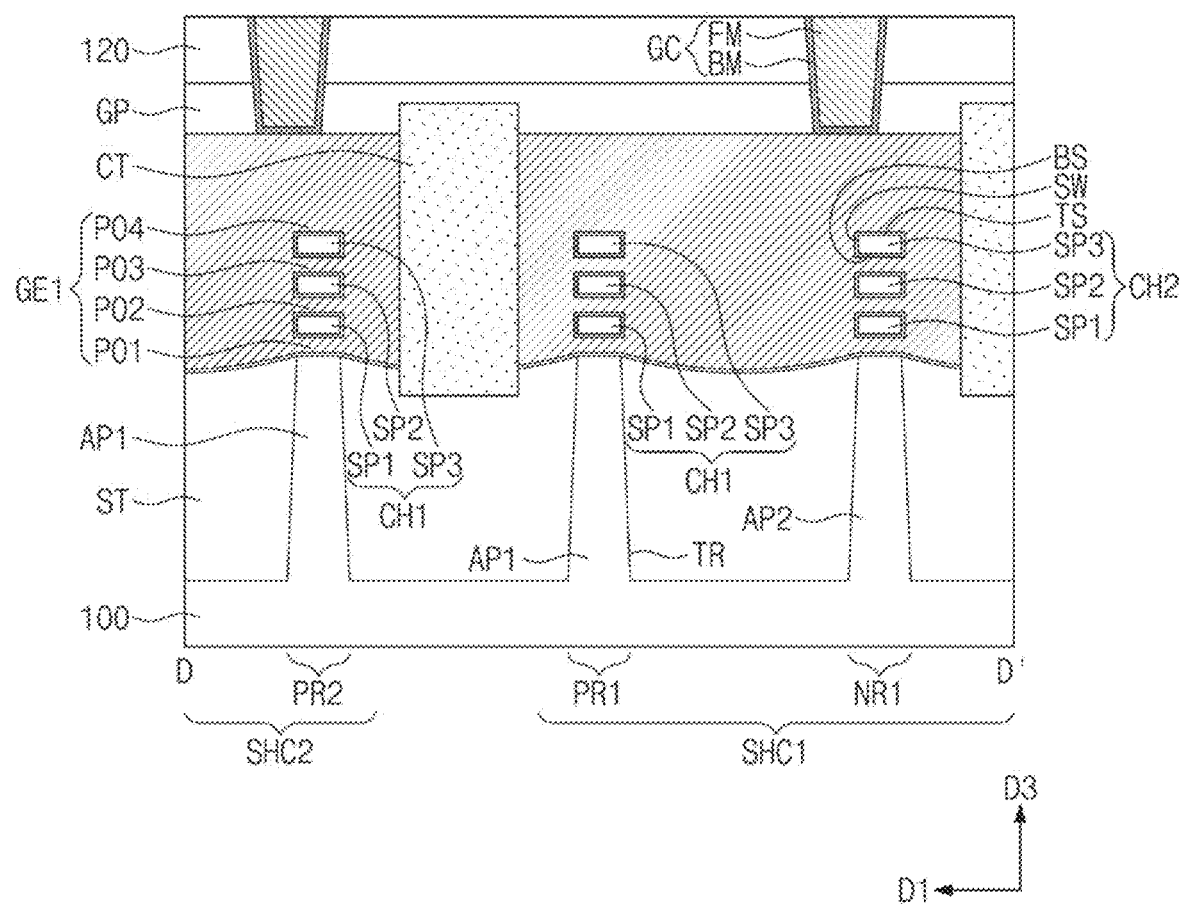
Figure 17A:
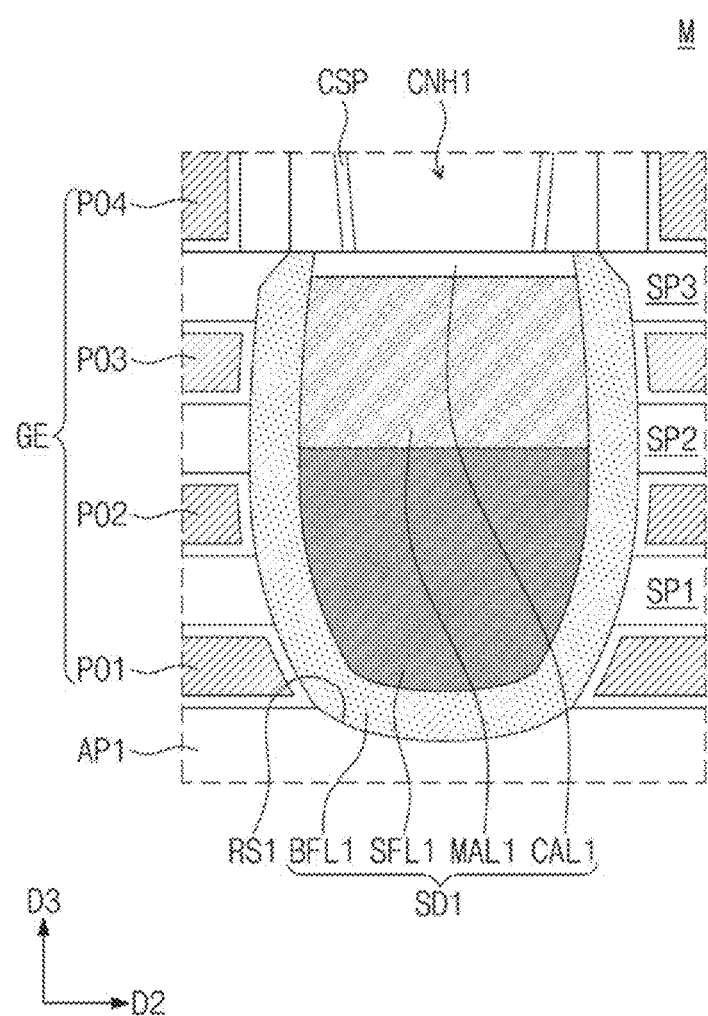
FIGS. 17A, 18A, 19A, and 20A are sectional views illustrating a process of forming a portion 'M' of FIG. 16A.
Figure 17B:
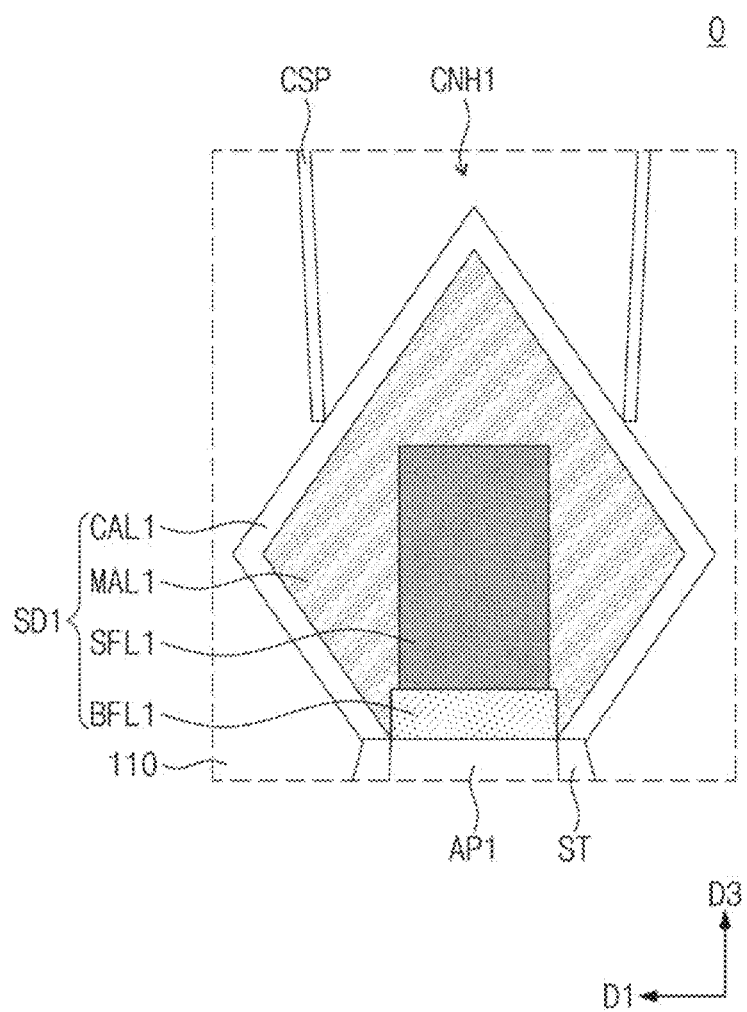
FIGS. 17B, 18B, 19B, and 20B are sectional views illustrating a process of forming a portion 'O' of FIG. 16C.
Figure 17C:
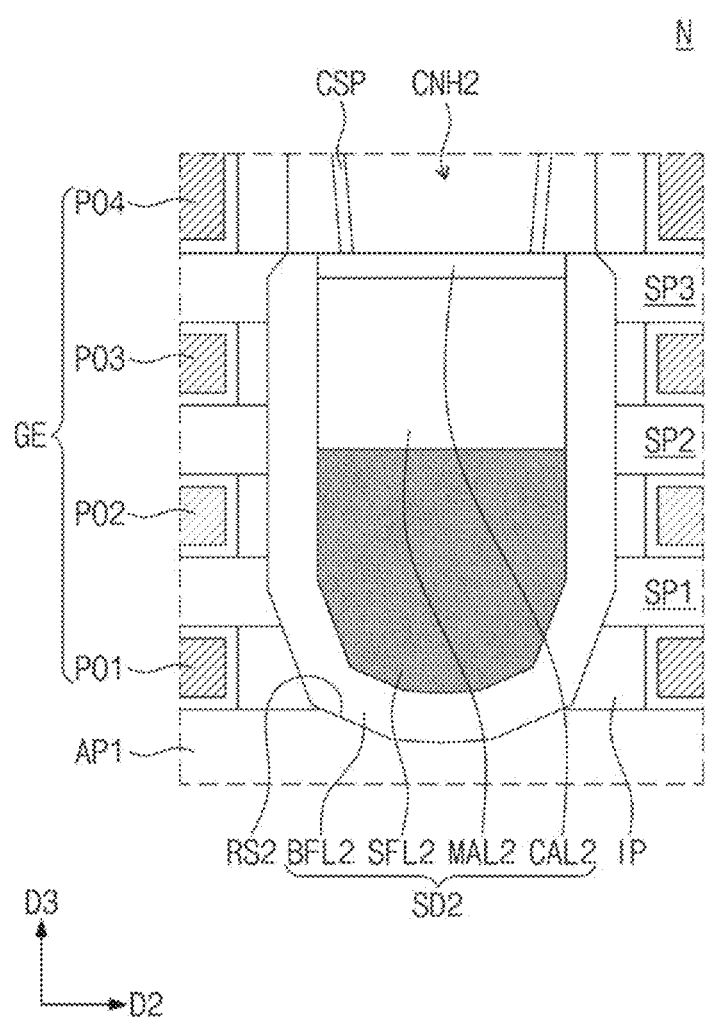
FIGS. 17C, 18C, 19C, and 20C are sectional views illustrating a process of forming a portion 'N' of FIG. 16B.
Figure 17D:
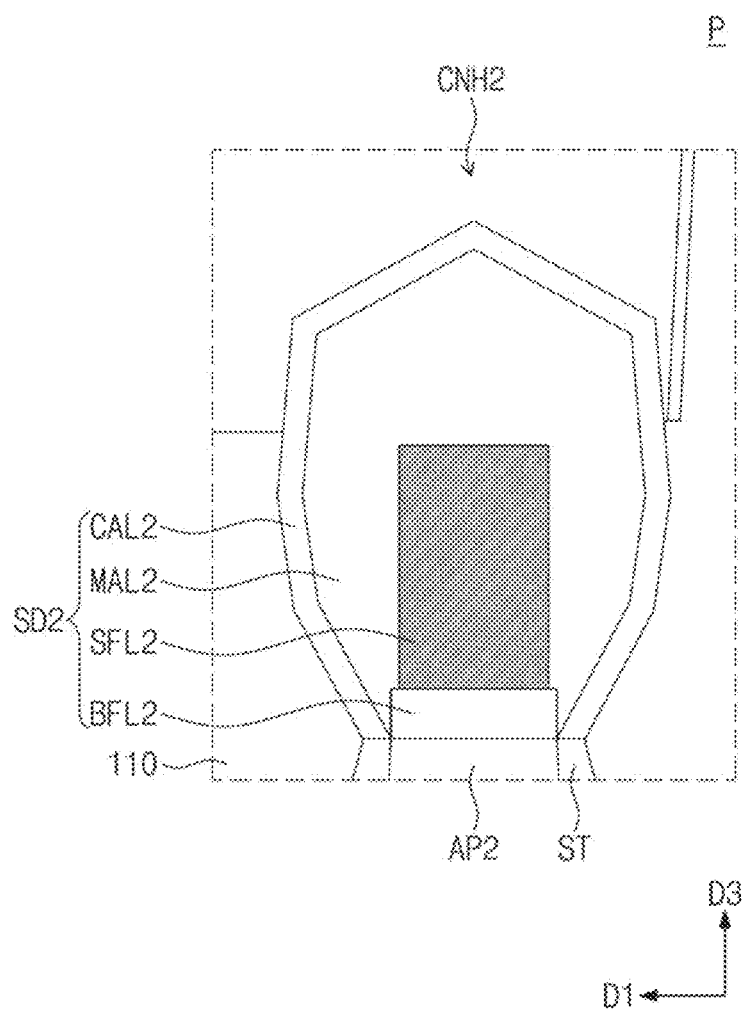
FIGS. 17D, 18D, 19D, and 20D are sectional views illustrating a process of forming a portion 'P' of FIG. 16C.
Figure 18A:
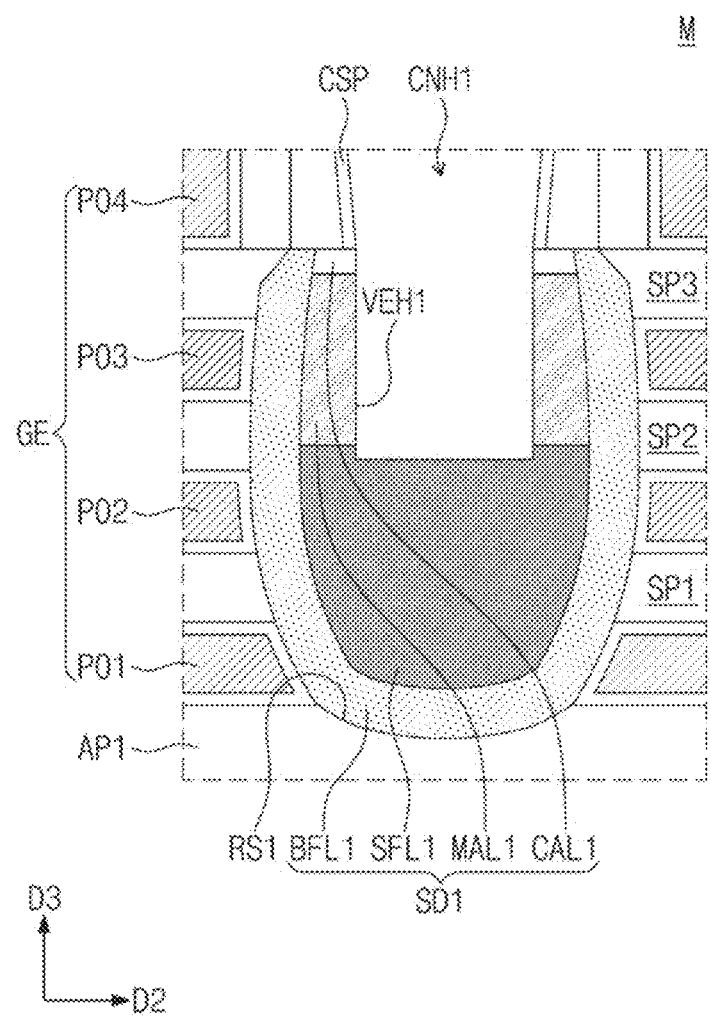
Figure 18B:
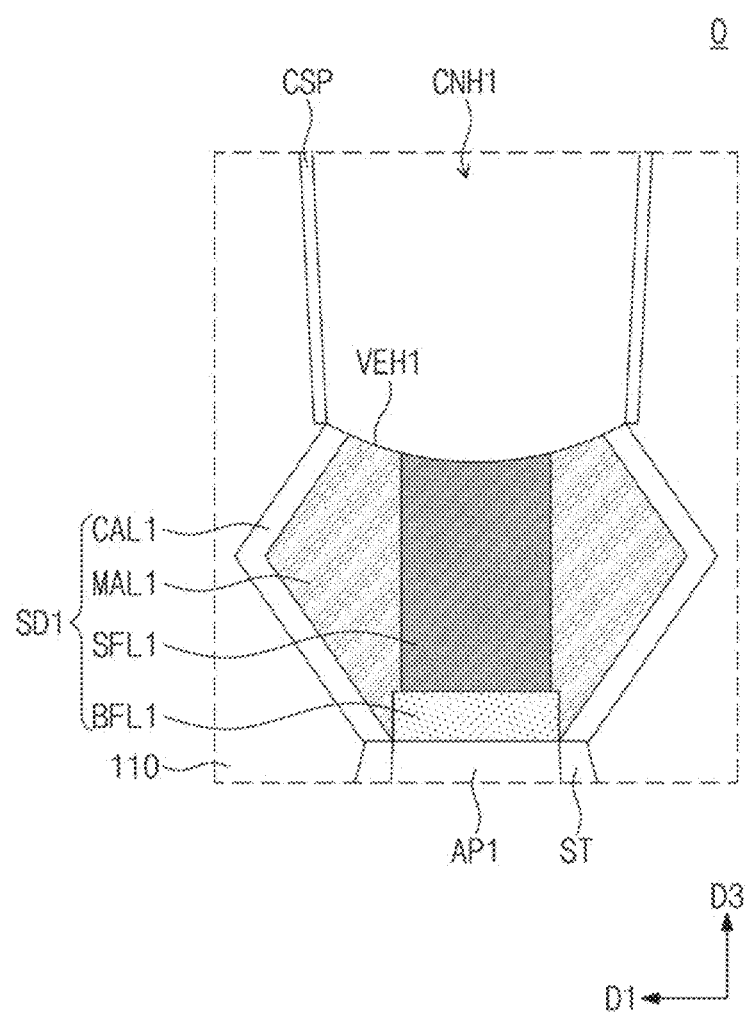
Figure 18C:
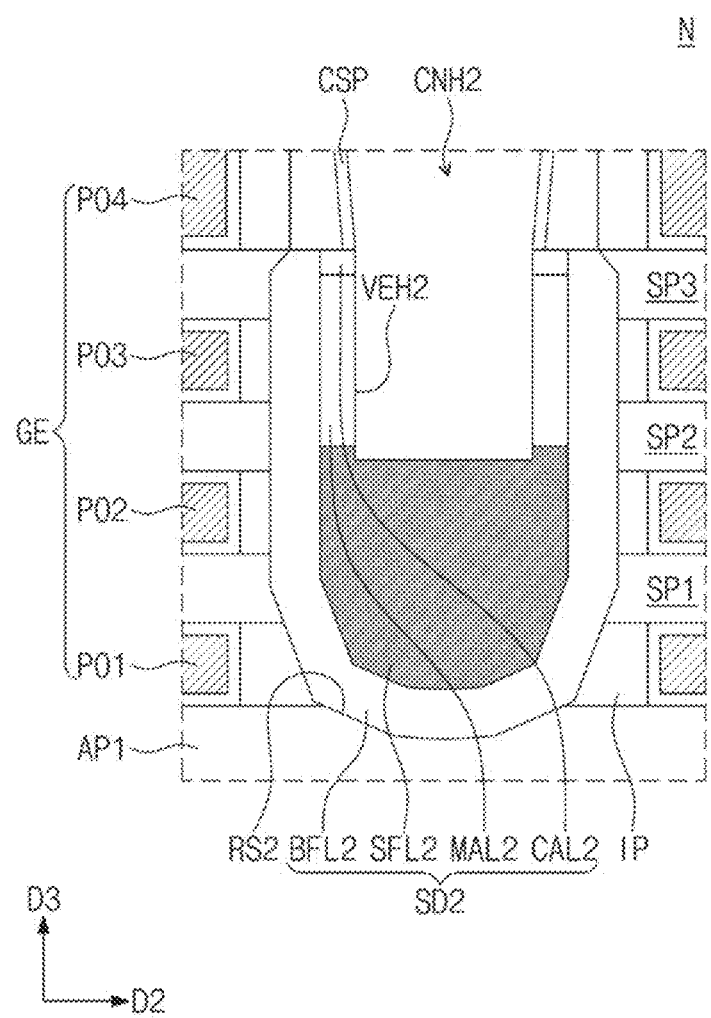
Figure 18D:
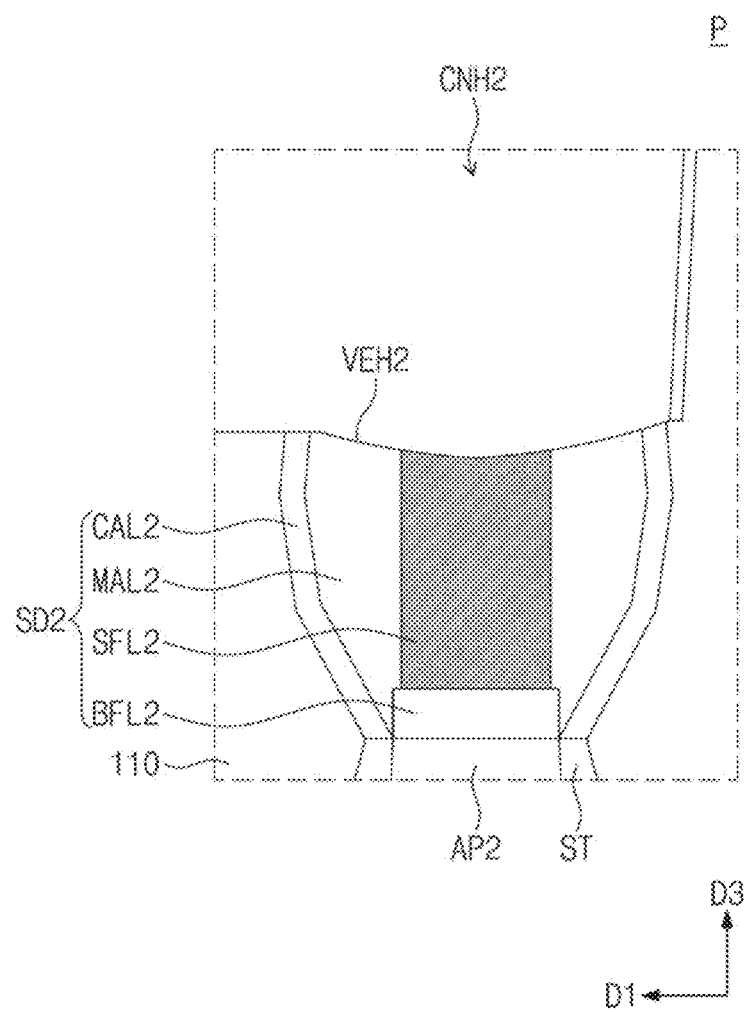

FIGS. 17A, 18A, 19A, and 20A are sectional views illustrating a process of forming a portion 'M' of FIG. 16A. FIGS. 17B, 18B, 19B, and 20B are sectional views illustrating a process of forming a portion 'O' of FIG. 16C. FIGS. 17C, 18C, 19C, and 20C are sectional views illustrating a process of forming a portion 'N' of FIG. 16B. FIGS. 17D, 18D, 19D, and 20D are sectional views illustrating a process of forming a portion 'P' of FIG. 16C.

Referring to FIGS. 17A to 17D, a first contact hole CNH1 may be formed to penetrate the first interlayer insulating layer 110 and to expose the first source/drain pattern SD1. A second contact hole CNH2 may be formed to penetrate the first interlayer insulating layer 110 and to expose the second source/drain pattern SD2.

The contact spacers CSP may be formed on an inner side surface of each of the first and second contact holes CNH1 and CNH2. The formation of the contact spacers CSP may include conformally forming a spacer layer in each of the first and second contact holes CNH1 and CNH2 and anisotropically etching the spacer layer. The contact spacers CSP may be formed of or may include at least one of SiCN, SiCON, or SiN.

Referring to FIGS. 18A to 18D, a first vertical extension hole VEH1 may be formed by performing an etching process on the first source/drain pattern SD1 exposed through the first contact hole CNH1. A second vertical extension hole VEH2 may be formed by performing an etching process on the second source/drain pattern SD2 exposed through the second contact hole CNH2.

The etching process for forming the first vertical extension hole VEH1 may be performed until the first sacrificial layer SFL1 is exposed. The etching process for forming the second vertical extension hole VEH2 may be performed until the second sacrificial layer SFL2 is exposed. The etching process for forming the first and second vertical extension holes VEH1 and VEH2 may include a dry etching process.

Referring to FIGS. 19A to 19D, a first expansion hole EXH1 may be formed by selectively removing the first sacrificial layer SFL1 exposed by the first vertical extension hole VEH1. The removal of the first sacrificial layer SFL1 may include an etching process that is performed to selectively remove only the first sacrificial layer SFL1. Since, as described above, the first sacrificial layer SFL1 contains the first etch enhancement element providing a high etch selectivity with respect to the first buffer layer BFL1 and the first main layer MAL1, it may be possible to remove only the first sacrificial layer SFL1, while the first buffer layer BFL1 and the first main layer MAL1 are left as they are.

A second expansion hole EXH2 may be formed by selectively removing the second sacrificial layer SFL2 exposed by the second vertical extension hole VEH2. The removal of the second sacrificial layer SFL2 may include an etching process capable of selectively removing only the second sacrificial layer SFL2. Since, as described above, the second sacrificial layer SFL2 contains the second etch enhancement element providing a high etch selectivity with respect to the second buffer layer BFL2 and the second main layer MAL2, it may be possible to remove only the second sacrificial layer SFL2, while the second buffer layer BFL2 and the second main layer MAL2 are left as they are.

In an embodiment, the first etch enhancement element and the second etch enhancement element may be the same element as each other. In this case, a process of removing the first sacrificial layer SFL1 and a process of removing the second sacrificial layer SFL2 may be performed at the same time.

In an embodiment, the first etch enhancement element and the second etch enhancement element may be different elements from each other. In this case, a process of removing the first sacrificial layer SFL1 and a process of removing the second sacrificial layer SFL2 may be different processes from each other and may be sequentially performed.

Since the first expansion hole EXH1 is an empty space, from which the first sacrificial layer SFL1 is removed, the first expansion hole EXH1 may have the same shape as the first sacrificial layer SFL1. For example, the shape of the first expansion hole EXH1 may be determined by the shape of the first sacrificial layer SFL1.

Since the second expansion hole EXH2 is an empty space, from which the second sacrificial layer SFL2 is removed, the second expansion hole EXH2 may be the same shape as the second sacrificial layer SFL2. For example, the shape of the second expansion hole EXH2 may be determined by the shape of the second sacrificial layer SFL2.

Referring to FIGS. 20A to 20D, the metal-semiconductor compound layer SC may be formed on an inner surface of the first source/drain pattern SD1 exposed by the first vertical extension hole VEH1 and the first expansion hole EXH1. The metal-semiconductor compound layer SC may be formed on an inner surface of the second source/drain pattern SD2 exposed through the second vertical extension hole VEH2 and the second expansion hole EXH2.

The metal-semiconductor compound layer SC may be formed using a chemical vapor deposition (CVD) process and may conformally cover an inner surface of each of the first and second source/drain patterns SD1 and SD2. In an embodiment, the metal-semiconductor compound layer SC may be formed of or may include at least one of titanium silicide, tantalum silicide, tungsten silicide, nickel silicide, or cobalt silicide.

Referring back to FIGS. 6A, 6B, 7A, and 7B, the active contact AC may be formed to fill the first contact hole CNH1, the first vertical extension hole VEH1, and the first expansion hole EXH1. The active contact AC may be formed to fill the second contact hole CNH2, the second vertical extension hole VEH2, and the second expansion hole EXH2.

In detail, the active contact AC coupled to the first source/drain pattern SD1 may include the first contact portion CTP1, the first vertical extension portion VEP1, and the first expansion portion EXP1, which are respectively formed in the first contact hole CNH1, the first vertical extension hole VEH1, and the first expansion hole EXH1. The active contact AC coupled to the second source/drain pattern SD2 may include the second contact portion CTP2, the second vertical extension portion VEP2, and the second expansion portion EXP2, which are respectively formed in the second contact hole CNH2, the second vertical extension hole VEH2, and the second expansion hole EXH2.

The formation of the active contact AC may include forming the barrier pattern BM and forming the conductive pattern FM on the barrier pattern BM. The barrier pattern BM may be formed conformally and may include a metal layer and a metal nitride layer. The conductive pattern FM may be formed of or may include a low resistance metal.

Referring back to FIGS. 4 and 5A to 5D, a pair of the division structures DB may be formed at both sides of each of the first and second single height cells SHC1 and SHC2. The division structure DB may penetrate the second interlayer insulating layer 120 and the gate electrode GE and may be extended into the active pattern AP1 or AP2. The division structure DB may be formed of or may include at least one of insulating materials (e.g., silicon oxide or silicon nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

Various example embodiments of the inventive concept will be described in more detail below. In the following description, an element previously described with reference to FIGS. 4 to 8 will not be described, and an element, which was not described with reference to FIGS. 4 to 8, will be described in more detail.

Figure 21A:
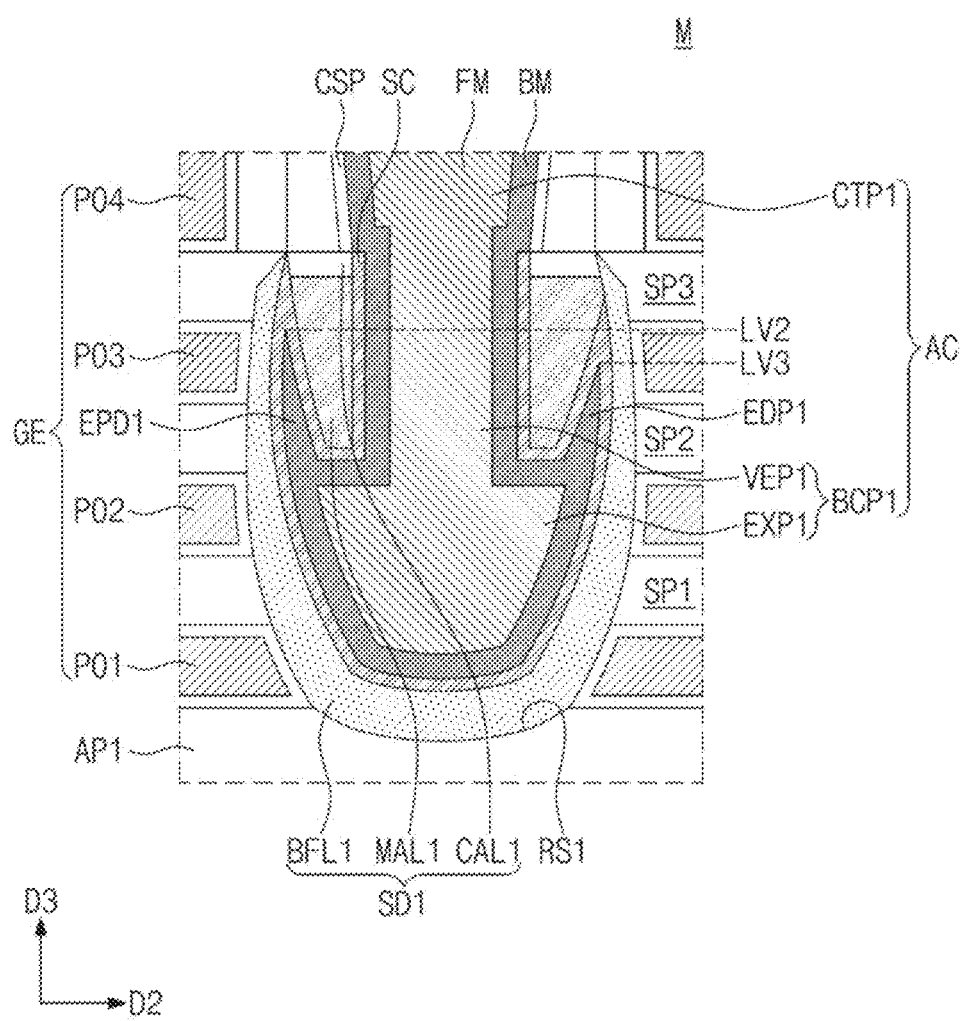
FIG. 21A is an enlarged sectional view illustrating an example of the portion 'M' of FIG. 5A.
Figure 21B:
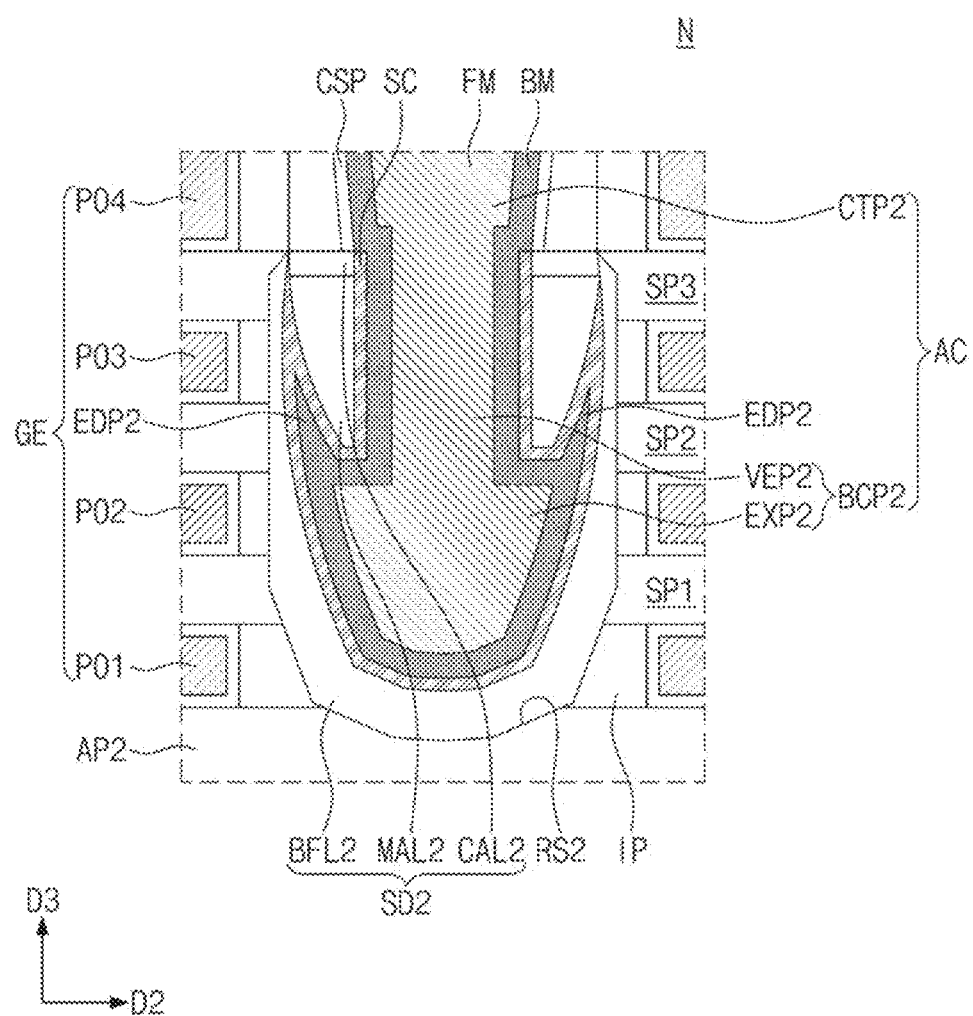
FIG. 21B is an enlarged sectional view illustrating an example of the portion 'N' of FIG. 5B.

FIG. 21A is an enlarged sectional view illustrating an example of the portion 'M' of FIG. 5A, and FIG. 21B is an enlarged sectional view illustrating an example of the portion 'N' of FIG. 5B. Referring to FIG. 21A, the first buffer layer BFL1 may have a decreasing thickness in an upward direction. For example, a thickness, in the third direction D3, of the first buffer layer BFL1 at a bottom level of the first recess RS1 may be larger than a thickness, in the second direction D2, of the first buffer layer BFL1 at an upper level of the first recess RS1.

The first expansion portion EXP1 may include a pair of first edge portions EDP1 provided at both sides thereof. Each of the first edge portions EDP1 may be vertically extended along an inner side surface of the first buffer layer BFL1. The first edge portion EDP1 may have a width decreasing in the third direction D3 and may have a sharp shape.

The highest point of the first edge portion EDP1 at a side of the first expansion portion EXP1 may be located at a second level LV2, and the highest point of the first edge portion EDP1 at an opposite side of the first expansion portion EXP1 may be located at a third level LV3. The second level LV2 and the third level LV3 may be different from each other; for example, the second level LV2 may be higher than the third level LV3.

Since the first expansion portion EXP1 includes the first edge portions EDP1, a contact area between the active contact AC and the first source/drain pattern SD1 may be increased and thus, an electric resistance therebetween may be reduced.

Figure 12A:
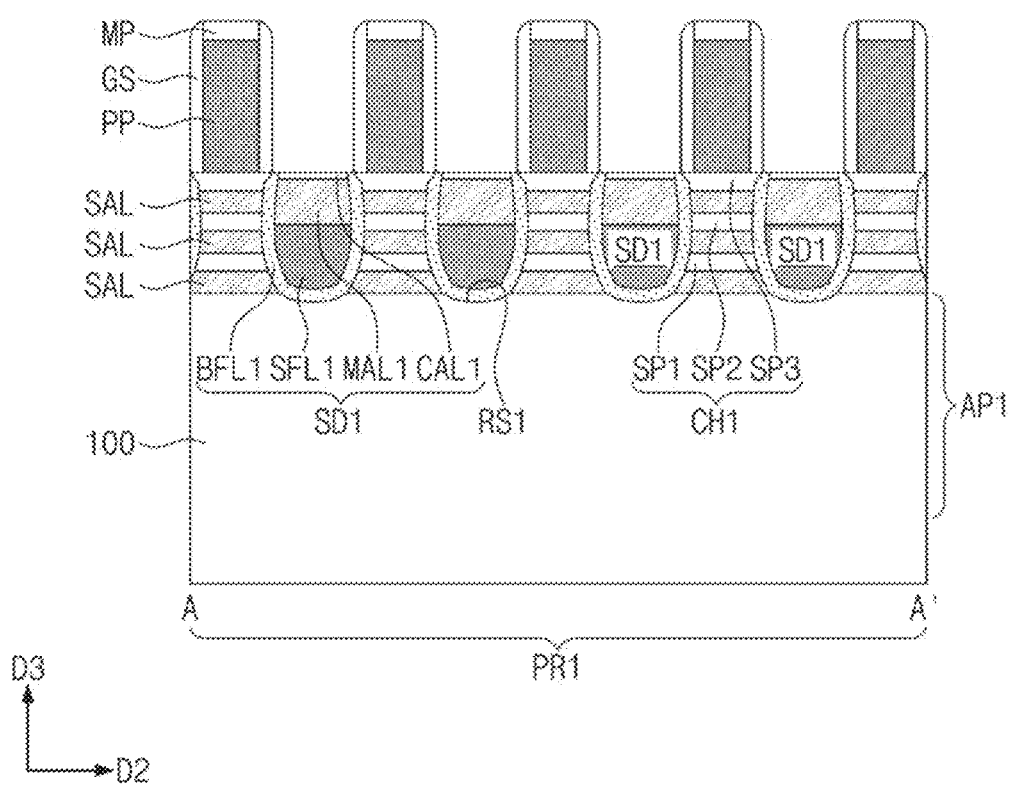
Figure 12B:
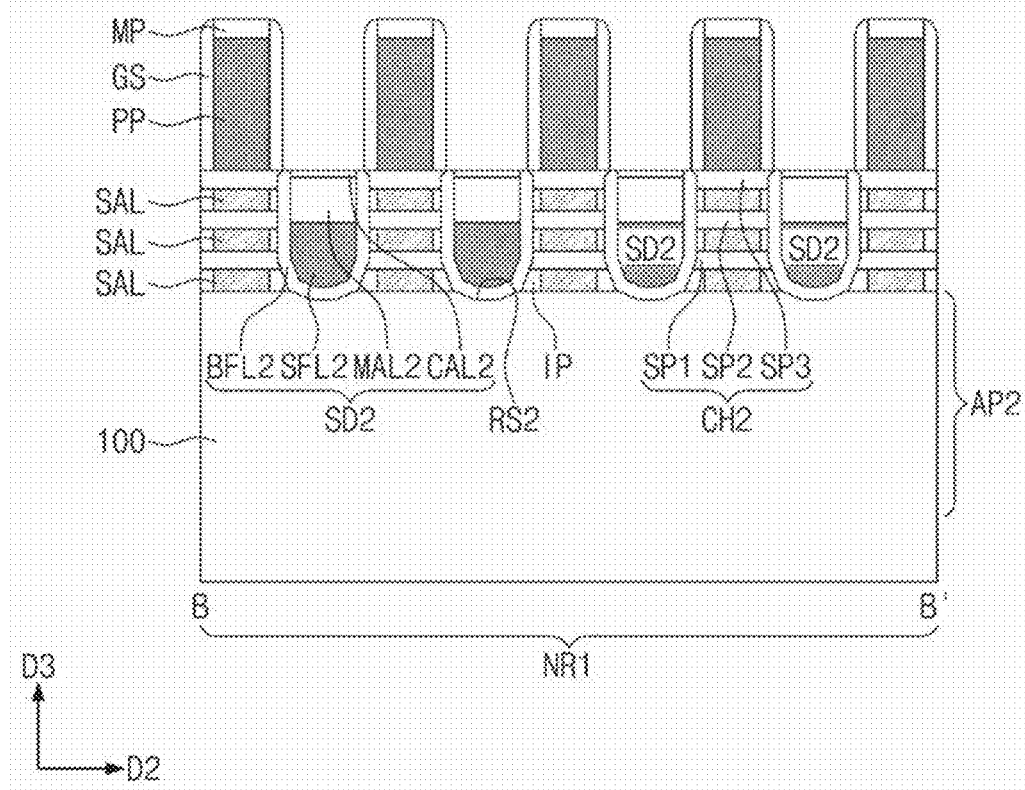
Figure 12C:
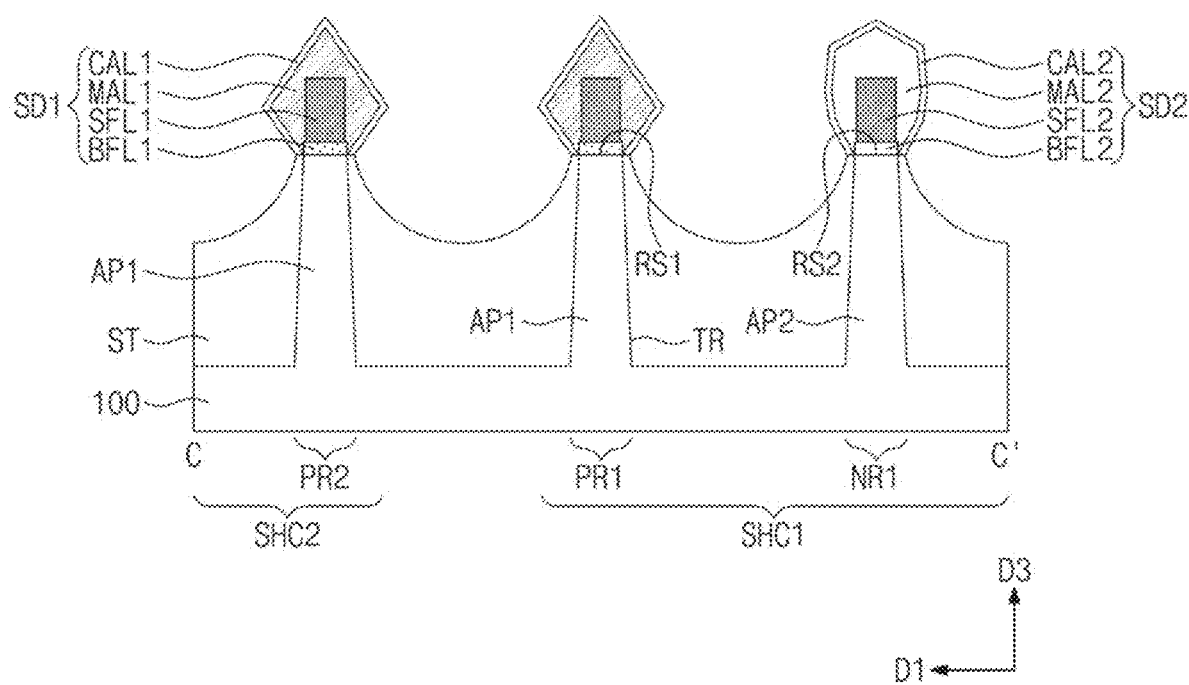
Figure 12D:
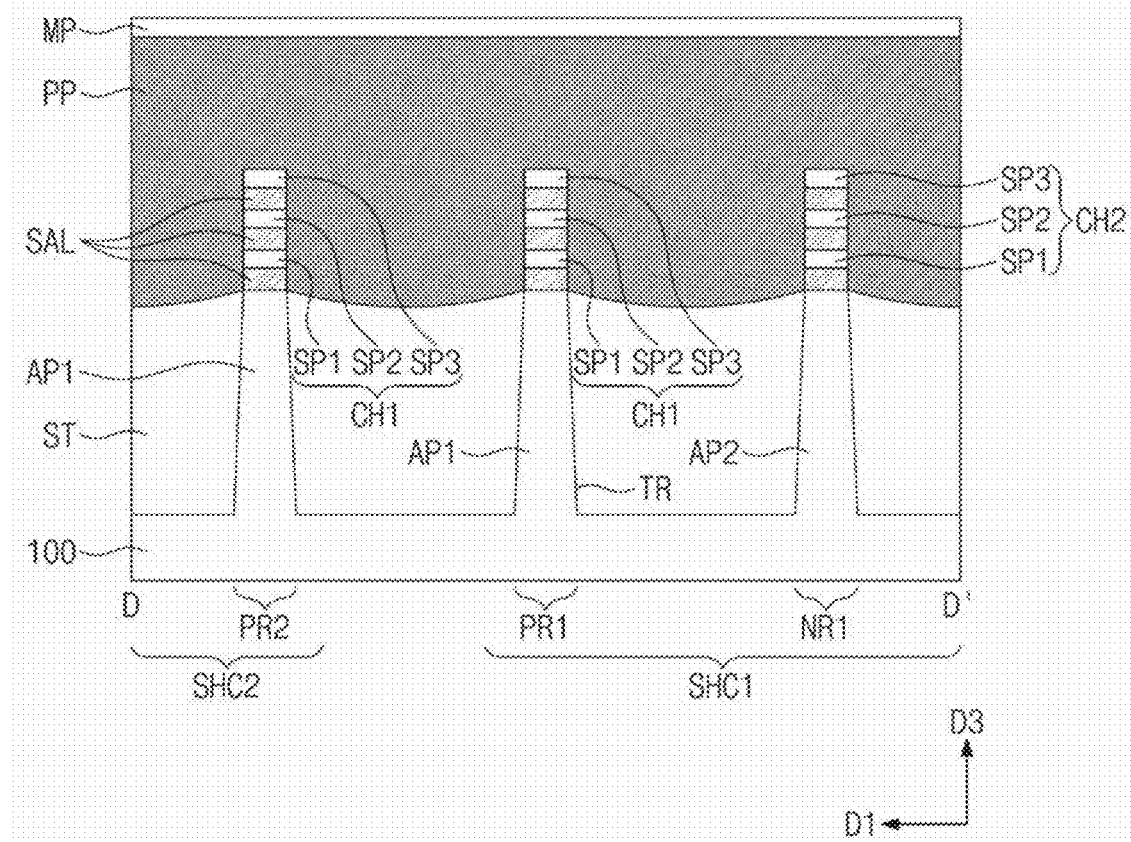
Figure 13A:
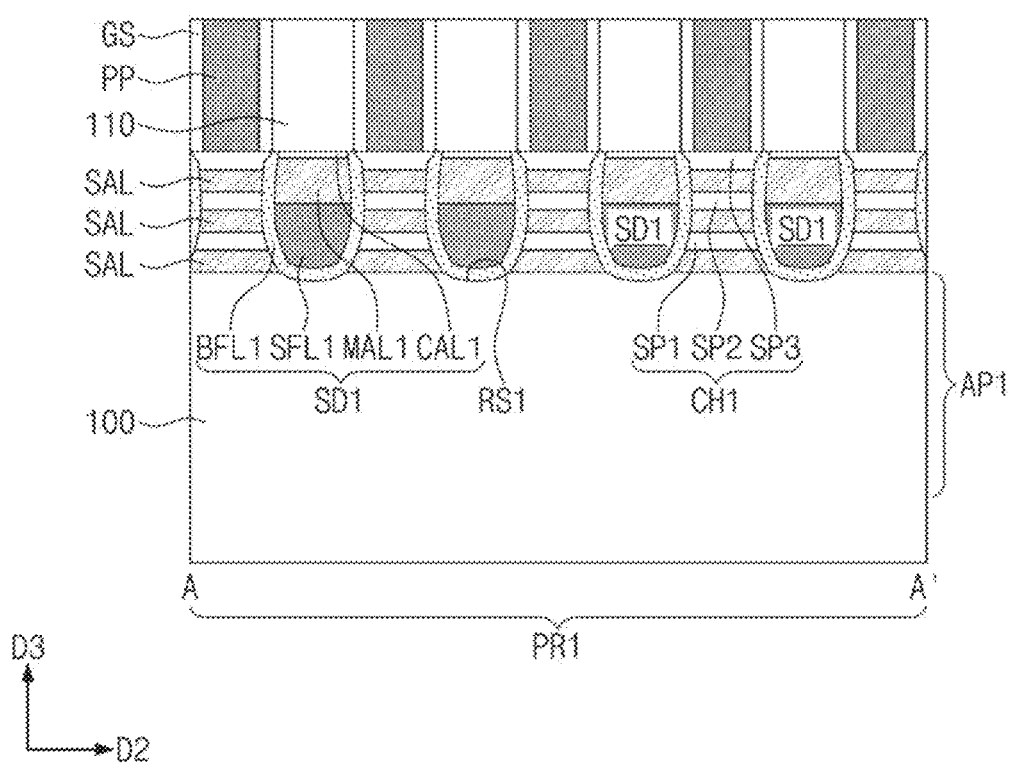
Figure 13B:
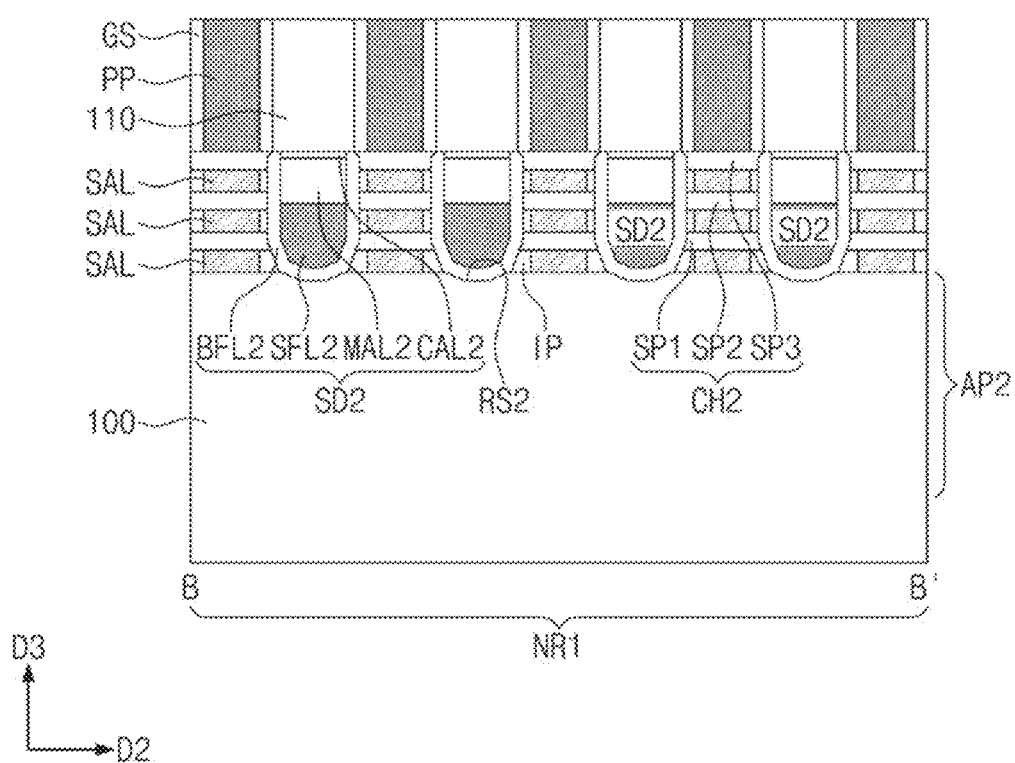
Figure 13C:
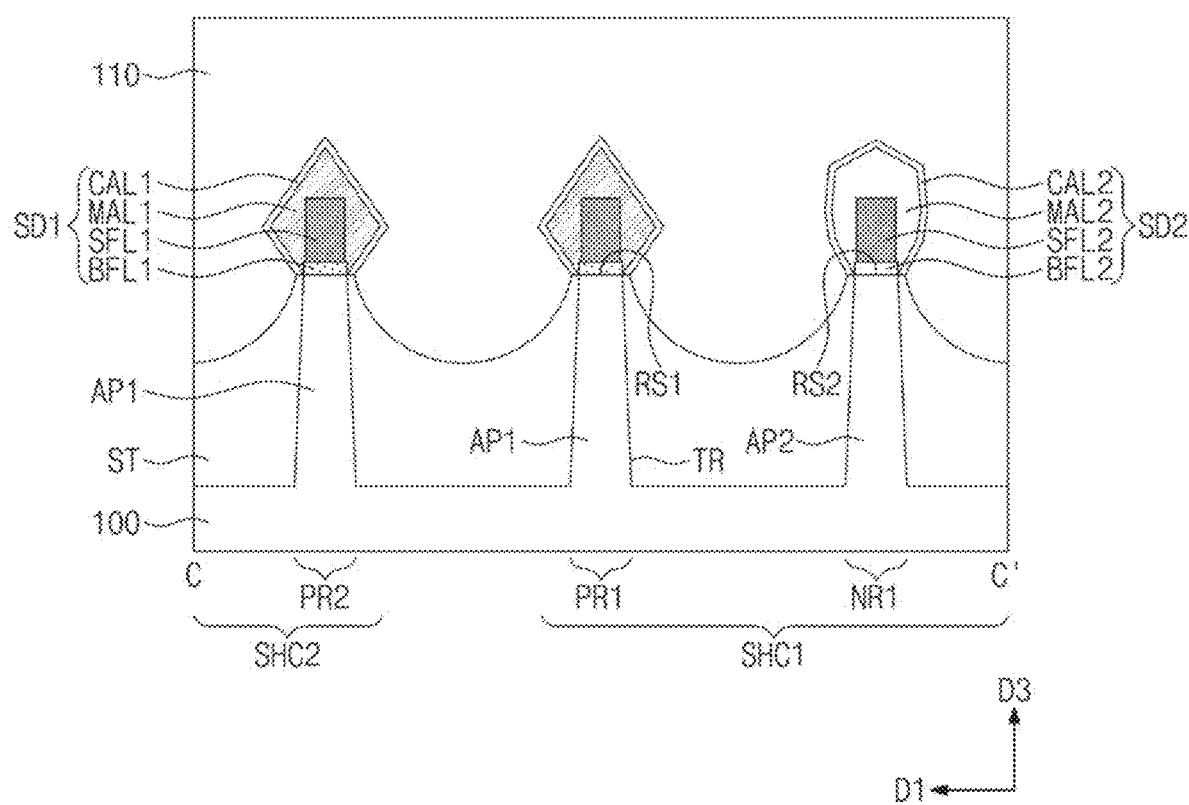
Figure 13D:
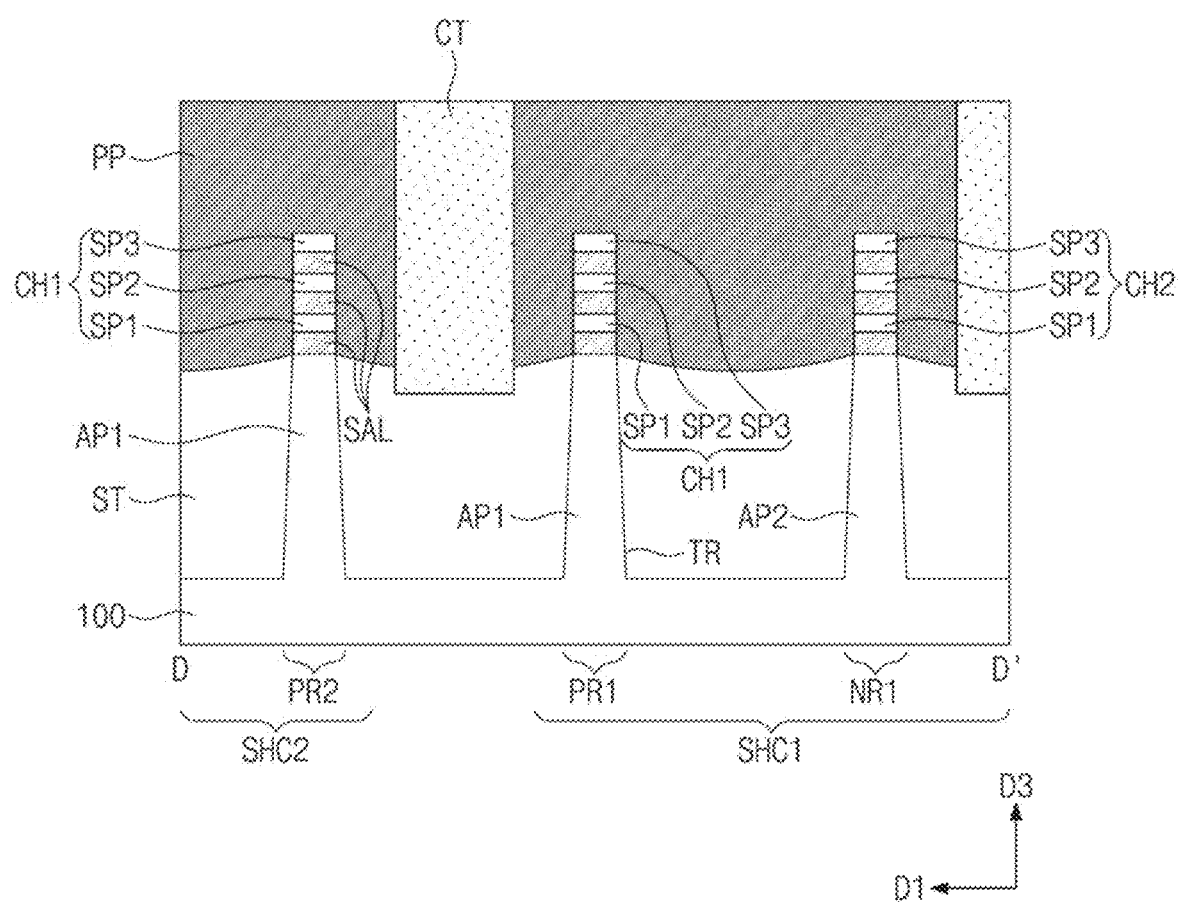

The formation of the first edge portions EDP1 in the first expansion portion EXP1 may include growing the first sacrificial layer SFL1, which was previously described with reference to FIG. 12A, on an upper inner side surface of the first buffer layer BFL1. The first sacrificial layer SFL1 may be grown on a bottom of the first buffer layer BFL1 as well as the upper inner side surface of the first buffer layer BFL1 by adjusting a process condition in the second SEG process for forming the first sacrificial layer SFL1. The first edge portions EDP1 may be provided in the first expansion portion EXP1 by adjusting a growth shape of the first sacrificial layer SFL1.

Referring to FIG. 21B, the second buffer layer BFL2 may have a decreasing thickness in an upward direction. The second expansion portion EXP2 may include a pair of second edge portions EDP2 provided at both sides thereof. Each of the second edge portions EDP2 may be vertically extended along an inner side surface of the second buffer layer BFL2. The second edge portion EDP2 may have a width decreasing in the third direction D3 and may have a sharp shape. The highest point of the second edge portion EDP2 at a side of the second expansion portion EXP2 may be located at a level different from the highest point of the second edge portion EDP2 at an opposite side of the second expansion portion EXP2. The second expansion portion EXP2 may be formed in the second edge portions EDP2 by adjusting a growth shape of the second sacrificial layer SFL2 previously described with reference to FIG. 12B.

Figure 22A:
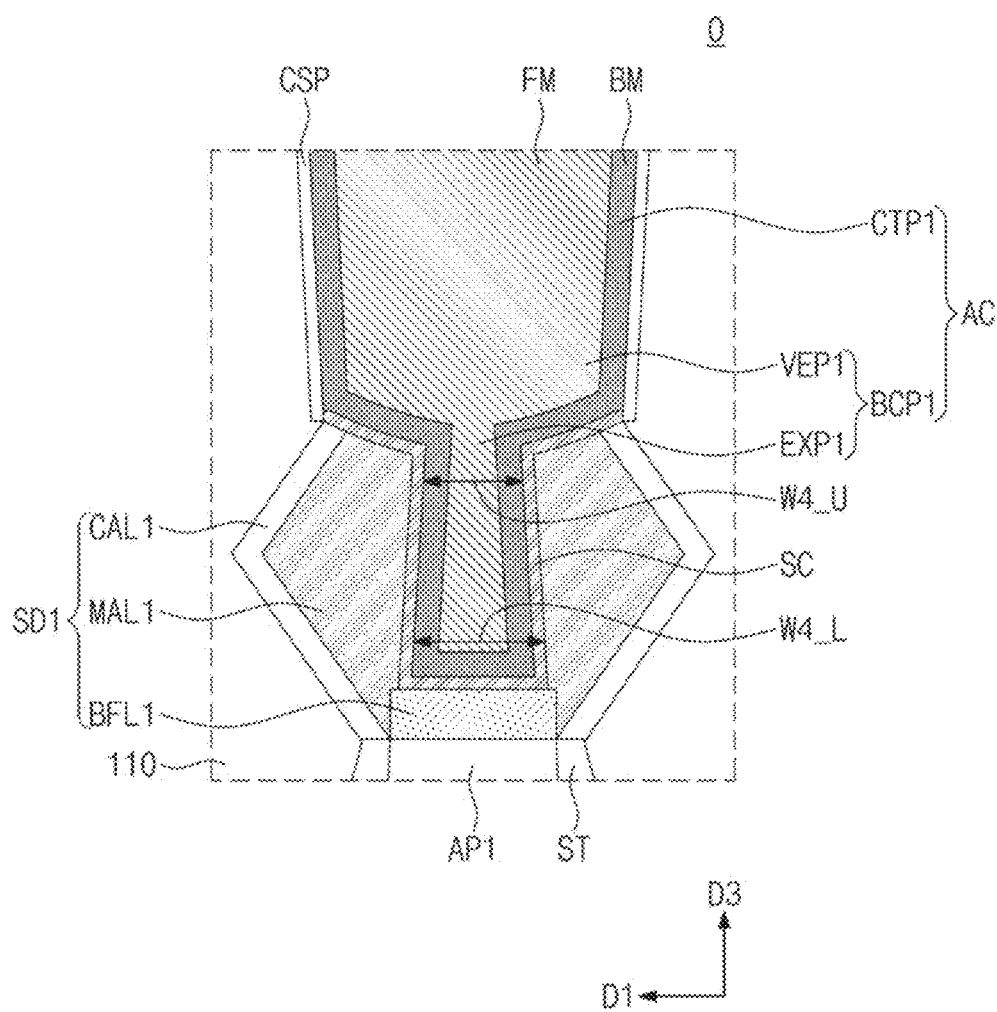
FIG. 22A is an enlarged sectional view illustrating an example of the portion 'O' of FIG. 5C.
Figure 22B:
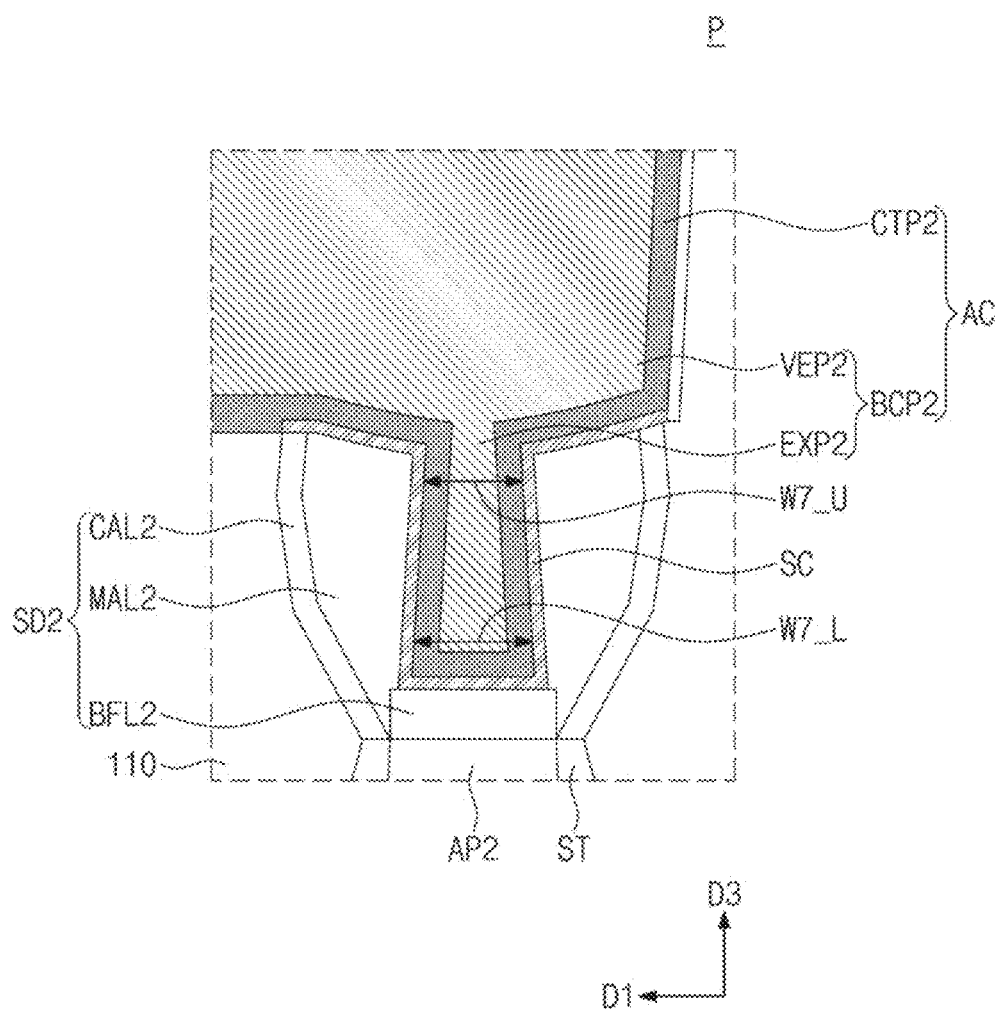
FIG. 22B is an enlarged sectional view illustrating an example of the portion 'P' of FIG. 5C.

FIG. 22A is an enlarged sectional view illustrating an example of the portion 'O' of FIG. 5C, and FIG. 22B is an enlarged sectional view illustrating an example of the portion 'P' of FIG. 5C. Referring to FIG. 22A, the width of the first expansion portion EXP1 in the first direction D1 may decrease in the third direction D3. For example, the width W4_U of the upper portion of the first expansion portion EXP1 may be smaller than the width W4_L of the lower portion of the first expansion portion EXP1.

The reduction of the width of the first expansion portion EXP1 in the third direction D3 may include growing the first sacrificial layer SFL1, which was previously described with reference to FIG. 12A, to have a gradually decreasing width. A shape of the first expansion portion EXP1 may be determined by adjusting a growth shape of the first sacrificial layer SFL1.

Referring to FIG. 22B, the width of the second expansion portion EXP2 in the first direction D1 may decrease in the third direction D3. For example, the width W7_U of the upper portion of the second expansion portion EXP2 may be smaller than the width W7_L of the lower portion of the second expansion portion EXP2. The shape of the second expansion portion EXP2 may be determined by adjusting a growth shape of the second sacrificial layer SFL2 previously described with reference to FIG. 12B.

Figure 23:
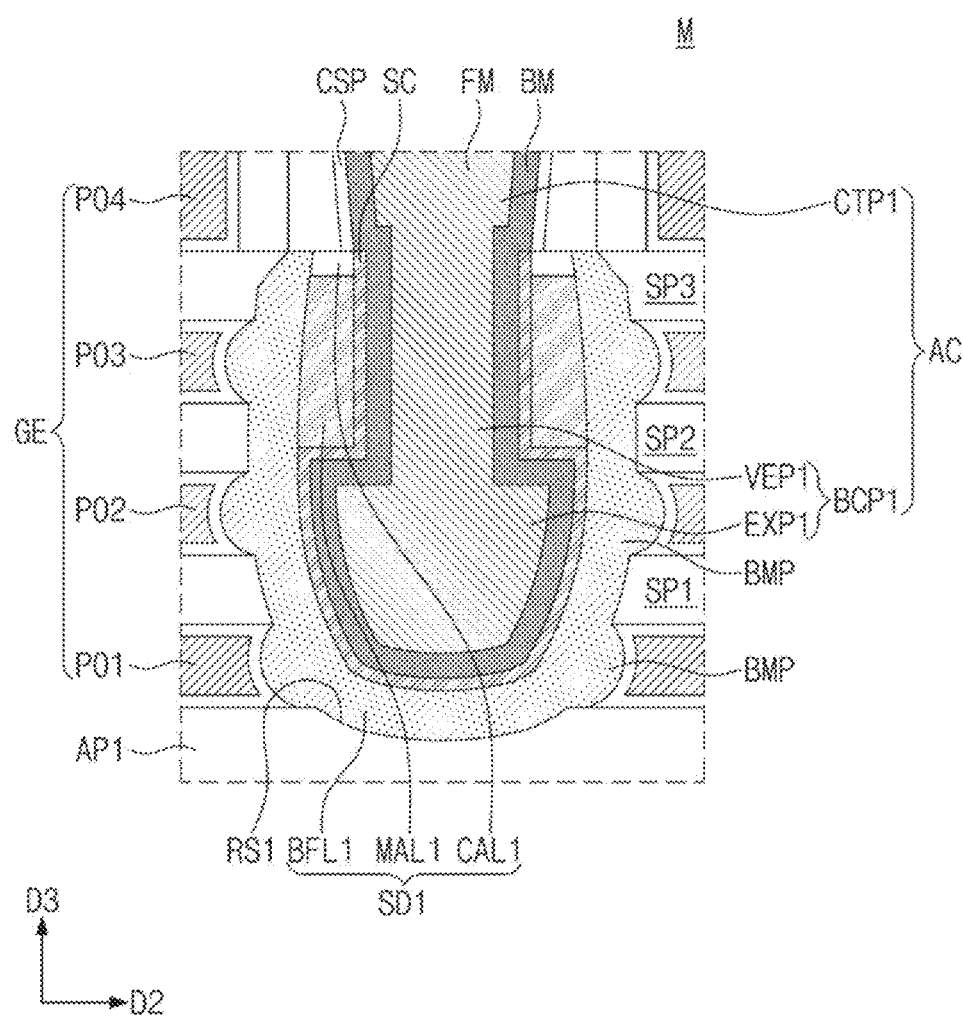
FIG. 23 is an enlarged sectional view illustrating an example of the portion 'M' of FIG. 5A.

FIG. 23 is an enlarged sectional view illustrating an example of the portion 'M' of FIG. 5A. Referring to FIG. 23, the first source/drain pattern SD1 may include a plurality of protrusions BMP provided on a side surface thereof. The first buffer layer BFL1 may include the protrusions BMP provided on a side surface thereof. Each of the protrusions BMP may protrude toward a corresponding one of the first to third portions PO1, PO2, and PO3 of the gate electrode GE.

Due to the presence of the protrusion BMP, the first buffer layer BFL1 adjacent to the gate electrode GE may have a relatively increased thickness. During the process of removing the second semiconductor layers SAL previously described with reference to FIGS. 14A to 14D, the first main layer MAL1 and the first sacrificial layer SFL1 may be effectively protected by the protrusions BMP of the first buffer layer BFL1.

Figure 24:
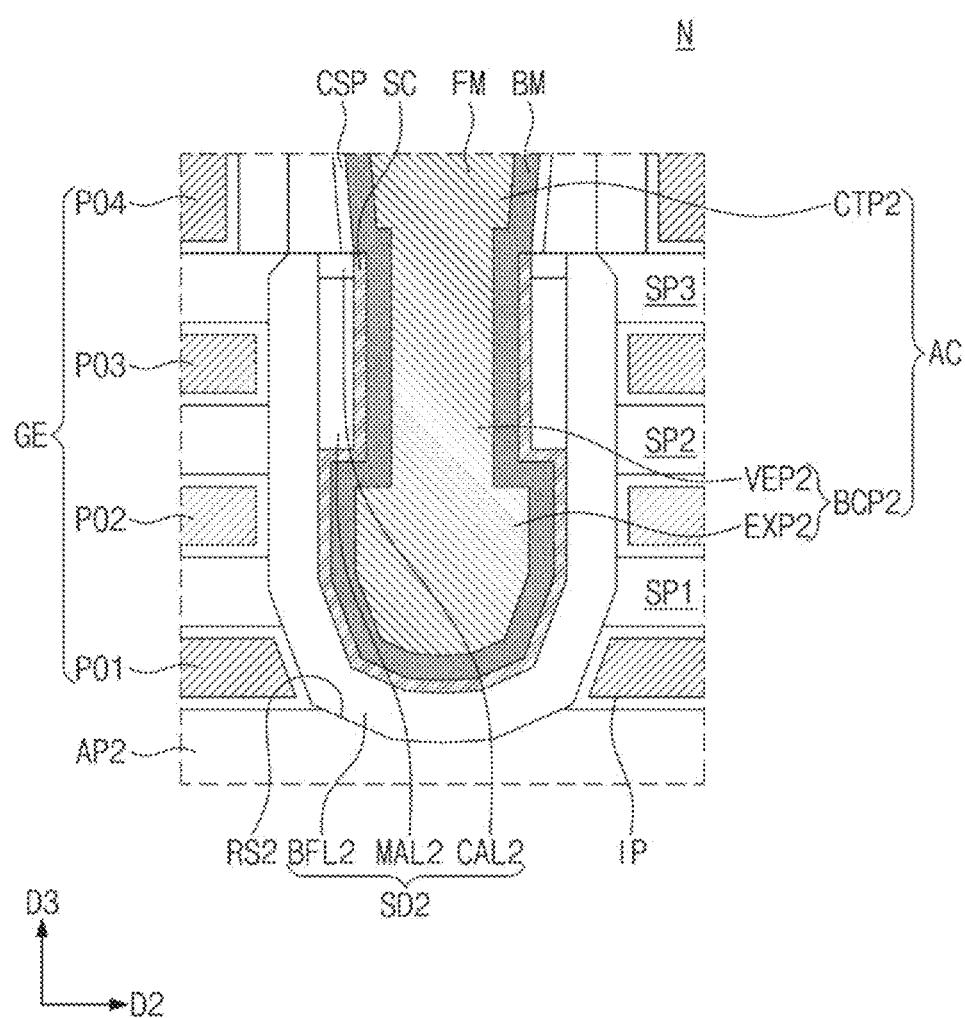
FIG. 24 is an enlarged sectional view illustrating an example of the portion 'N' of FIG. 5B.

FIG. 24 is an enlarged sectional view illustrating an example of the portion 'N' of FIG. 5B. Referring to FIG. 24, the inner spacers IP may be omitted from a region on the second active pattern AP2. Accordingly, the second buffer layer BFL2 may be adjacent to the first to third portions PO1, PO2, and PO3 of the gate electrode GE with the gate insulating layer GI interposed therebetween.

Figure 25:
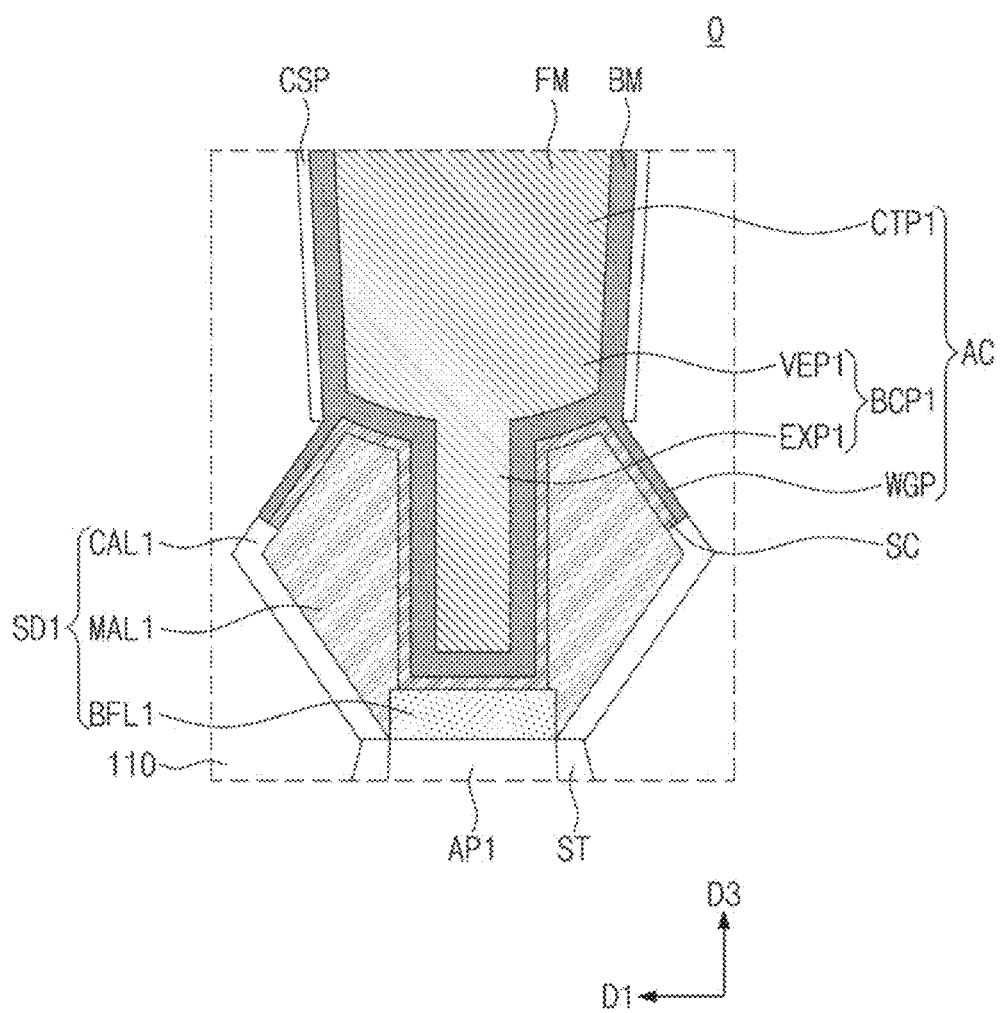
FIG. 25 is an enlarged sectional view illustrating an example of the portion 'O' of FIG. 5C.

FIG. 25 is an enlarged sectional view illustrating an example of the portion 'O' of FIG. 5C. Referring to FIG. 25, the active contact AC may include a cover portion WGP that covers at least a portion of an upper surface of the first main layer MAL1. The cover portion WGP may be provided in a space, which is formed by removing a portion of the first capping layer CAL1. The metal-semiconductor compound layer SC may be further extended into a space between the cover portion WGP and the first main layer MAL1.

Figure 19A:
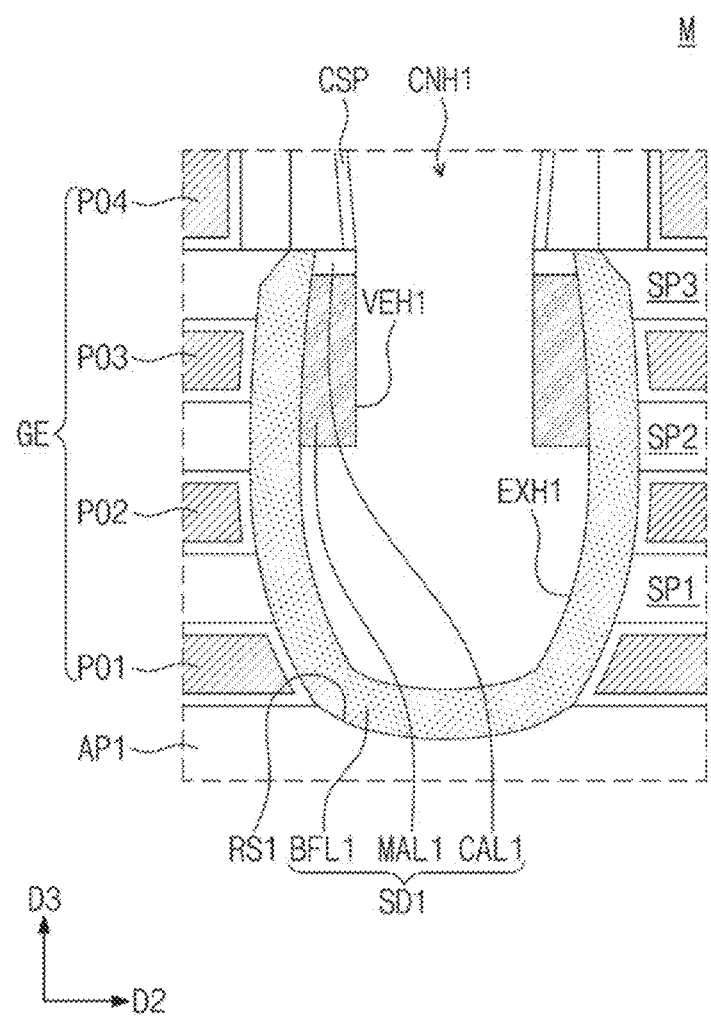
Figure 19B:
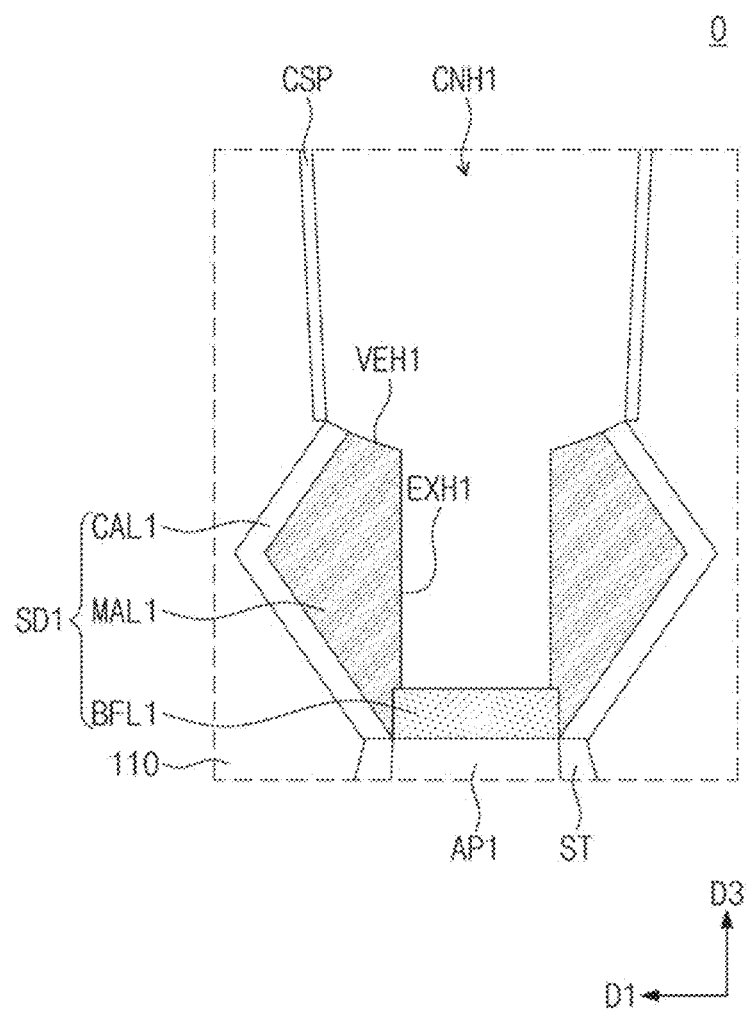
Figure 19C:
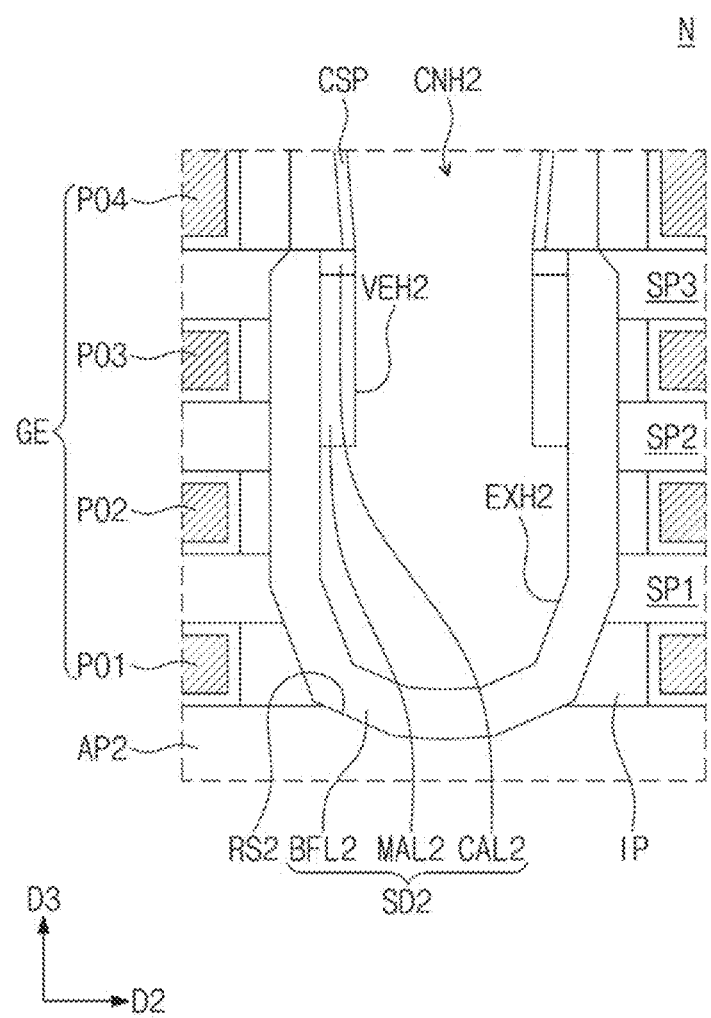
Figure 19D:
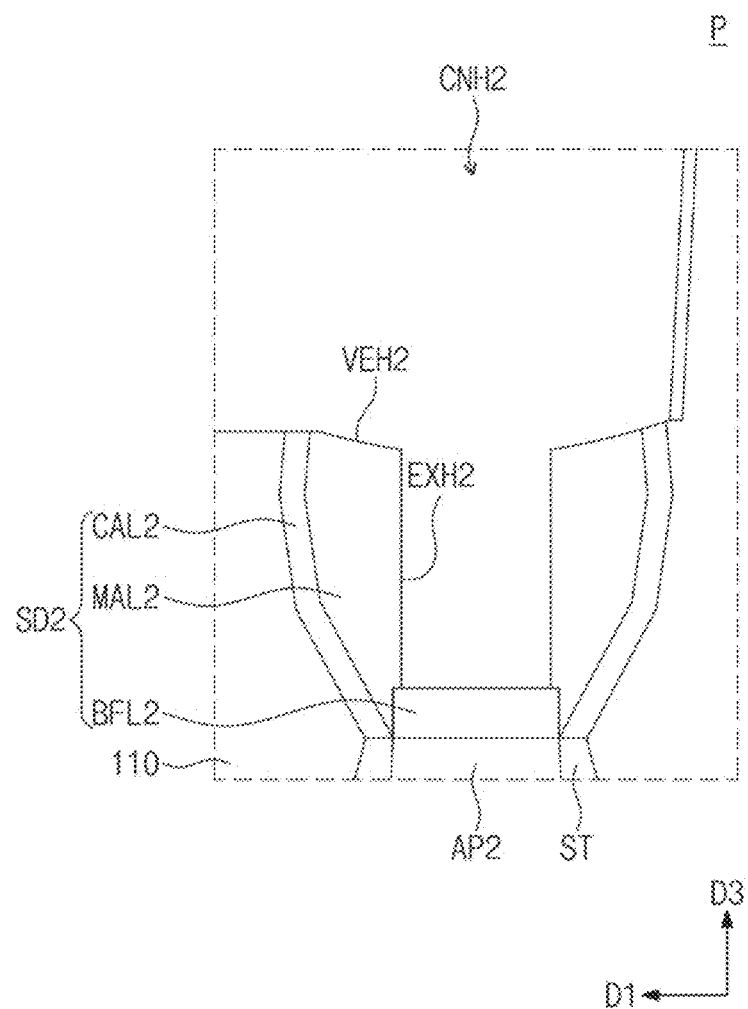
Figure 20A:
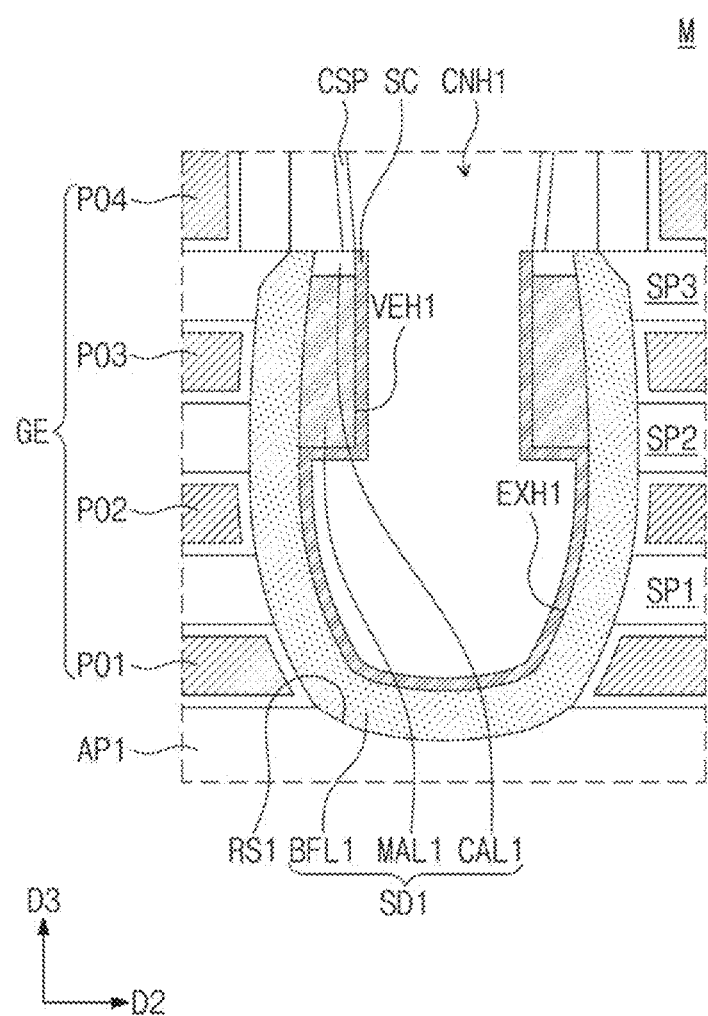
Figure 20B:
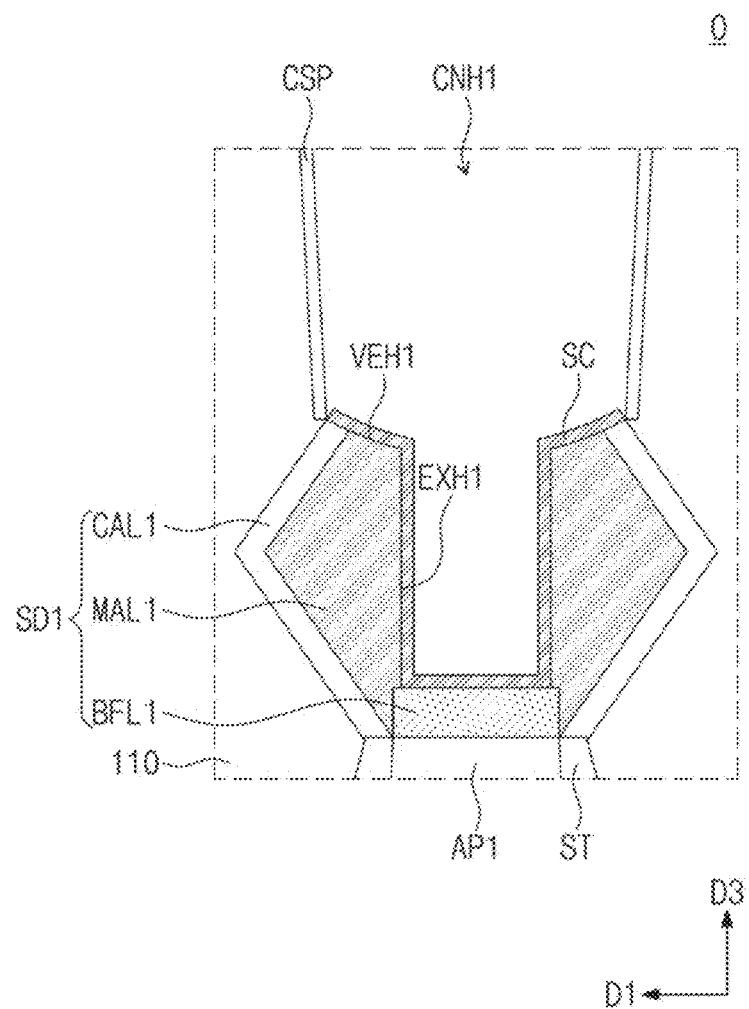
Figure 20C:
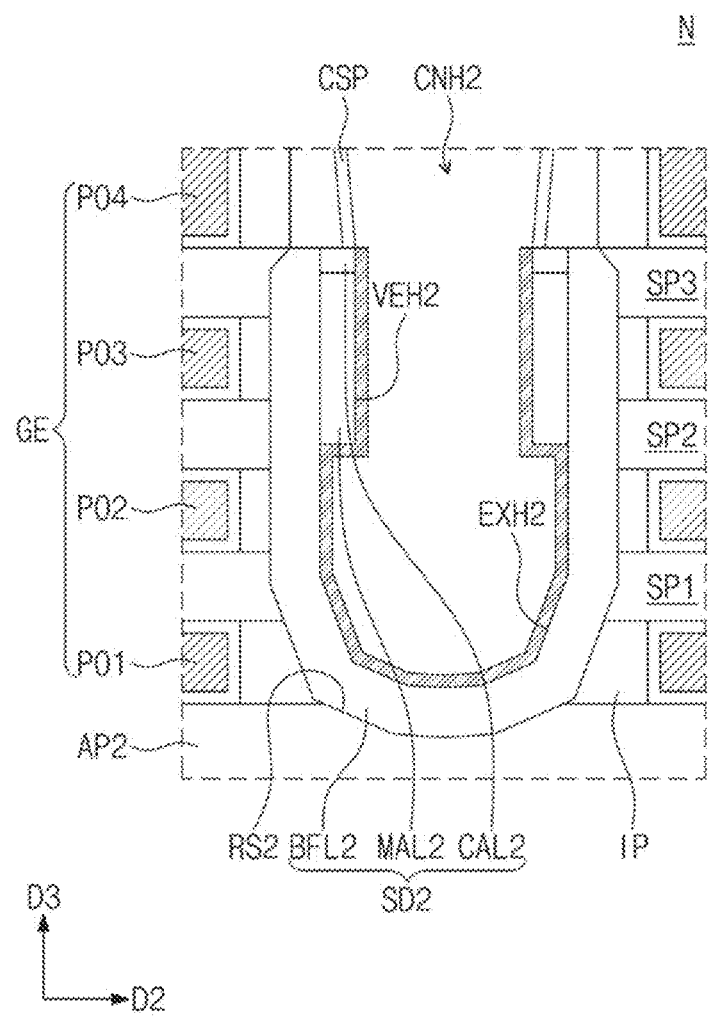
Figure 20D:
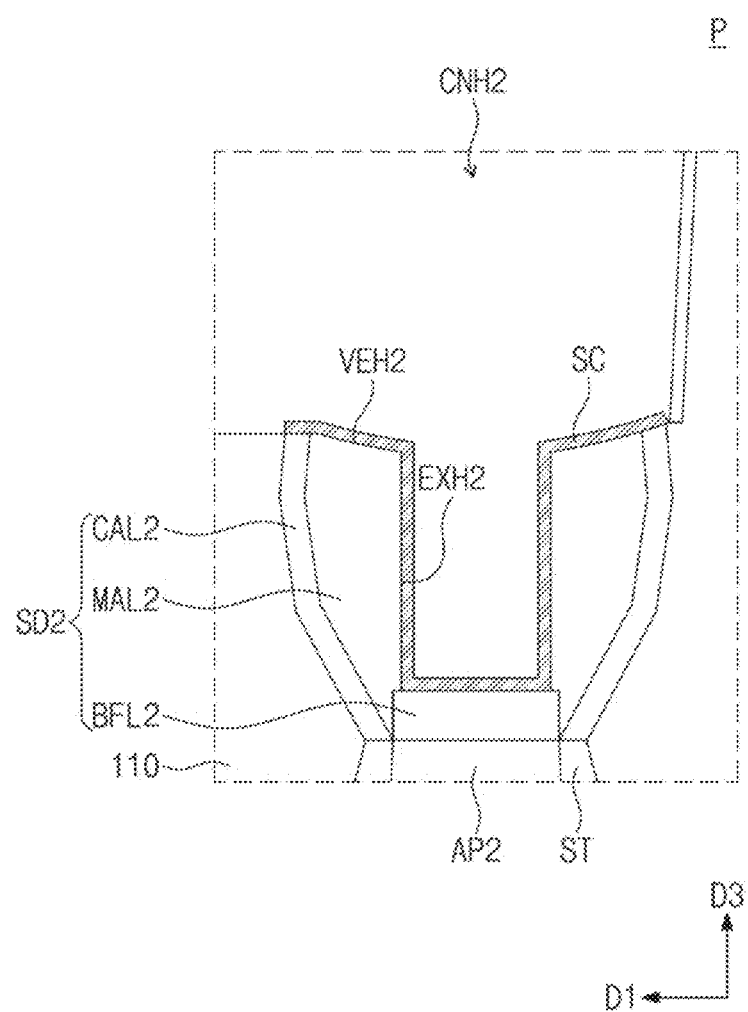

If the first sacrificial layer SFL1 contains a high concentration of silicon (Si) as the first etch enhancement element, the exposed first capping layer CAL1 may be removed, along with the first sacrificial layer SFL1, in the process of removing the first sacrificial layer SFL1 previously described with reference to FIGS. 19A and 19B. The cover portion WGP may be formed in a space, which is formed by the removal of the first capping layer CALL when the active contact AC is formed.

In the present embodiment, since the active contact AC further includes the cover portion WGP, a contact area between the active contact AC and the first source/drain pattern SD1 may be further increased, and in this case, an electric resistance between the active contact AC and the first source/drain pattern SD1 may be further reduced.

Figure 26A:
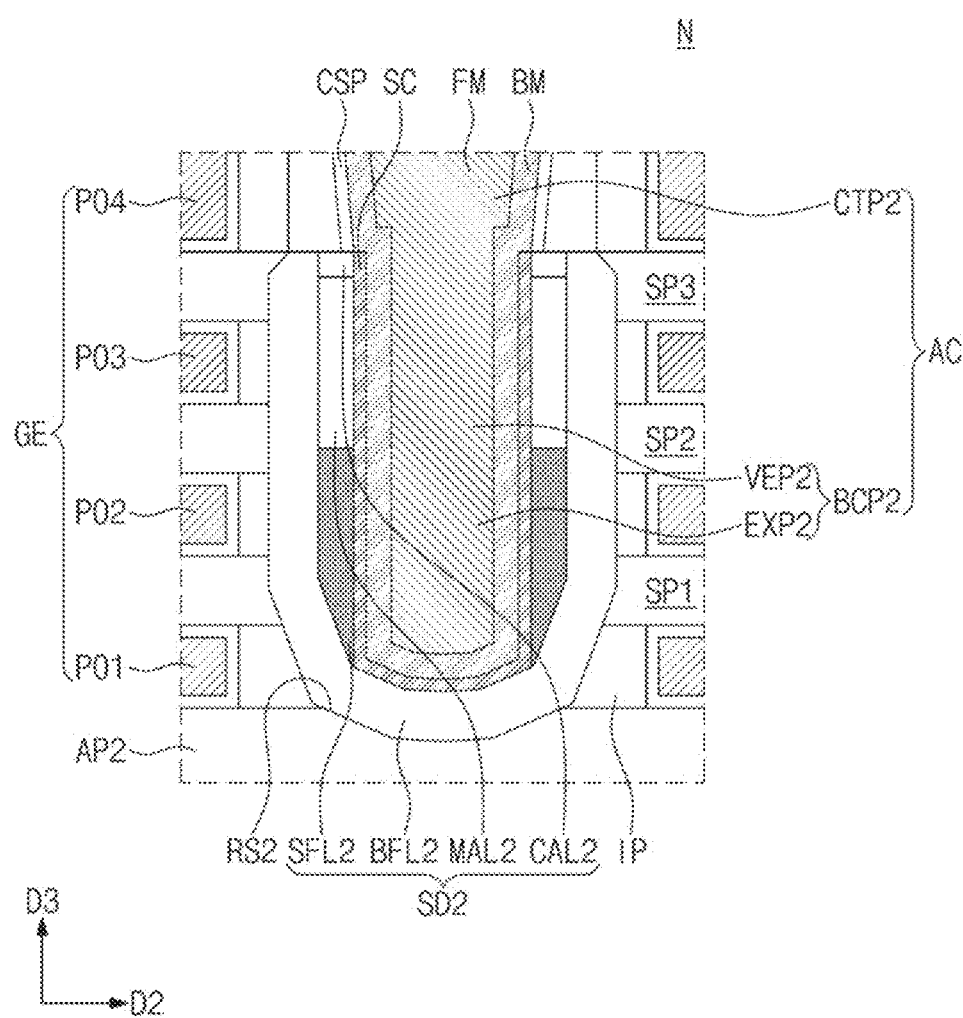
FIG. 26A is an enlarged sectional view illustrating an example of the portion 'N' of FIG. 5B.
Figure 26B:
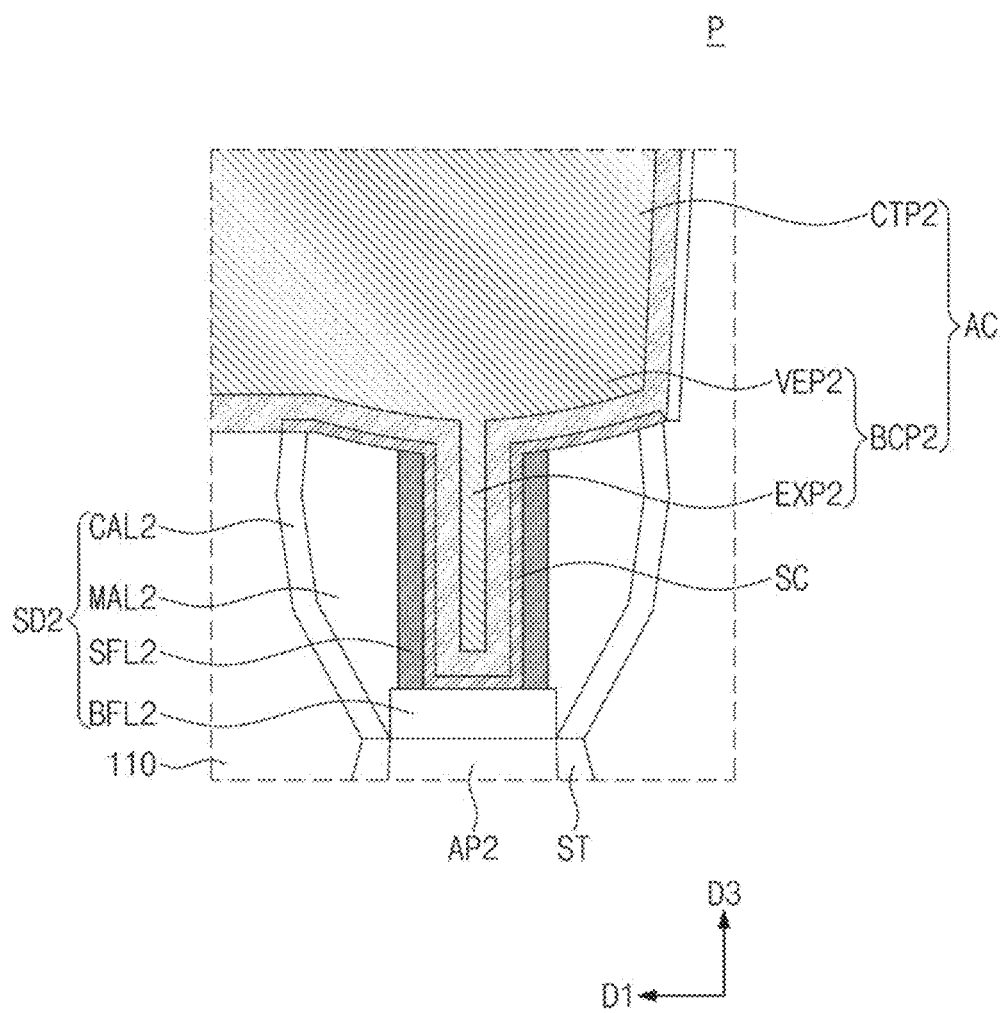
FIG. 26B is an enlarged sectional view illustrating an example of the portion 'P' of FIG. 5C.

FIG. 26A is an enlarged sectional view illustrating an example of the portion 'N' of FIG. 5B, and FIG. 26B is an enlarged sectional view illustrating an example of the portion 'P' of FIG. 5C. Referring to FIGS. 26A and 26B, a width of the second expansion portion EXP2 in the second direction D2 may not be increased to a value that is larger than a width of the second vertical extension portion VEP2 in the second direction D2. The second sacrificial layer SFL2 may be left between the second expansion portion EXP2 and the second buffer layer BFL2. For example, during the process of removing the second sacrificial layer SFL2 previously described with reference to FIGS. 19C and 19D, the second sacrificial layer SFL2 may not be fully removed and may be partially left. The remaining portion of the second sacrificial layer SFL2 may be interposed between the second expansion portion EXP2 and the second buffer layer BFL2.

The second sacrificial layer SFL2 may include the second etch enhancement element, and may have the highest concentration of the second etch enhancement element, among the layers constituting the second source/drain pattern SD2. For example, a concentration of the second etch enhancement element of the second sacrificial layer SFL2 may be higher than a concentration of the second etch enhancement element of the second main layer MAL2. Although not shown, in the first source/drain pattern SD1, the first sacrificial layer SFL1 may be left between the first expansion portion EXP1 and the first buffer layer BFL1.

In the case where the second etch enhancement element is germanium (Ge), a concentration of the germanium (Ge) in the second source/drain pattern SD2 may be abruptly increased in a direction from the second channel pattern CH2 toward the second buried portion BCP2 of the active contact AC. This may be because the second sacrificial layer SFL2 containing a relatively high concentration of germanium (Ge) is left. A region (i.e., the second sacrificial layer SFL2) of the second source/drain pattern SD2 adjacent to the second buried portion BCP2 may have a germanium (Ge) concentration ranging from 5 at % to 100 at %.

Figure 27:
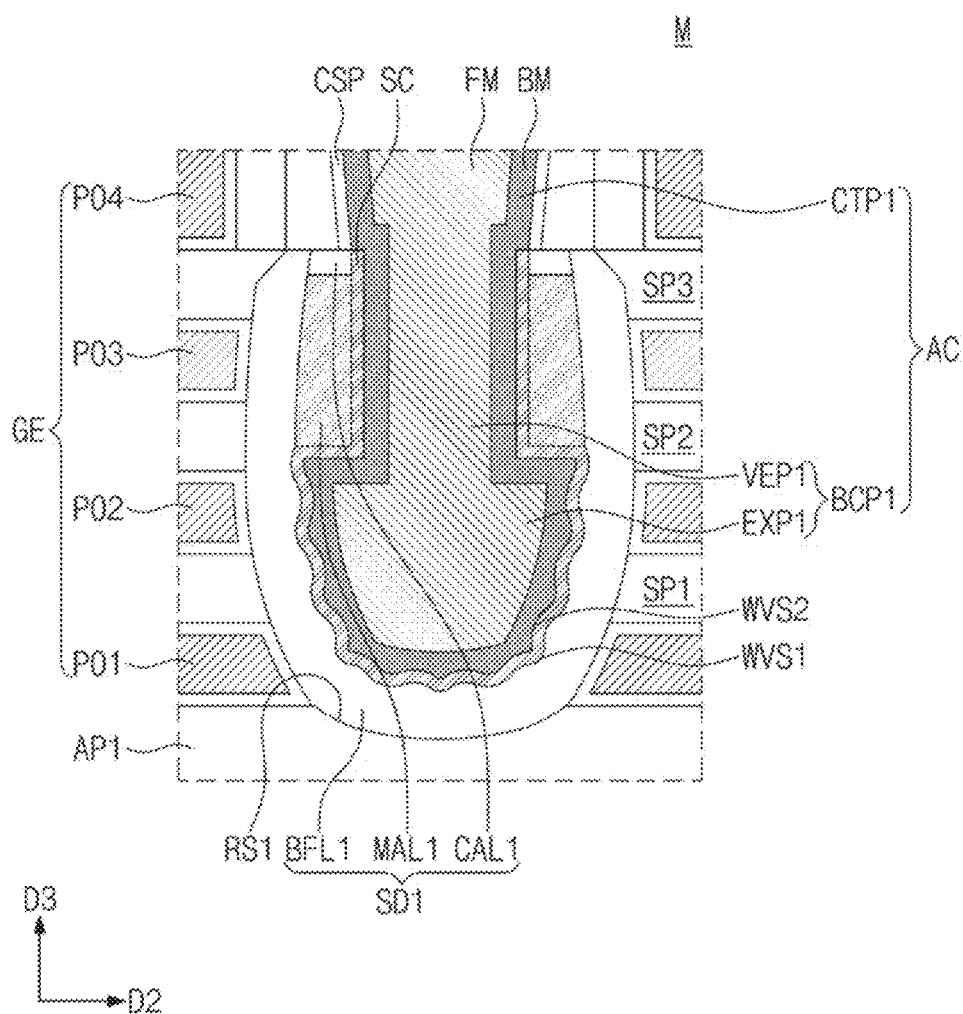
FIG. 27 is an enlarged sectional view illustrating an example of the portion 'M' of FIG. 5A.

FIG. 27 is an enlarged sectional view illustrating an example of the portion 'M' of FIG. 5A. Referring to FIG. 27, the first buffer layer BFL1 may include a first wavy surface WVS1 that is in contact with the metal-semiconductor compound layer SC. The first wavy surface WVS1 of the first buffer layer BFL1 may be bumpy. Owing to the profile of the first wavy surface WVS1, the metal-semiconductor compound layer SC in contact with the first wavy surface WVS1 may also have a wavy shape.

The first expansion portion EXP1 of the active contact AC may include a second wavy surface WVS2 corresponding to the first wavy surface WVS1. The second wavy surface WVS2 of the first expansion portion EXP1 may have a bumpy profile, owing to the shape of the metal-semiconductor compound layer SC in contact with the same.

In the present embodiment, since the second wavy surface WVS2 of the first expansion portion EXP1 of the active contact AC has the bumpy shape, a contact area between the first source/drain pattern SD1 and the active contact AC may be increased. Accordingly, an electric resistance between the active contact AC and the first source/drain pattern SD1 may be further reduced. Although not shown, the second expansion portion EXP2 of the active contact AC coupled to the second source/drain pattern SD2 may have a wavy surface.

Figure 28:
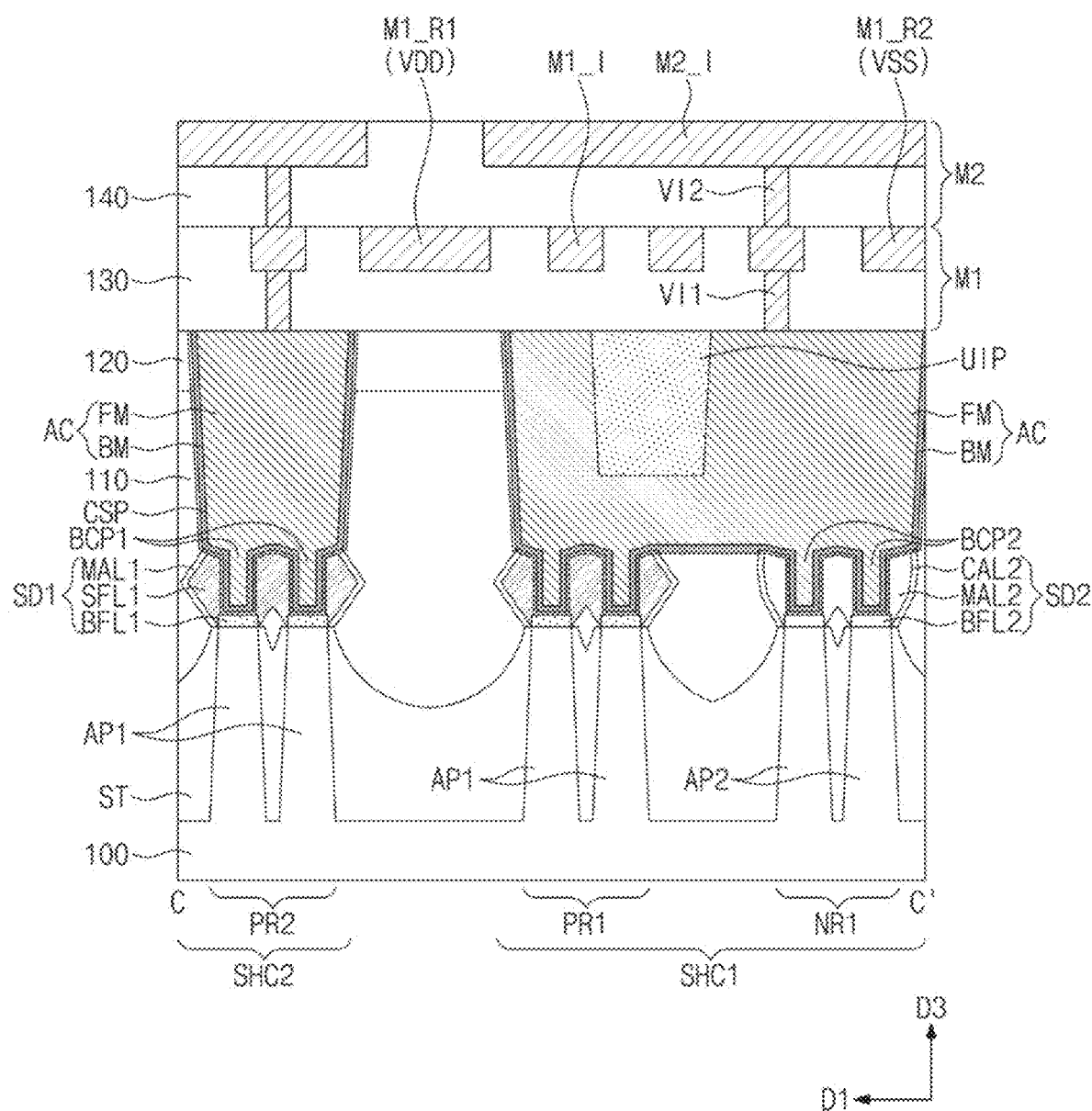
FIG. 28 is a sectional view taken along the line C-C' of FIG. 4.
Figure 29A:
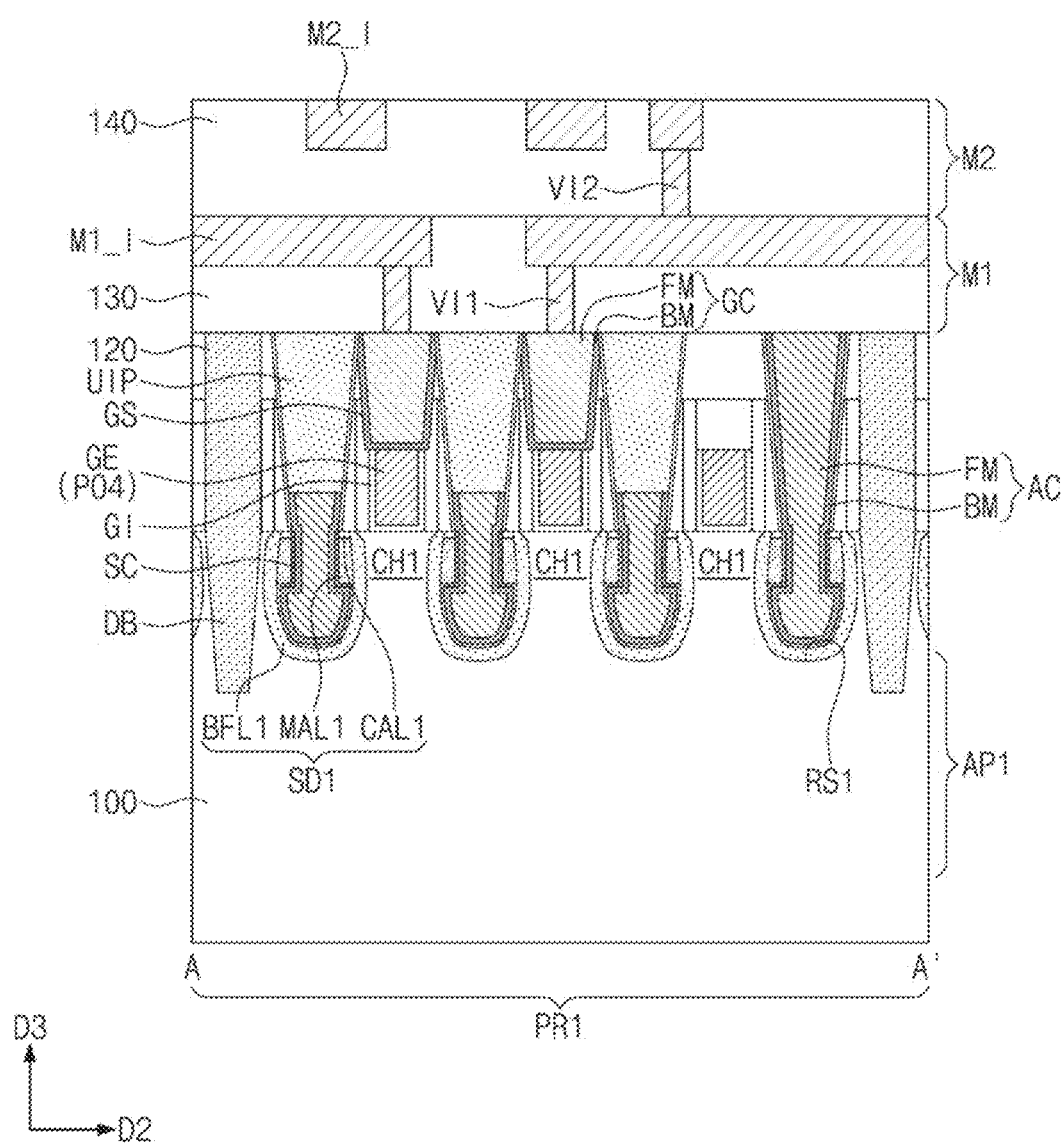
FIGS. 29A to 29D are sectional views, which are respectively taken along the lines A-A', B-B', C-C', and D-D' of FIG. 4 to illustrate a semiconductor device, according to an example embodiment of the inventive concept.
Figure 29B:
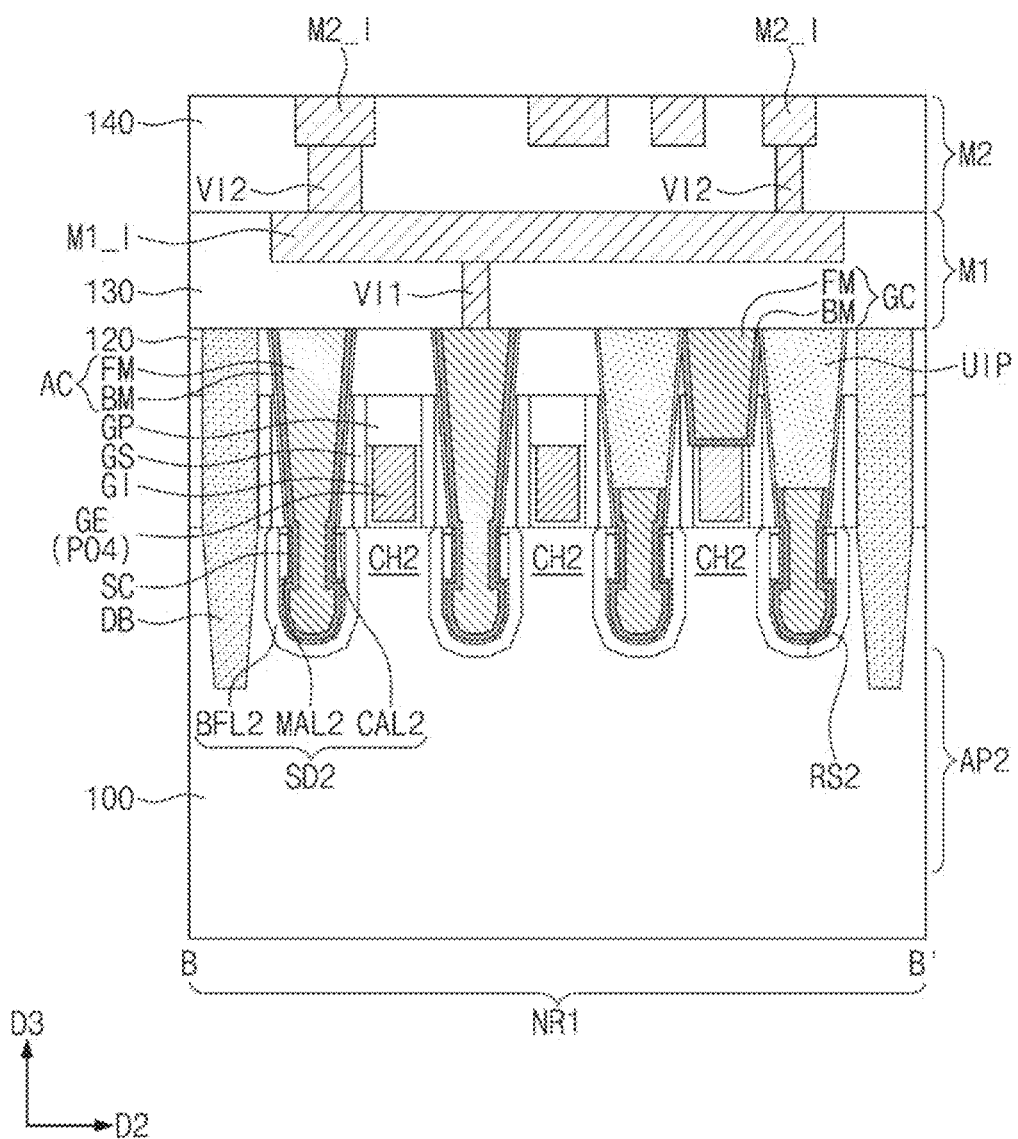
Figure 29C:
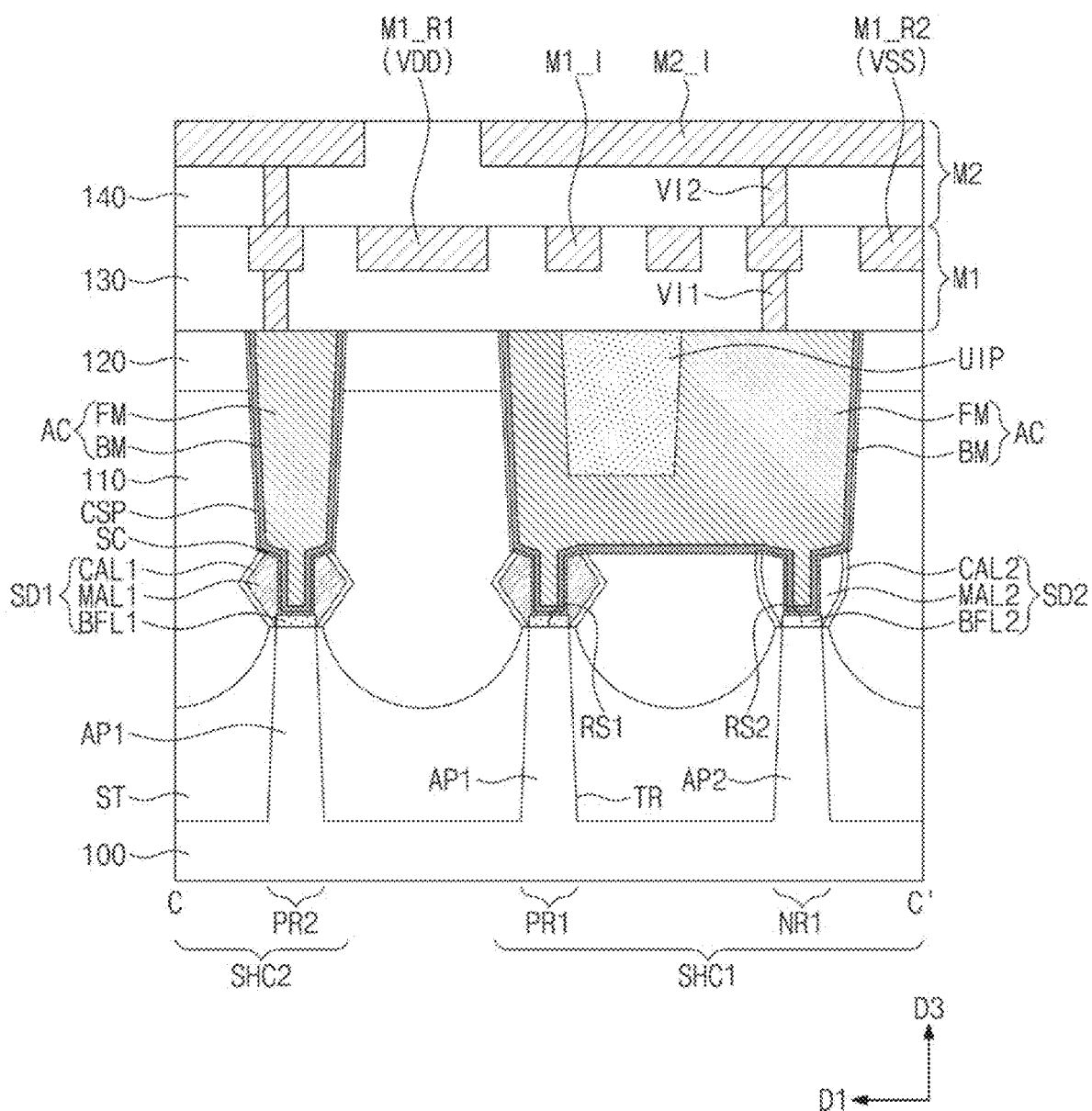
Figure 29D:
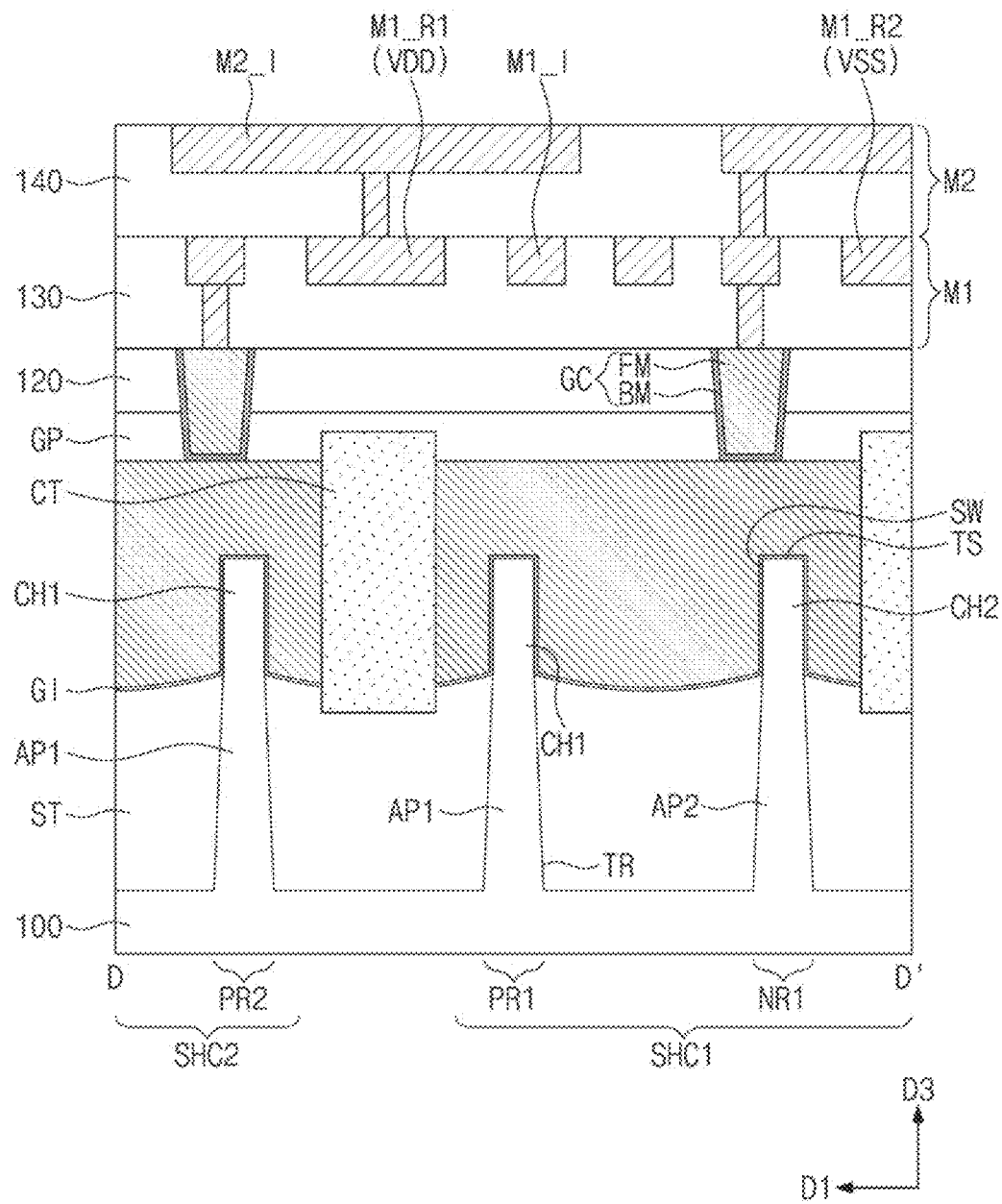

FIG. 28 is a sectional view taken along the line C-C' of FIG. 4. Referring to FIG. 28, at least two first active patterns AP1 may be provided on each of the first and second PMOSFET regions PR1 and PR2. At least two second active patterns AP2 may be provided on each of the first and second NMOSFET regions NR1 and NR2.

The first source/drain patterns SD1 on adjacent ones of the first active patterns AP1 may be merged to constitute one first source/drain pattern SD1. The second source/drain patterns SD2 on adjacent ones of the second active patterns AP2 may be merged to constitute one second source/drain pattern SD2.

The active contact AC coupled to the merged first source/drain pattern SD1 may include the first buried portions BCP1, which are respectively coupled to the first buffer layers BFL1 on the first active patterns AP1. The number of the first buried portions BCP1 of the active contact AC may be equal to the number of the first active patterns AP1. For example, the active contact AC coupled to the first source/drain pattern SD1 may include at least two first buried portions BCP1.

The active contact AC coupled to the merged second source/drain pattern SD2 may include second buried portions BCP2, which are respectively coupled to the second buffer layers BFL2 on the second active patterns AP2. The number of the second buried portions BCP2 of the active contact AC may be equal to the number of the second active patterns AP2. For example, the active contact AC coupled to the second source/drain pattern SD2 may include at least two second buried portions BCP2.

FIGS. 29A to 29D are sectional views, which are respectively taken along the lines A-A', B-B', C-C', and D-D' of FIG. 4 to illustrate a semiconductor device according to an example embodiment of the inventive concept. Referring to FIG. 4 and FIGS. 29A to 29D, the device isolation layer ST may define the first active pattern AP1 and the second active pattern AP2 in an upper portion of the substrate 100. The first active pattern AP1 may be defined on each of the first and second PMOSFET regions PR1 and PR2, and the second active pattern AP2 may be defined on each of the first and second NMOSFET regions NR1 and NR2.

The device isolation layer ST may cover a side surface of a lower portion of each of the first and second active patterns AP1 and AP2. An upper portion of each of the first and second active patterns AP1 and AP2 may protrude above the device isolation layer ST (e.g., see FIG. 29D).

The first active pattern AP1 may include the first source/drain patterns SD1, which are provided in an upper portion thereof, and the first channel pattern CH1, which is provided between the first source/drain patterns SD1. The second active pattern AP2 may include the second source/drain patterns SD2, which are provided in an upper portion thereof, and the second channel pattern CH2, which is provided between the second source/drain patterns SD2.

Referring back to FIG. 29D, each of the first and second channel patterns CH1 and CH2 may not include the stacked first to third semiconductor patterns SP1, SP2, and SP3 described with reference to FIGS. 5A to 5D. Each of the first and second channel patterns CH1 and CH2 may be shaped like a single semiconductor pillar that protrudes above the device isolation layer ST.

The gate electrode GE may be provided on the top surface TS and the opposite side surfaces SW of each of the first and second channel patterns CH1 and CH2. For example, the transistor according to the present embodiment may be a three-dimensional field-effect transistor (e.g., FinFET), in which the gate electrode GE is provided to three-dimensionally surround the channel patterns.

The first interlayer insulating layer 110 and the second interlayer insulating layer 120 may be provided on the substrate 100. The active contacts AC may be provided to penetrate the first and second interlayered insulating layers 110 and 120 and may be connected to the first and second source/drain patterns SD1 and SD2, respectively. The gate contact GC may be provided to penetrate the second interlayer insulating layer 120 and the gate capping pattern GP and to be connected to the gate electrode GE. The active and gate contacts AC and GC may be configured to have substantially the same features as those in the embodiments previously described with reference to FIGS. 4 and 5A to 5D.

The third interlayer insulating layer 130 may be provided on the second interlayer insulating layer 120. The fourth interlayer insulating layer 140 may be provided on the third interlayer insulating layer 130. The first metal layer M1 may be provided in the third interlayer insulating layer 130. The second metal layer M2 may be provided in the fourth interlayer insulating layer 140. The first and second metal layers M1 and M2 may be configured to have substantially the same features as those in the embodiments previously described with reference to FIGS. 4 and 5A to 5D.

Figure 30:
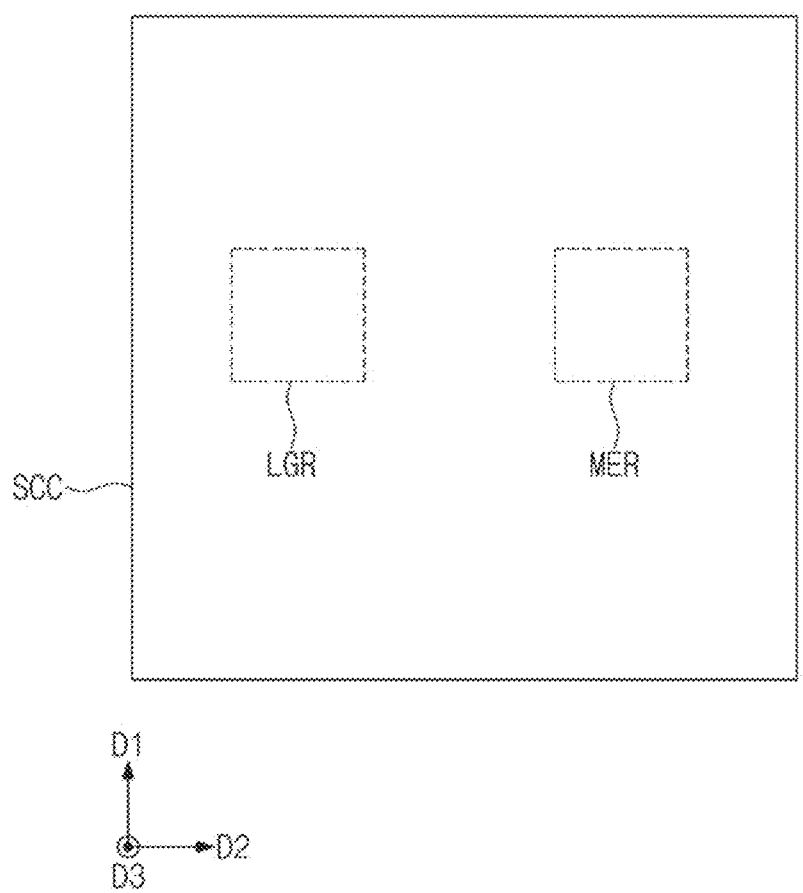
FIG. 30 is a plan view schematically illustrating a semiconductor chip, according to an example embodiment of the inventive concept.
Figure 31:
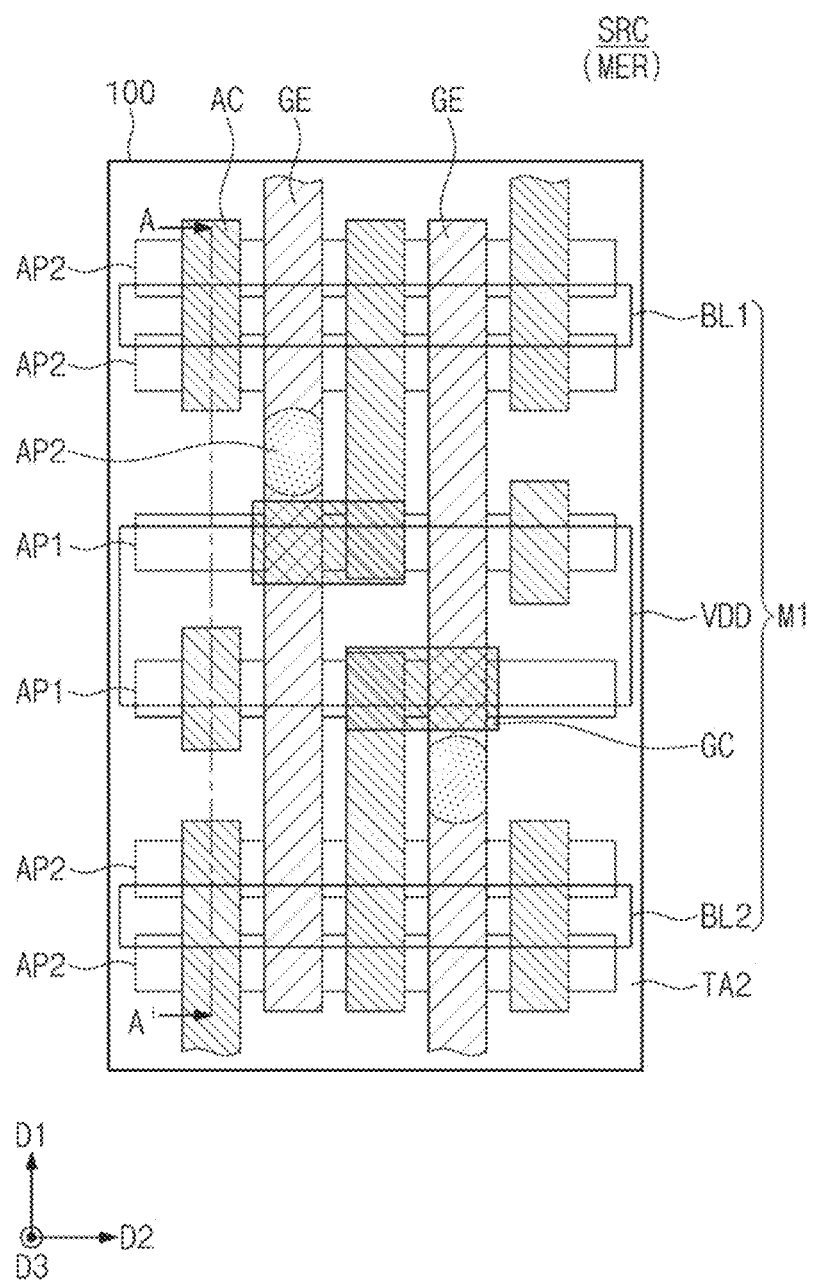
FIG. 31 is a plan view illustrating a SRAM cell in a memory region of FIG. 30.
Figure 32:
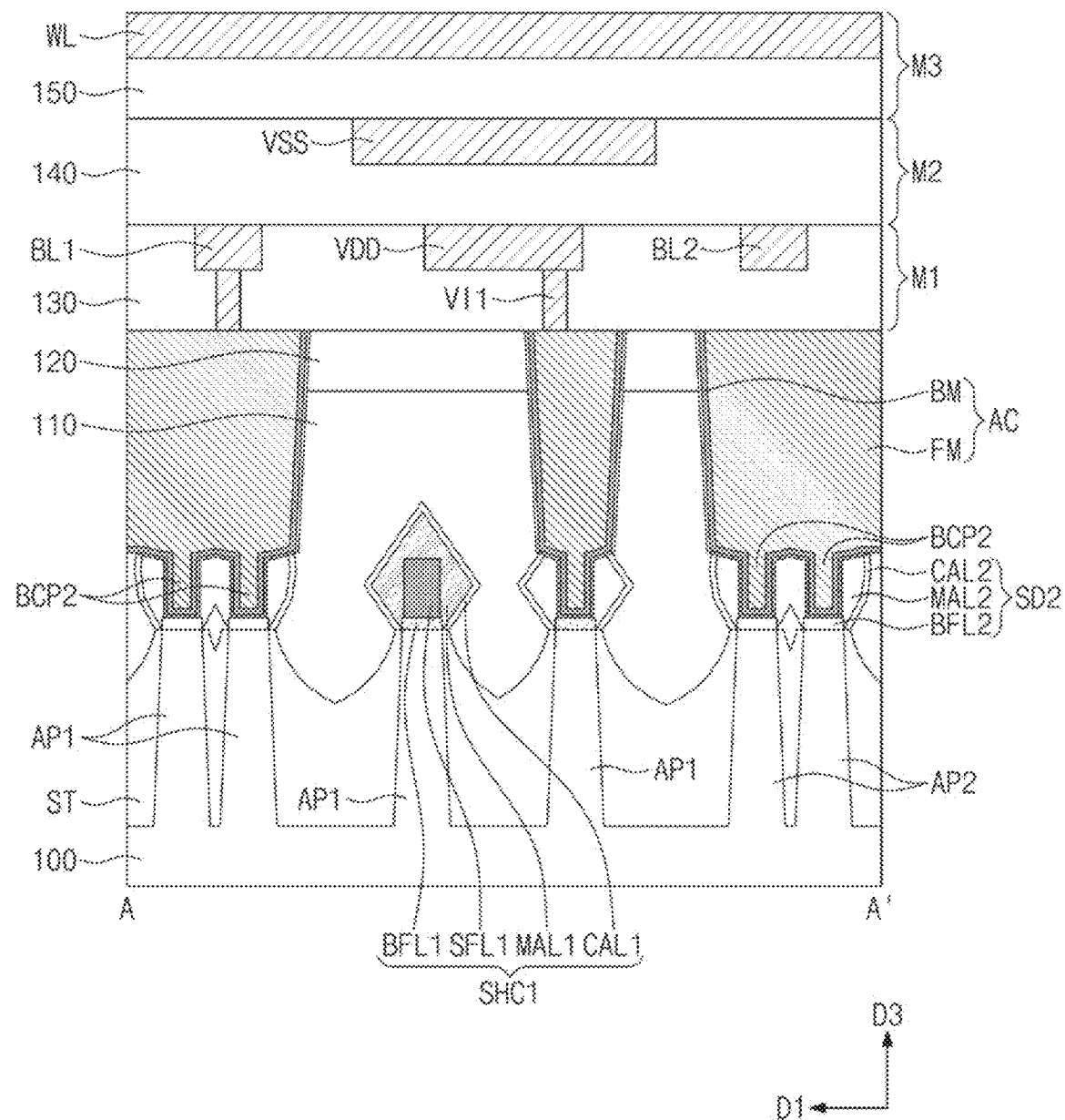
FIG. 32 is a sectional view taken along a line A-A' of FIG. 31.

FIG. 30 is a plan view schematically illustrating a semiconductor chip according to an example embodiment of the inventive concept. FIG. 31 is a plan view illustrating a SRAM cell in a memory region of FIG. 30. FIG. 32 is a sectional view taken along a line A-A' of FIG. 31.

Referring to FIG. 30, a semiconductor chip SCC (e.g., a system-on-chip (SOC)), a processor, or an application process (AP) may include a logic region LGR and a memory region MER. The logic cells previously described with reference to FIGS. 4 and 5A to 5D may be provided in the logic region LGR. SRAM cells may be provided in the memory region MER.

Referring to FIGS. 31 and 32, an SRAM cell SRC in the memory region MER of the semiconductor chip SCC may be a 6T cell. In detail, the SRAM cell SRC of FIG. 31 may include first and second pull-up transistors, first and second pull-down transistors, and first and second pass-gate transistors.

The SRAM cell SRC may include the first active patterns AP1 and the second active patterns AP2. For example, the SRAM cell SRC may include two first active patterns AP1 and four second active patterns AP2.

A pair of the gate electrodes GE may be provided to cross the first and second active patterns AP1 and AP2. The gate cutting pattern CT may be provided to penetrate each of the gate electrodes GE.

Referring back to FIG. 32, the second source/drain patterns SD2 on the second active patterns AP2, which are adjacent to each other, may be merged to constitute a single second source/drain pattern SD2, as previously described with reference to FIG. 28.

A distance between the first active patterns AP1 may be larger than a distance between the second active patterns AP2. Thus, the first source/drain patterns SD1 on the first active patterns AP1 may not be merged and may be separated from each other.

The active contact AC coupled to the first source/drain pattern SD1 may include one first buried portion BCP1. The active contact AC coupled to the second source/drain pattern SD2 may include two second buried portions BCP2.

Referring back to FIGS. 31 and 32, the third interlayer insulating layer 130 may be provided on the second interlayer insulating layer 120. The fourth interlayer insulating layer 140 may be provided on the third interlayer insulating layer 130. A fifth interlayer insulating layer 150 may be provided on the fourth interlayer insulating layer 140. The first metal layer M1 may be provided in the third interlayer insulating layer 130. The second metal layer M2 may be provided in the fourth interlayer insulating layer 140. A third metal layer M3 may be provided in the fifth interlayer insulating layer 150. The first metal layer M1 may include a first bit line BL1, a second bit line BL2, and a VDD line VDD. The second metal layer M2 may include a VSS line VSS. The third metal layer M3 may include a word line WL.

According to an example embodiment of the inventive concept, an active contact of a semiconductor device may include a buried portion buried in a source/drain pattern. Due to structural characteristics of the buried portion, it may be possible to increase a contact area between the active contact and the source/drain pattern and thereby to reduce a contact resistance between the active contact and the source/drain pattern. Since a size of a remaining portion of the active contact, except the buried portion, is not changed, it may be possible to prevent a parasitic capacitance between the active contact and a conductor (e.g., a gate electrode) adjacent thereto from being increased. As a result, it may be possible to improve an operation speed and electric characteristics of a semiconductor device.

While example embodiments of the inventive concept have been particularly shown and described, it will be understood by one of ordinary skill in the art that variations in form and detail may be made therein without departing from the spirit and scope of the attached claims.

What is claimed is:
1. A semiconductor device, comprising:
a substrate including an active pattern;
a channel pattern and a source/drain pattern on the active pattern;
a gate electrode provided on the channel pattern and extended lengthwise in a first direction; and
an active contact coupled to the source/drain pattern,
wherein the channel pattern and the source/drain pattern are adjacent to each other in a second direction crossing the first direction,
wherein the active contact comprises a buried portion buried in the source/drain pattern and a contact portion on the buried portion,
wherein the buried portion comprises an expansion portion, which is provided in a lower portion of the source/drain pattern, and a vertical extension portion, which connects the contact portion to the expansion portion,
wherein an upper portion of the expansion portion has a first width in the second direction and a second width in the first direction,
wherein a lower portion of the expansion portion has a third width in the second direction and a fourth width in the first direction, and wherein a difference between the first width and the third width is larger than a difference between the second width and the fourth width.

2. The semiconductor device of claim 1,
wherein an upper portion of the vertical extension portion has a fifth width in the second direction and a sixth width in the first direction,
wherein a lower portion of the vertical extension portion has a seventh width in the second direction and an eighth width in the first direction, and
wherein a difference between the fifth width and the seventh width is larger than a difference between the sixth width and the eighth width.

3. The semiconductor device of claim 1,
wherein a lower portion of the vertical extension portion has a fifth width in the second direction, and
wherein the first width is 1.3 to 3 times the fifth width.

4. The semiconductor device of claim 1,
wherein an upper portion of the vertical extension portion has a fifth width in the second direction,
wherein a lower portion of the vertical extension portion has a sixth width in the second direction, and
wherein a difference between the first width and the third width is larger than a difference between the fifth width and the sixth width.

5. The semiconductor device of claim 1,
wherein the first width is larger than the third width, and
wherein a width of the expansion portion in the second direction decreases in an upward direction.

6. The semiconductor device of claim 1, further comprising:
a metal-semiconductor compound layer interposed between the source/drain pattern and the active contact,
wherein the buried portion is in contact with an inner side surface of the source/drain pattern through the metal-semiconductor compound layer.

7. The semiconductor device of claim 1,
wherein the source/drain pattern comprises an etch enhancement element,
wherein the etch enhancement element is selected from the group consisting of germanium (Ge), boron (B), phosphorus (P), gallium (Ga), antimony (Sb), arsenic (As), carbon (C), indium (In), tin (Sn), fluorine (F), nitrogen (N), yttrium (Y), and oxygen (O),
wherein a concentration of the etch enhancement element of the source/drain pattern ranges from 1E18 atom/cm$^3$ to 1E22 atom/cm$^3$, and
wherein the concentration of the etch enhancement element of the source/drain pattern increases in a direction from the channel pattern toward the buried portion.

8. The semiconductor device of claim 1,
wherein the expansion portion comprises a first edge portion and a second edge portion which are provided at opposite sides of the expansion portion,
wherein the first and second edge portions are vertically extended along an inner side surface of the source/drain pattern, and
wherein the highest level of the first edge portion is higher than the highest level of the second edge portion.

9. The semiconductor device of claim 1, wherein the second width is smaller than the fourth width.

10. The semiconductor device of claim 1, wherein the expansion portion comprises a wavy surface coupled to an inner side surface of the source/drain pattern.

11. A semiconductor device, comprising:
a substrate including an active pattern;
a channel pattern and a source/drain pattern on the active pattern;
a gate electrode provided on the channel pattern and extended lengthwise in a first direction;
an active contact coupled to the source/drain pattern; and
a metal layer on the active contact,
wherein an interconnection line in the metal layer is electrically connected to the active contact,
wherein the active contact comprises a buried portion, which is buried in the source/drain pattern, and a contact portion, which is provided on the buried portion and is extended toward the interconnection line,
wherein the source/drain pattern comprises silicon (Si), an impurity allowing the source/drain pattern to have an n-type, and germanium (Ge), and
wherein a concentration of the germanium (Ge) of the source/drain pattern increases in a direction from the channel pattern toward the buried portion.

12. The semiconductor device of claim 11,
wherein the buried portion comprises an expansion portion, which is provided in a lower portion of the source/drain pattern, and a vertical extension portion, which connects the contact portion to the expansion portion,
wherein an upper portion of the expansion portion has a first width in a second direction crossing the first direction,
wherein a lower portion of the vertical extension portion has a second width in the second direction, and
wherein the first width is 1.3 to 3 times the second width.

13. The semiconductor device of claim 12,
wherein a lower portion of the expansion portion has a third width in the second direction, and
wherein the first width is larger than the third width.

14. The semiconductor device of claim 13,
wherein an upper portion of the vertical extension portion has a fourth width in the second direction, and
wherein a difference between the first width and the third width is larger than a difference between the second width and the fourth width.

15. The semiconductor device of claim 11, wherein a germanium concentration of a region of the source/drain pattern adjacent to the buried portion ranges from 5 at % to 100 at %.

16. A semiconductor device, comprising:
a substrate including a PMOSFET region and an NMOSFET region, which are spaced apart from each other in a first direction;
a first active pattern on the PMOSFET region and a second active pattern on the NMOSFET region;
a first channel pattern and a first source/drain pattern on the first active pattern;
a second channel pattern and a second source/drain pattern on the second active pattern;
a gate electrode provided to cross the first and second channel patterns and extended in the first direction;
a gate insulating layer interposed between the gate electrode and the first and second channel patterns;
a gate spacer on a side surface of the gate electrode;
a gate capping pattern on a top surface of the gate electrode;
a gate cutting pattern provided to penetrate the gate electrode;
an interlayer insulating layer on the gate capping pattern and the gate cutting pattern;

first and second active contacts provided to penetrate the interlayer insulating layer and be electrically connected to the first and second source/drain patterns, respectively;

metal-semiconductor compound layers respectively interposed between the first and second active contacts and the first and second source/drain patterns;

a gate contact provided to penetrate the interlayer insulating layer and the gate capping pattern and be electrically connected to the gate electrode;

a first metal layer on the interlayer insulating layer, the first metal layer comprising a power line, which is vertically overlapped with the gate cutting pattern, and first interconnection lines, which are electrically and respectively connected to the first and second active contacts and the gate contact; and a second metal layer on the first metal layer, wherein the second metal layer comprises second interconnection lines electrically connected to the first metal layer, wherein the first active contact comprises a first buried portion buried in the first source/drain pattern, wherein the second active contact comprises a second buried portion buried in the second source/drain pattern, wherein the first buried portion comprises a first expansion portion, which is provided in a lower portion of the first source/drain pattern, and at which a width of the first buried portion in a second direction increases abruptly, wherein the second buried portion comprises a second expansion portion, which is provided in a lower portion in the second source/drain pattern, and at which a width of the second buried portion in the second direction increases abruptly, and wherein a largest width of the first expansion portion in the second direction is larger than a largest width of the second expansion portion in the second direction.

17. The semiconductor device of claim 16,
wherein an upper portion of the first expansion portion has a first width in the second direction and has a second width in the first direction,
wherein a lower portion of the first expansion portion has a third width in the second direction and has a fourth width in the first direction, and
wherein a difference between the first width and the third width is larger than a difference between the second width and the fourth width.

18. The semiconductor device of claim 16,
wherein an upper portion of the second expansion portion has a first width in the second direction and has a second width in the first direction,
wherein a lower portion of the second expansion portion has a third width in the second direction and has a fourth width in the first direction, and
wherein a difference between the first width and the third width is larger than a difference between the second width and the fourth width.

19. The semiconductor device of claim 16,
wherein each of the first and second channel patterns comprises a plurality of semiconductor patterns, which are vertically stacked and are spaced apart from each other,
wherein the gate electrode comprises a portion interposed between adjacent ones of the semiconductor patterns, and
wherein the first source/drain pattern comprises a protrusion protruding toward the portion of the gate electrode.

20. The semiconductor device of claim 16,
wherein the first active pattern comprises a pair of first active patterns, which are adjacent to each other,
wherein the first source/drain pattern is provided in common on the pair of first active patterns, and
wherein the first buried portion comprises a pair of first buried portions, which are extended toward the pair of first active patterns, respectively.

* * * * *